(12) United States Patent
Song et al.

(10) Patent No.: US 9,362,225 B2
(45) Date of Patent: *Jun. 7, 2016

(54) DATA STORAGE DEVICE AND METHODS OF MANUFACTURING THE SAME

(71) Applicant: Samsung Electronics Co., Ltd., Suwon-si (KR)

(72) Inventors: Jungwoo Song, Hwaseong-si (KR); Jaekyu Lee, Yongin-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 14/598,228

(22) Filed: Jan. 16, 2015

(65) Prior Publication Data

US 2015/0123196 A1 May 7, 2015

Related U.S. Application Data

(63) Continuation of application No. 13/714,396, filed on Dec. 13, 2012, now Pat. No. 8,963,236.

(30) Foreign Application Priority Data

Dec. 14, 2011 (KR) .......................... 10-2011-0134422

(51) Int. Cl.
*H01L 23/528* (2006.01)
*H01L 23/522* (2006.01)
*H01L 29/423* (2006.01)
*H01L 27/108* (2006.01)
(Continued)

(52) U.S. Cl.
CPC .......... *H01L 23/528* (2013.01); *H01L 23/5226* (2013.01); *H01L 27/10* (2013.01); *H01L 27/105* (2013.01); *H01L 27/108* (2013.01); *H01L 27/11* (2013.01); *H01L 27/228* (2013.01); *H01L 27/2436* (2013.01); *H01L 27/2463* (2013.01); *H01L 29/4236* (2013.01); *H01L 45/04* (2013.01); *H01L 45/06* (2013.01); *H01L 45/1233* (2013.01); *H01L 45/143* (2013.01); *H01L 45/144* (2013.01); *H01L 45/146* (2013.01); *H01L 45/147* (2013.01);
(Continued)

(58) Field of Classification Search
None
See application file for complete search history.

(56) References Cited

U.S. PATENT DOCUMENTS

| 7,995,378 B2 * | 8/2011 | Yoon | G11C 11/16 365/148 |
| 8,027,206 B2 * | 9/2011 | Yoon | G11C 11/16 365/158 |

(Continued)

FOREIGN PATENT DOCUMENTS

| JP | 2008-034660 | 2/2008 |
| KR | 10-2010-0005448 A | 1/2010 |
| KR | 10-2011-0077414 A | 7/2011 |

*Primary Examiner* — Michael Lebentritt
*Assistant Examiner* — Jordan Klein
(74) *Attorney, Agent, or Firm* — Muir Patent Law, PLLC

(57) ABSTRACT

Provided are data storage devices and methods of manufacturing the same. The device may include a plurality of cell selection parts formed in a substrate, a plate conductive pattern covering the cell selection parts and electrically connected to first terminals of the cell selection parts, a plurality of through-pillars penetrating the plate conductive pattern and insulated from the plate conductive pattern, and a plurality of data storage parts directly connected to the plurality of through-pillars, respectively. The data storage parts may be electrically connected to second terminals of the cell selection parts, respectively.

7 Claims, 40 Drawing Sheets

(51) Int. Cl.
*H01L 27/11* (2006.01)
*H01L 27/10* (2006.01)
*H01L 27/105* (2006.01)
*H01L 27/22* (2006.01)
*H01L 45/00* (2006.01)
*H01L 27/24* (2006.01)
*H01L 27/02* (2006.01)

(52) U.S. Cl.
CPC ............ *H01L 45/16* (2013.01); *H01L 27/0203* (2013.01); *H01L 2924/0002* (2013.01)

(56) References Cited

U.S. PATENT DOCUMENTS

| | | |
|---|---|---|
| 8,116,111 B2 | 2/2012 | Kim et al. |
| 2006/0128130 A1* | 6/2006 | Jang .................... H01L 29/4236 438/589 |
| 2007/0048922 A1* | 3/2007 | Lee ........................ H01L 27/115 438/201 |
| 2009/0296477 A1* | 12/2009 | Kim .................. H01L 27/11521 365/185.17 |
| 2010/0001356 A1* | 1/2010 | Kim ........................ H01L 43/12 257/421 |
| 2010/0034008 A1* | 2/2010 | Wang ...................... G11C 11/16 365/145 |
| 2010/0059837 A1* | 3/2010 | Kim ...................... H01L 27/228 257/421 |
| 2010/0157654 A1* | 6/2010 | Jung ........................ G11C 7/12 365/148 |
| 2010/0208509 A1* | 8/2010 | Maejima .................. G11C 5/02 365/148 |
| 2010/0210075 A1* | 8/2010 | Hold ..................... G11C 11/404 438/128 |
| 2011/0287597 A1* | 11/2011 | Kito .................... H01L 21/8221 438/261 |

* cited by examiner

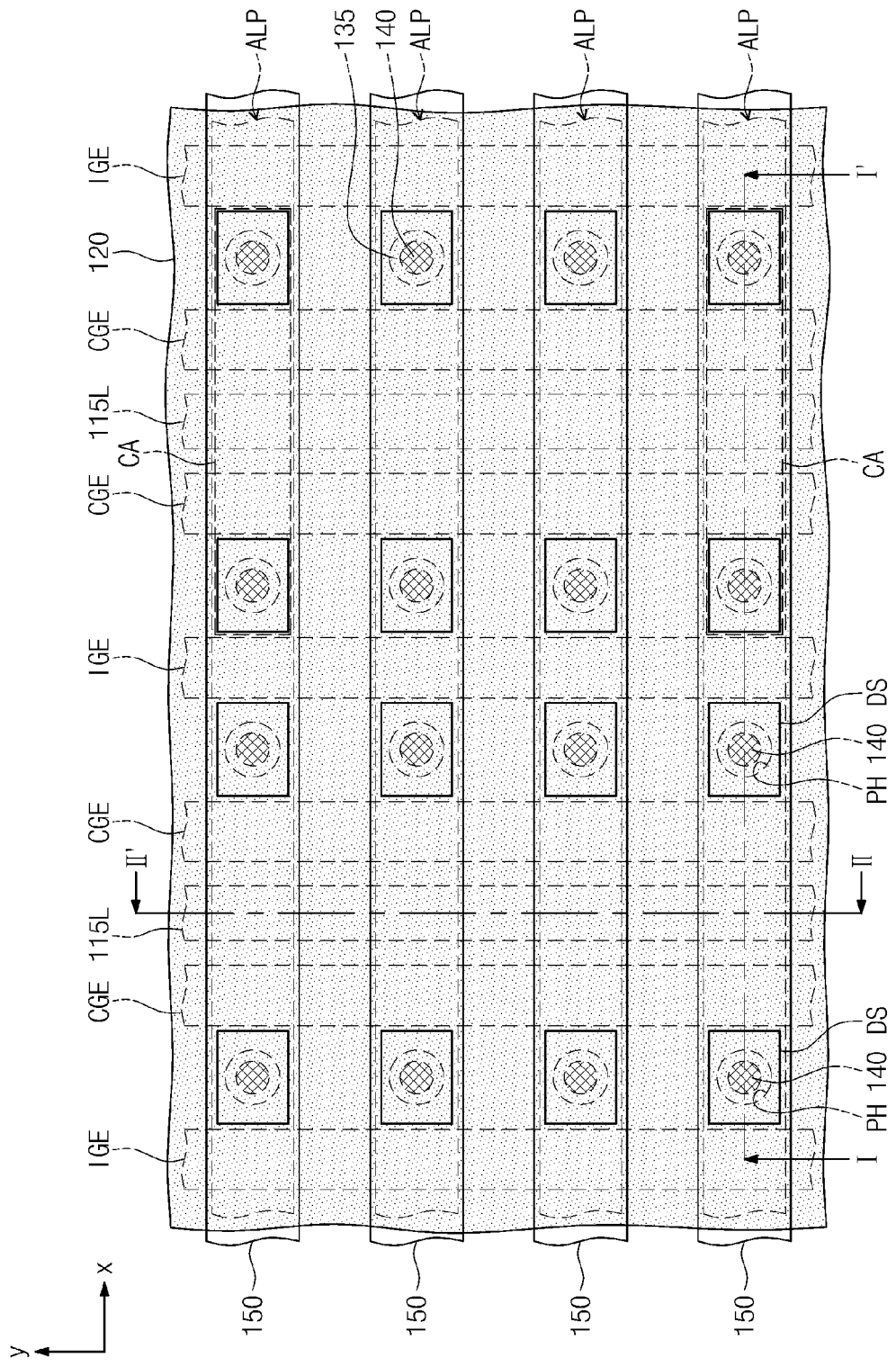

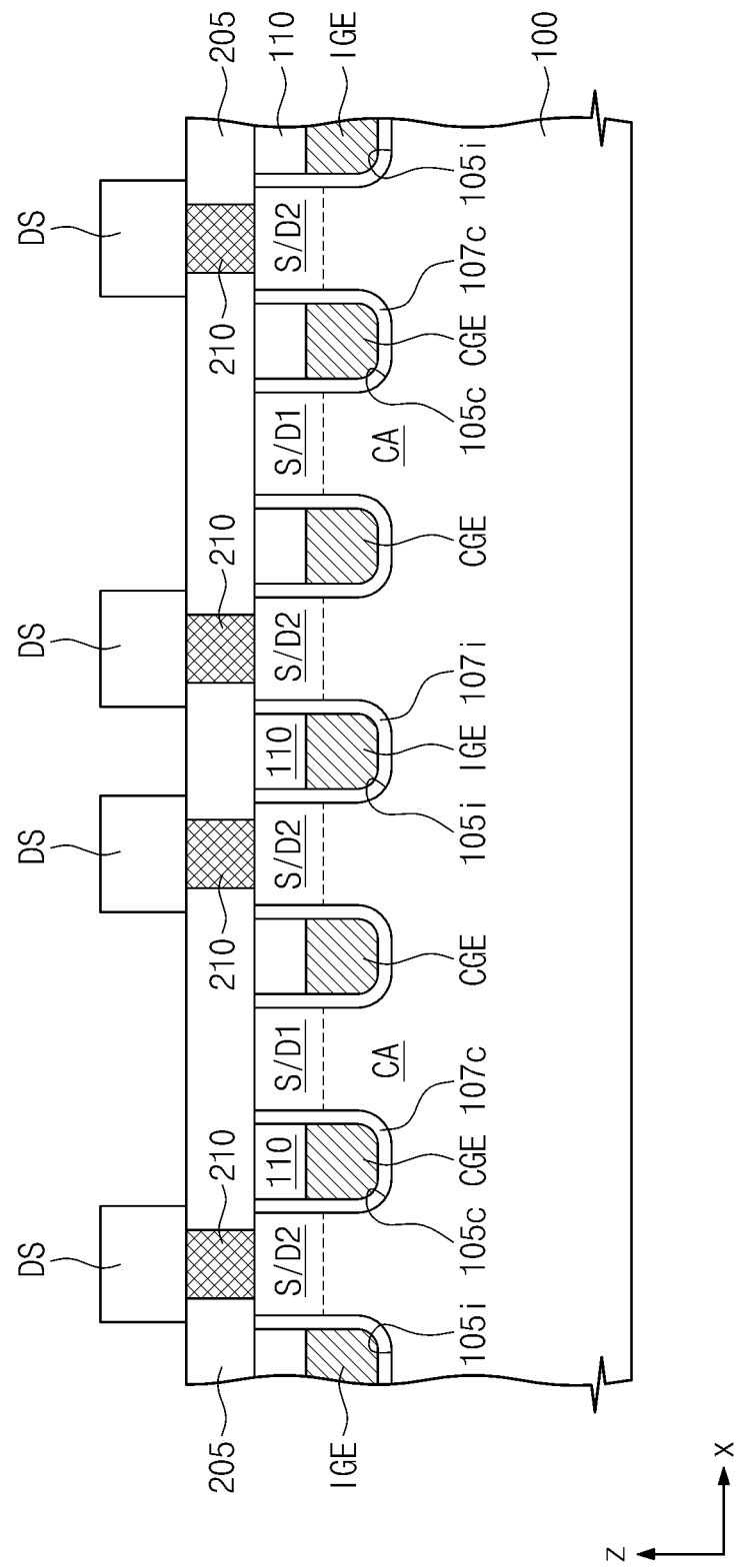

DATA STORAGE DEVICE AND METHODS OF MANUFACTURING THE SAME

CROSS-REFERENCE TO RELATED APPLICATIONS

This U.S. non-provisional patent application is a continuation application of and claims priority to U.S. patent application Ser. No. 13/714,396, filed on Dec. 13, 2012 which claims priority under 35 U.S.C. §119 to Korean Patent Application No. 10-2011-0134422, filed on Dec. 14, 2011, the entirety of each of which is incorporated by reference herein.

BACKGROUND

The present disclosure relates to semiconductor devices and methods of manufacturing the same and, more particularly, to data storage devices and methods of manufacturing the same.

Semiconductor devices are very attractive in an electronic industry because of small size, multi-function and/or low fabrication cost thereof. Data storage devices of the semiconductor devices may store logic data. The data storage devices have been more highly integrated with the development of the electronic industry. Thus, line widths of components constituting the data storage devices have been reduced.

Additionally, high reliability of the data storage devices has been demanded with the high integration density thereof. However, the high integration density may reduce the reliability of the data storage devices. Thus, various researches have been conducted for improving the reliability as well as the integration density of the data storage device.

SUMMARY

Embodiments disclosed herein are directed to data storage devices and methods of manufacturing the same.

In one aspect, a data storage device may include: a plurality of cell selection parts formed in a substrate; a plate conductive pattern covering the cell selection parts, the plate conductive pattern electrically connected to first terminals of the cell selection parts; a plurality of through-pillars penetrating the plate conductive pattern, the plurality of through-pillars insulated from the plate conductive pattern; and a plurality of data storage parts directly connected to the plurality of through-pillars, respectively. The data storage parts may be electrically connected to second terminals of the cell selection parts, respectively.

In some embodiments, each of the through-pillars may be overlapped with the data storage part connected to the through-pillar in a plan view.

In other embodiments, each of the data storage parts may be directly connected to a top surface of a respective through-pillar. Each of the data storage parts may be electrically connected to a second terminal of a respective cell selection part through a respective through-pillar. The data storage parts may be disposed over the plate conductive pattern.

In still other embodiments, the data storage device may further include: bit lines disposed on the data storage parts. The data storage parts may be arranged along rows and columns in a plan view, and each of the bit lines may be electrically connected to the data storage parts constituting each of the rows.

In yet other embodiments, each of the data storage parts may be disposed under respective through-pillars, so that each of the data storage parts may be directly connected to a bottom surface of a respective through-pillar. In this case, the plate conductive pattern may cover the data storage parts.

In yet still other embodiments, the data storage device may further include: bit lines disposed on the through-pillars. The through-pillars may be arranged along rows and columns in a plan view, and each of the bit lines may be connected to top surfaces of the through-pillars constituting each of the rows.

In yet still other embodiments, the plate conductive pattern may have a plurality of plate-holes, the plurality of through-pillars may pass through the plurality of plate-holes, respectively, and the plate holes may be spaced apart from each other.

In yet still other embodiments, each of the cell selection parts may be a field effect transistor. A first source/drain region and a second source/drain region of each of the cell selection parts may correspond to the first terminal and the second terminal, respectively. A gate electrode of each of the cell selection parts may be disposed in a recess region formed in the substrate.

In another aspect, a data storage device may include: a plurality of cell selection parts formed at least in part in a substrate; a first interlayer dielectric layer, a plate conductive pattern, and a second interlayer dielectric layer sequentially stacked on the cell selection parts, the plate conductive pattern covering the cell selection parts, and the plate conductive pattern electrically connected to first terminals of the cell selection parts; a plurality of through-pillars successively penetrating the second interlayer dielectric layer, the plate conductive pattern, and the first interlayer dielectric layer, the plurality of through-pillars electrically connected to second terminals of the cell selection parts, respectively, and the plurality of through-pillars insulated from the plate conductive pattern; and a plurality of data storage parts disposed on the second interlayer, the plurality of data storage parts respectively connected to top surfaces of the through pillars.

In some embodiments, the plurality of through-pillars may be respectively disposed in a plurality of through-holes successively penetrating the second interlayer dielectric layer, the plate conductive pattern, and the first interlayer dielectric layer. Each of the through-pillars may be insulated from the plate conductive pattern by an insulating spacer disposed between an inner sidewall of each of the through-holes and each of the through-pillars.

In other embodiments, each of the through-pillars may be insulated from the plate conductive pattern by an insulator disposed between each of the through-pillars and the plate conductive pattern. The insulator may be formed by performing a treatment process on the plate conductive pattern exposed through an inner sidewall of each of the through-holes.

In still other embodiments, the cell selection parts may include: a plurality of cell active portions defined in the substrate and arranged along rows and columns; a pair of cell gate electrodes respectively disposed in a pair of cell recess regions which cross the cell active portions constituting each of the columns; a cell gate dielectric layer disposed between each of the cell gate electrodes and the substrate; a first source/drain region formed in each of the cell active portions between the pair of cell gate electrodes, the first source/drain region corresponding to the first terminal; and a pair of second source/drain regions respectively formed in both edge regions of each of the cell active portions. The second source/drain region may correspond to the second terminal, and the pair of cell gate electrodes may be disposed between the pair of second source/drain regions.

In yet other embodiments, the pair of cell gate electrodes, the first source/drain region, and the pair of second source/ drain regions, which are formed in each of the cell active portions, may constitute a pair of the cell selection parts. The pair of the cell selection parts may share the first source/drain region formed in each of the cell active portions.

In yet still other embodiments, the data storage device may further include: device isolation patterns disposed in the substrate to define a plurality of active line patterns extended in parallel with the rows; a plurality of isolation gate electrodes respectively disposed in a plurality of isolation recess regions crossing the active line patterns and the device isolation patterns; and an isolation gate dielectric layer disposed between each of the isolation gate electrodes and an inner surface of each of the isolation recess regions. The isolation recess regions may divide each of the active line patterns into the cell active portions.

In yet still other embodiments, an isolation voltage may be applied to the isolation gate electrodes during an operation. The isolation voltage may prevent a channel from being formed in the active line pattern under the inner surface of the isolation recess region.

In yet still other embodiments, the data storage device may further include: a contact line pattern penetrating the first interlayer dielectric layer, the contact line pattern connected to the first source/drain region in the cell active portions constituting each of the columns. The contact line pattern may be extended in parallel with the columns, and the plate conductive pattern may be electrically connected to the first source/drain regions through the contact line pattern.

In yet still other embodiments, the data storage device may further include: a plurality of contact pillars penetrating the first interlayer dielectric layer, the plurality of contact pillars connected to the first source/drain regions, respectively. The plate conductive pattern may be electrically connected to the first source/drain regions through the contact pillars.

In still another aspect, a data storage device may include: a plurality of cell selection parts formed at least in part in a substrate; a lower dielectric layer disposed on the cell selection parts; a plurality of data storage parts disposed on the lower dielectric layer; a first interlayer dielectric layer, a plate conductive pattern, and a second interlayer dielectric layer sequentially stacked on the data storage parts; and a plurality of through-pillars successively penetrating the second interlayer dielectric layer, the plate conductive pattern, and the first interlayer dielectric layer, the plurality of through-pillars connected to top surfaces of the data storage parts, respectively. The through-pillars may be insulated from the plate conductive pattern, the plate conductive pattern may be electrically connected to first terminals of the cell selection parts, and the data storage parts may be electrically connected to second terminals of the cell selection parts, respectively.

In some embodiments, the data storage device may further include: a plurality of lower pillars penetrating the lower dielectric layer. Each of the lower pillars may connect each of the data storage parts to the second terminal of a respective cell selection part.

In yet another aspect, a method of manufacturing a data storage device may include: forming cell selection parts in a substrate; sequentially forming a first interlayer dielectric layer, a plate conductive pattern, and a second interlayer dielectric layer, the plate conductive pattern electrically connected to first terminals of the cell selection parts; forming a plurality of through-pillars successively penetrating the second interlayer dielectric layer, the plate conductive pattern, and the first interlayer dielectric layer, the plurality of through-pillars insulated from the plate conductive pattern; and forming a plurality of data storage parts directly connected to the through-pillars, respectively. The data storage parts may be electrically connected to second terminals of the cell selection parts, respectively.

In some embodiments, the data storage parts may be formed on the second interlayer dielectric layer, and the data storage parts may be in contact with top surfaces of the through-pillars, respectively.

In other embodiments, the method may further include: forming a third interlayer dielectric layer filling a space between the data storage parts; and forming bit lines on the third interlayer dielectric layer. The data storage parts may be arranged along rows and columns in a plan view and each of the bit lines may be electrically connected to the data storage parts constituting each of the rows.

In still other embodiments, before forming the plate conductive pattern, the method may further include: forming a contact line pattern or contact pillars penetrating the first interlayer dielectric layer. The plate conductive pattern may be electrically connected to the first terminals of the cell selection parts through the contact line pattern or the contact pillars.

In yet other embodiments, the data storage parts may be formed before the first interlayer dielectric layer is formed. In this case, the plate conductive pattern may cover the data storage parts. The plurality of through-pillars may be respectively disposed in a plurality of through-holes, which successively penetrate the second interlayer dielectric layer, the plate conductive pattern, and the first interlayer dielectric layer and respectively expose the data storage parts.

In yet still other embodiments, before forming the data storage parts, the method may further include: forming a lower dielectric layer on the cell selection parts; and forming lower pillars penetrating the lower dielectric layer, the lower pillars connected to the second terminals of the cell selection parts, respectively. The data storage parts may be connected to top surfaces of the lower pillars, respectively.

In yet still other embodiments, the method may further include: forming a contact line pattern or contact pillars successively penetrating the first interlayer dielectric layer and the lower dielectric layer before forming the plate conductive pattern. The plate conductive pattern may be electrically connected to the first terminals of the cell selection parts through the contact line pattern or the contact pillars.

In yet still other embodiments, the method may further include: forming bit lines on the second interlayer dielectric layer. The through-pillars may be arranged along rows and columns in a plan view. Each of the bit lines may be electrically connected to the through-pillars constituting each of the rows.

In yet still other embodiments, forming the through-pillars may include: forming through-holes successively penetrating the second interlayer dielectric layer, the plate conductive pattern, and the first interlayer dielectric layer, the through-holes spaced apart from each other; forming insulating spacers on inner sidewalls of the through-holes, respectively; and forming the through-pillars in the through-holes having the insulating spacers, respectively.

In yet still other embodiments, forming the through-pillars may include: forming through-holes successively penetrating the second interlayer dielectric layer, the plate conductive pattern, and the first interlayer dielectric layer, the through-holes spaced apart from each other; performing a treatment process on the plate conductive pattern exposed by inner sidewalls of the through-holes to form insulators; and forming the through-pillars in the through-holes having the insulators, respectively. The treatment process may include at least one of an oxidation process and a nitridation process.

In yet still other embodiments, the method may further include: performing an anisotropic etching process to remove by-products on bottom surfaces of the through-holes after performing the treatment process and before forming the through-pillars. The by-products may be generated by the treatment process.

In yet still other embodiments, forming the cell selection parts may include: forming device isolation patterns in the substrate in order to define active line patterns extended in parallel; forming recess regions crossing the active line patterns and the device isolation patterns, wherein the recess regions include isolation recess regions dividing the active line patterns into cell active portions and cell recess regions crossing the cell active portions; forming an isolation gate dielectric layer on an inner surface of each of the isolation recess regions and a cell gate dielectric layer on an inner surface of each of the cell recess regions; forming a isolation gate electrode in each of the isolation recess regions and a cell gate electrode in each of the cell recess regions; and forming source/drain regions in the cell active portions at both sides of each of the gate electrode.

In yet still other embodiments, a pair of the cell gate electrodes may cross the cell active portions and the device isolation patterns between a pair of the isolation recess regions adjacent to each other. The pair of the cell gate electrodes formed in each of the cell active portions may be included in a pair of the cell selection parts, respectively. The pair of cell selection parts may share a first source/drain region formed in the cell active portion between the pair of cell gate electrodes. The pair of cell selection parts may include a pair of second source/drain regions respectively formed both edge regions of the cell active portion, respectively. The first source/drain region may correspond to the first terminal and the second source/drain region may correspond to the second terminal.

BRIEF DESCRIPTION OF THE DRAWINGS

The disclosed embodiments will become more apparent in view of the attached drawings and accompanying detailed description.

FIG. 1A is a plan view illustrating a data storage device according to some exemplary embodiments;

FIGS. 6A to 12A are perspective views illustrating an exemplary method of manufacturing a data storage device according to some embodiments;

FIGS. 6B to 12B are exemplary cross-sectional views taken along lines IV-IV' of FIGS. 6A to 12A, respectively, according to certain exemplary embodiments;

FIGS. 18A to 21A are perspective views illustrating a method of manufacturing a data storage device according to other exemplary embodiments;

FIGS. 18B to 21B are exemplary cross-sectional views taken along lines VI-VI' of FIGS. 18A to 21A, respectively, according to certain embodiments;

DETAILED DESCRIPTION

Figure 1B:
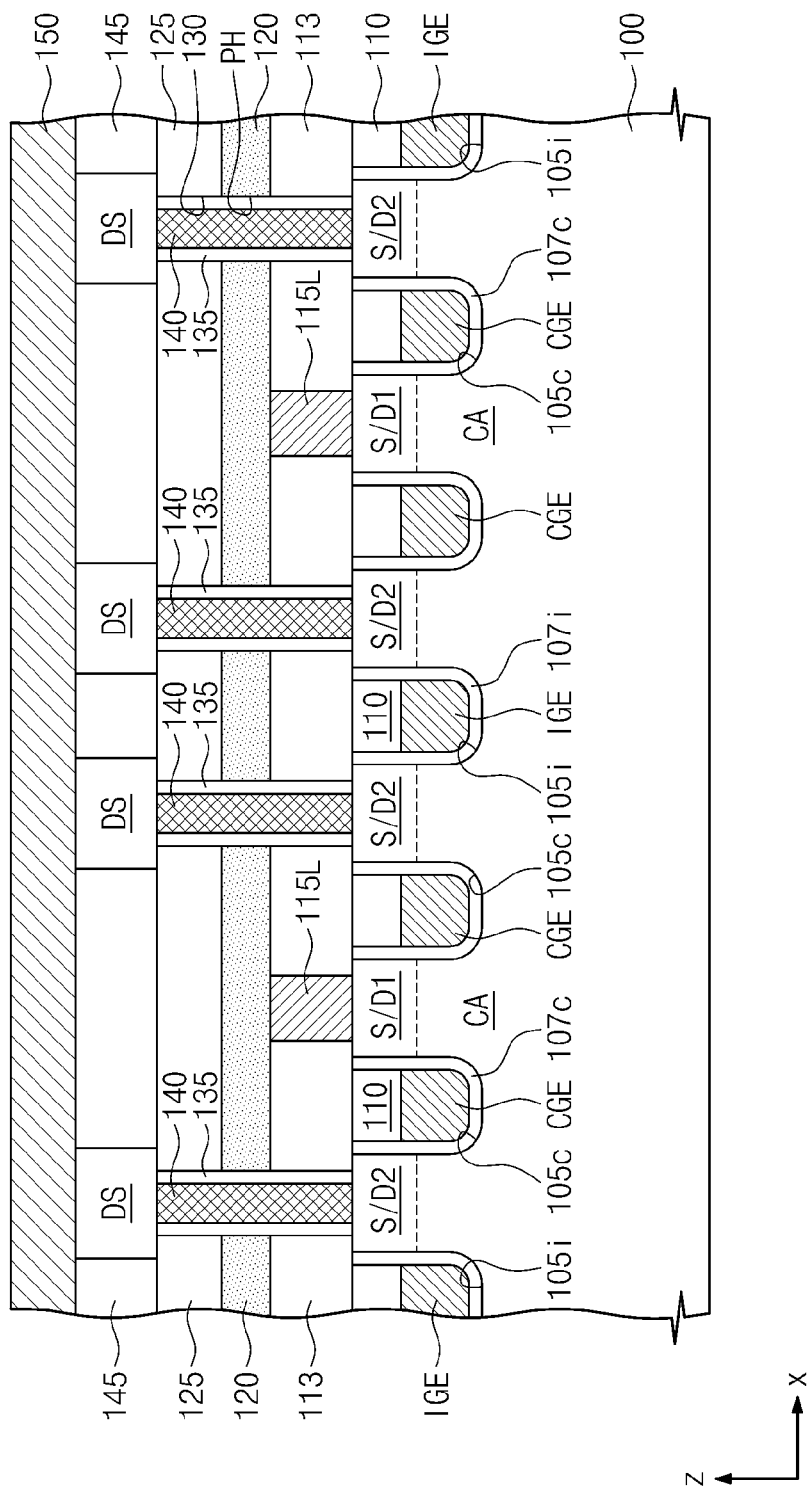
FIG. 1B is an exemplary cross-sectional view taken along a line I-I' of FIG. 1A, according to one embodiment.

The present disclosure will now be described more fully hereinafter with reference to the accompanying drawings, in which exemplary embodiments are shown. The advantages and features of the present disclosure and methods of achieving them will be apparent from the following exemplary embodiments that will be described in more detail with reference to the accompanying drawings. It should be noted, however, that the inventive concept is not limited to the following exemplary embodiments, and may be implemented in various forms. In the drawings, embodiments are not limited to the specific examples provided herein and are exaggerated for clarity.

The terminology used herein is for the purpose of describing particular embodiments only and is not intended to limit the invention. As used herein, the singular terms "a," "an" and "the" are intended to include the plural forms as well, unless the context clearly indicates otherwise. As used herein, the term "and/or" includes any and all combinations of one or more of the associated listed items. It will be understood that when an element is referred to as being "connected" or "coupled" to another element, it may be directly connected or coupled to the other element or intervening elements may be present.

Similarly, it will be understood that when an element such as a layer, region or substrate is referred to as being "on" another element, it can be directly on the other element or intervening elements may be present. In contrast, the term "directly" means that there are no intervening elements. It will be further understood that the terms "comprises", "comprising," "includes" and/or "including", when used herein, specify the presence of stated features, integers, steps, operations, elements, and/or components, but do not preclude the presence or addition of one or more other features, integers, steps, operations, elements, components, and/or groups thereof.

Additionally, the embodiment in the detailed description will be described with sectional views as ideal exemplary views. Accordingly, shapes of the exemplary views may be modified according to manufacturing techniques and/or allowable errors. Therefore, the embodiments disclosed herein are not limited to the specific shape illustrated in the exemplary views, but may include other shapes that may be created according to manufacturing processes. Areas exemplified in the drawings have general properties, and are used to illustrate specific shapes of elements. Thus, this should not be construed as limiting the scope of the inventive concept.

It will be also understood that although the terms first, second, third etc. may be used herein to describe various elements, these elements should not be limited by these terms. Unless indicated otherwise, these terms are only used to distinguish one element from another element. Thus, a first element in some embodiments could be termed a second element in other embodiments without departing from the teachings disclosed herein. Exemplary embodiments of aspects explained and illustrated herein include their complementary counterparts. The same reference numerals or the same reference designators denote the same elements throughout the specification.

Moreover, exemplary embodiments are described herein with reference to cross-sectional illustrations and/or plane illustrations that are idealized exemplary illustrations. Accordingly, variations from the shapes of the illustrations as a result, for example, of manufacturing techniques and/or tolerances, are to be expected. Thus, exemplary embodiments should not be construed as limited to the shapes of regions illustrated herein but are to include deviations in shapes that result, for example, from manufacturing. For example, an etching region illustrated as a rectangle will, typically, have rounded or curved features. Thus, the regions illustrated in the figures are schematic in nature and their shapes are not intended to limit the scope of example embodiments.

First Embodiment

Figure 1C:
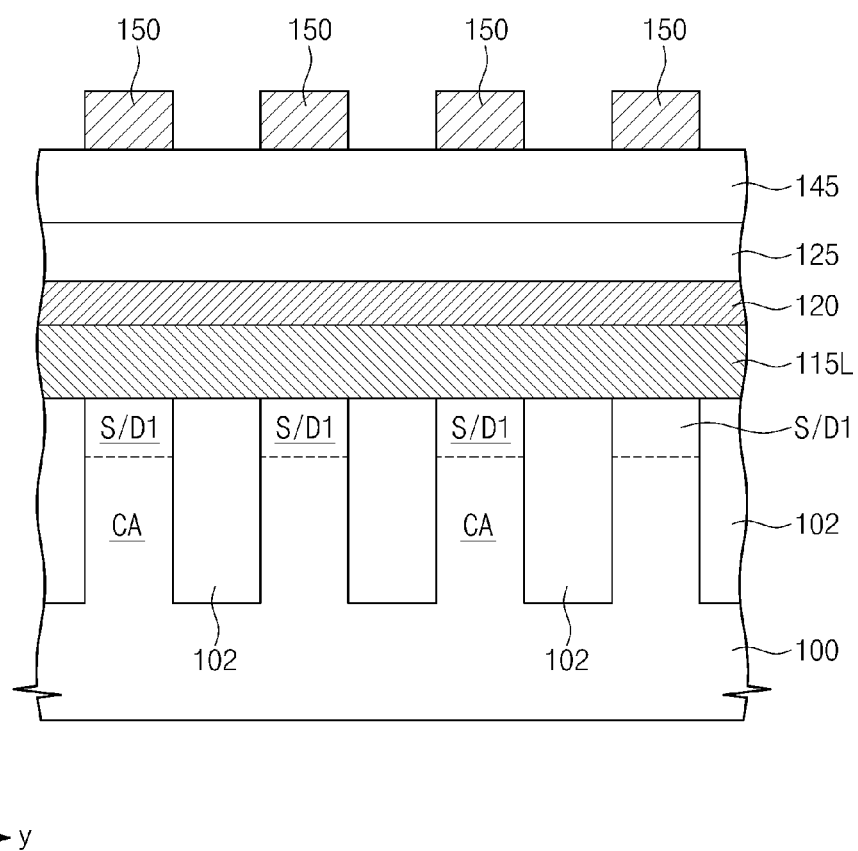
FIG. 1C is an exemplary cross-sectional view taken along a line II-II' of FIG. 1A, according to one embodiment.
Figure 2:
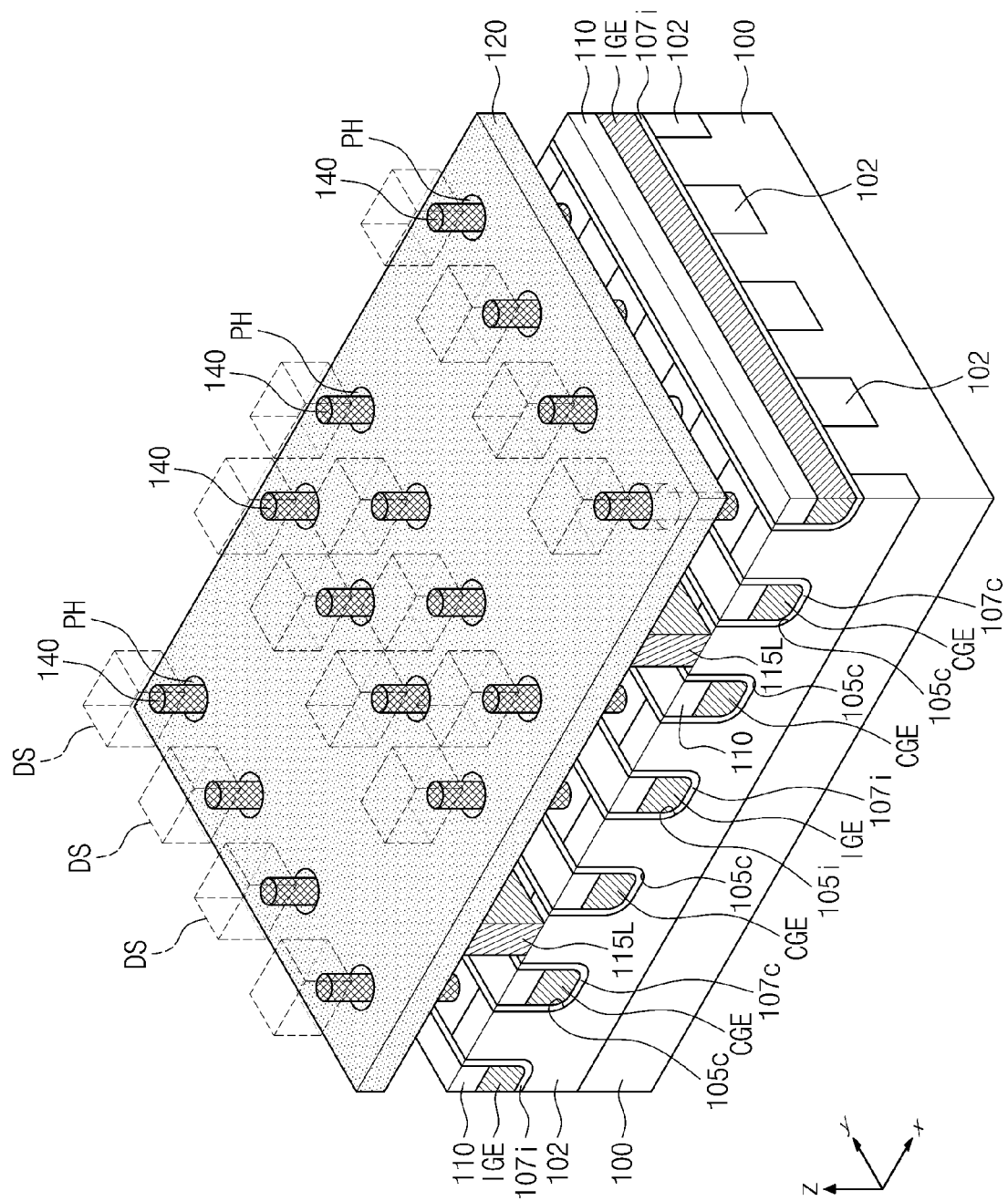
FIG. 2 is a perspective view illustrating a data storage device according to some exemplary embodiments.

FIG. 1A is a plan view illustrating a data storage device according to some exemplary embodiments, FIG. 1B is an exemplary cross-sectional view taken along a line I-I' of FIG. 1A, and FIG. 1C is an exemplary cross-sectional view taken along a line II-IF of FIG. 1A. FIG. 2 is a perspective view illustrating an exemplary data storage device according to some embodiments. For clearly showing components of a data storage device according to one embodiment, some components (e.g. interlayer dielectric layers and bit lines) are omitted in FIG. 2.

Referring to FIGS. 1A, 1B, 1C, and 2, a plurality of cell selection parts may be disposed on or as part of a semiconductor substrate 100 (hereinafter, referred to as 'a substrate'). For example, the substrate 100 may be a silicon substrate, a germanium substrate, or a silicon-germanium substrate. The plurality of cell selection parts may be arranged along rows and columns when viewed from a plan view. The rows may be parallel to an x-axis of FIG. 1A, and the columns may be parallel to a y-axis of FIG. 1A. Part of the cell selection parts, such as the source/drain regions discussed further below, may be part of the substrate. These parts may be formed, for example, in the substrate. Other parts of the cell selection parts, such as gate portions discussed further below, may also be formed in the substrate. For example, certain gates may be in a trench formed in the substrate. The gates may also be considered to be on the substrate, since they are disposed above a trench surface of the substrate. As such, when described as a whole, each cell selection part may be considered as being in the substrate. Certain parts of each cell selection part may also be considered as being on the substrate.

According to an embodiment, each of the cell selection parts may be a field effect transistor. A gate electrode of the cell selection part may be connected to a word line. The word line may be extended in a direction parallel to the columns (hereinafter, referred to as 'a column-direction'). The word line may be electrically connected to the gate electrodes of the cell selection parts constituting each of the rows. The cell selection part may include a first source/drain region corresponding to a first terminal and a second source/drain region corresponding to a second terminal. Hereinafter, the cell selection parts according to an embodiment will be described in more detail.

Device isolation patterns 102 may be disposed in the substrate 100 so as to define active line patterns ALP. The active line patterns ALP may correspond to portions of the substrate 100 which are surrounded by the device isolation patterns 102, respectively. The active line patterns ALP may be extended in a direction parallel to the rows (hereinafter, referred to as 'a row-direction'). Thus, the device isolation patterns 102 may be extended to be parallel to the active line patterns ALP. The active lines patterns ALP and the device isolation patterns 102 may be alternately and repeatedly arranged in the column-direction when viewed from a plan view. In one embodiment, the active line pattern ALP may be arranged at equal intervals. The device isolation patterns 102 may fill trenches formed in the substrate 100, respectively. In one embodiment, the device isolation patterns 102 include an insulating dielectric material (e.g. oxide, nitride, and/or oxynitride, etc.).

As shown in FIG. 2, in one embodiment, isolation recess regions 105i cross the active line patterns ALP and the device isolation patterns 102. Each of the isolation recess regions 105i may have a groove-shape extended in the column-direction. The isolation recess regions 105i divide each of the active line pattern ALP into cell active portions CA. Each of the cell active portions CA may correspond to a portion of the active line pattern ALP between a pair of the isolation recess regions 105i adjacent to each other. In other words, each of the cell active portions CA may be defined by a pair of the device isolation patterns 102 adjacent to each other and the pair of the isolation recess regions 105i adjacent to each other. The cell active portions may be arranged along rows and columns in a plan view. The cell active portions CA divided from each of the active line patterns ALP constitute each of the rows, and the cell active portions CA disposed between the pair of the isolation recess regions 105i adjacent to each other are be arranged in the column-direction and constitute each of the columns. The cell active portions CA may be doped with dopants of a first conductivity type.

At least one cell recess region 105c may cross the cell active portions CA constituting each of the columns. The cell recess regions 105c may be parallel to the isolation recess regions 105i. Thus, the cell recess regions 105c may have groove-shapes extended in the column-direction. In some embodiments, a pair of the cell recess regions 105c cross the cell active portions CA constituting each of the columns. In this case, a pair of the cell selection parts may be formed at each of the cell active portions CA.

In one embodiment, bottom surfaces of the cell and isolation recess regions 105c and 105i are disposed at a level lower than top surfaces of the substrate 100 at cell active portions CA. A depth of the cell recess region 105c may be substantially equal to a depth of the isolation recess region 105i. In some embodiments, a width of the cell recess region 105c is substantially equal to a width of the isolation recess region 105i. However, the inventive concept is not limited thereto. In other embodiments, the width of the cell recess region 105c are different from the width of the isolation recess region 105i. In some embodiments, the cell and isolation recess regions 105c and 105i are arranged at equal intervals. However, the inventive concept is not limited thereto.

A cell gate electrode CGE may be disposed in each of the cell recess regions 105c and an isolation gate electrode IGE may be disposed in each of the isolation recess regions 105i. The cell gate electrodes CGE may have line-shapes extended in the column-direction due to the shapes of the cell recess regions 105c. The cell gate electrodes CGE may correspond to the word lines. The isolation gate electrodes IGE may have line-shapes extended in the column-direction due to the shapes of the isolation recess regions 105i.

In some embodiments, the isolation gate electrodes IGE are formed of the same material as the cell gate electrodes CGE. For example, the cell and isolation gate electrodes CGE and IGE may include at least one of a semiconductor material doped with dopants (e.g. doped silicon), metal (e.g. tungsten, aluminum, titanium, and/or tantalum), a conductive metal nitride (e.g. titanium nitride, tantalum nitride, and/or tungsten nitride), and a metal-semiconductor compound (e.g. metal silicide).

A cell gate dielectric layer 107c may be disposed between an inner surface of each of the cell recess regions 105c and the cell gate electrode CGE. An isolation gate dielectric layer 107i may be disposed between an inner surface of each of the isolation recess regions 105i and the isolation gate electrode IGE. The isolation gate dielectric layer 107i may be formed of the same material as the cell gate dielectric layer 107c. Alternatively, the isolation gate dielectric layer 107i may include a dielectric material different from the cell gate dielectric layer 107c. The cell gate dielectric layer 107c may include, for example, oxide, nitride, oxynitride, and/or a high-k dielectric material (e.g. an insulating metal oxide such as hafnium oxide, and/or aluminum oxide). The isolation gate dielectric layer 107i may include, for example, oxide, nitride, oxynitride, and/or a high-k dielectric material (e.g. an insulating metal oxide such as hafnium oxide, and/or aluminum oxide).

Top surfaces of the cell and isolation gate electrodes CGE and IGE may be lower than the top surfaces of the substrate 100 at the cell active portions CA. Capping dielectric patterns 110 may be disposed on the cell and isolation gate electrodes CGE and IGE, respectively. The capping dielectric patterns 110 may be disposed in the cell and isolation recess regions 105c and 105i, respectively. In some embodiments, top surfaces of the capping dielectric patterns 110 are substantially coplanar with the top surfaces of the substrate 100 at the cell active portions CA. The capping dielectric patterns 110 may include, for example, oxide, nitride, and/or oxynitride.

As described above, the pair of the cell recess regions 105c may cross the cell active portions CA constituting each of the columns. Thus, a pair of the cell gate electrodes CGE respectively disposed in the pair of the cell recess regions 105c may cross the cell active portions CA constituting each of the columns. The first source/drain region S/D1 may be disposed in each of the cell active portions CA between the pair of the cell gate electrodes CGE. A pair of the second source/drain regions S/D2 may be disposed in both edge regions of each of the cell active portions CA, respectively. The pair of the cell gate electrodes CGE crossing each of the cell active portions CA may be disposed between the pair of the second source/drain regions S/D2. The first and second source/drain regions S/D1 and S/D2 may be doped with dopants of a second conductivity type. One of the dopant having the first conductivity type and the dopant having the second conductivity type is an N-type dopant, and the other is a P-type dopant. For example, the dopant of the first conductivity type may be the P-type dopant and the dopant of the second conductivity type may be the N-type dopant. In this case, the cell selection parts may be NMOS transistors.

When the data storage device according to certain embodiments is operated, an isolation voltage may be applied to the isolation gate electrodes IGE. The isolation voltage prevents channels from being formed under the inner surfaces of the isolation recess regions 105i. For example, isolation channel regions under the isolation gate electrodes IGE are turned off by the isolation voltage. Thus, the cell active portions CA divided from each of the active line pattern ALP may be isolated from each other. In some embodiments, when the active line patterns ALP are doped with P-type dopants and the source/drain regions S/D1 and S/D2 are doped with N-type dopants, the isolation voltages are a ground voltage or a negative voltage.

As described above, the pair of the cell selection parts may be formed at each of the cell active portions CA. The pair of the cell selection parts may include the pair of the cell gate electrodes CGE, the first source/drain region S/D1, and the pair of the second source/drain regions S/D2, which are formed at each of the active portions CA. Here, the pair of the cell selection parts may share the first source/drain region S/D1 formed in each of the cell active portions CA, and the pair of the second source/drain regions S/D2 formed in each of the cell active portions CA may be included in the pair of the cell selection parts, respectively.

A first interlayer dielectric layer 113 may be disposed on an entire surface of the substrate 100. The first interlayer dielectric layer 113 may cover the cell selection parts. In one embodiment, the first interlayer dielectric layer 113 is disposed above the cell selection parts and part of the first interlayer dielectric layer 113 contacts one or more of the first source/drain regions S/D1 and the second source drain regions S/D2. The first interlayer dielectric layer 113 may be single-layered or multi-layered. The first interlayer dielectric layer 113 may include, for example, an oxide layer, a nitride layer, and/or an oxynitride layer.

In one embodiment, a plate conductive pattern 120 is disposed on the first interlayer dielectric layer 113. The plate conductive pattern 120 covers the plurality of the cell selection parts. The plate conductive pattern 120 is electrically connected to the first terminals of the cell selection parts. For example, the plate conductive pattern 120 may be electrically connected to the first source/drain regions S/D1 of the cell selection parts. As a result, the first source/drain regions S/D1 of the plurality of the cell selection parts are connected to the plate conductive pattern 120 in common. As shown in FIGS. 1B, 1C, and 2, in one embodiment, the plate conductive pattern 120 is located between the cell selection parts and data storage parts DS (discussed further below).

When a read operation and/or a program operation of the data storage device according to certain embodiments is performed, a reference voltage may be applied to the plate conductive pattern 120. Thus, the reference voltage may be provided to the first source/drain regions S/D1 of the cell selection parts. The plate conductive pattern 120 has a plate-shape covering the plurality of the cell selection parts. Thus, the plate conductive pattern 120 may have a wider area in a plan view. As a result, a resistance value of the plate conductive pattern 120 may be minimized.

The plate conductive pattern 120 may include a conductive material. For example, the plate conductive pattern 120 may include at least one of a semiconductor material doped with dopants (e.g. doped silicon, doped germanium, or doped silicon-germanium), metal (e.g. tungsten, aluminum, titanium, and/or tantalum), a conductive metal nitride (e.g. titanium nitride, tantalum nitride, and/or tungsten nitride), and a metal-semiconductor compound (e.g. metal silicide such as tungsten silicide, titanium silicide, cobalt silicide, and/or nickel silicide). The plate conductive pattern 120 may be single-layered or multi-layered.

The plate conductive pattern 120 may be electrically connected to the first source/drain regions S/D1 through conductive contact patterns, such as contact line patterns 115L. The contact line patterns 115L may penetrate the first interlayer dielectric layer 113 and be connected to the first source/drain regions S/D1. As illustrated in the embodiments shown in FIGS. 1A and 1C, the contact line patterns 115L may be extended to be parallel to the cell gate electrodes CGE. Each of the contact line patterns 115L may be connected to the first source/drain regions, which are respectively formed in the cell active portions CA constituting each of the columns. The plate conductive pattern 120 may be in contact with top surfaces of the contact line patterns 115L. The contact line patterns 115L may include at least one of a semiconductor material doped with dopants (e.g. doped silicon, doped germanium, and/or doped silicon-germanium), metal (e.g. tungsten, aluminum, titanium, and/or tantalum), conductive metal nitride (e.g. titanium nitride, tantalum nitride, and/or tungsten nitride), and metal-semiconductor compound (e.g. metal silicide such as tungsten silicide, titanium silicide, cobalt silicide, and/or nickel silicide).

A second interlayer dielectric layer 125 may be disposed on the plate conductive pattern 120. The second interlayer dielectric layer 125 may include, for example, an oxide layer, a nitride layer, and/or an oxynitride layer.

A plurality of through-pillars 140 may successively penetrate the second interlayer dielectric layer 125, the plate conductive pattern 120, and the first interlayer dielectric layer 113. The plurality of through-pillars 140 may be electrically connected to the second terminals (i.e. the second source/drain regions S/D2) of the cell selection parts, respectively. In one embodiment, the through-pillars 140 are insulated from the plate conductive pattern 120. In some embodiments, the through-pillars 140 may be in contact with the second source/drain regions S/D2, respectively.

The through-pillars 140 may be disposed in through-holes 130, respectively. The through-holes 130 successively penetrate the second interlayer dielectric layer 125, the plate conductive pattern 120, and the first interlayer dielectric layer 113. The through-holes 130 are spaced apart from each other. Due to the through-holes 130, a plurality of plate-holes PH may be defined in the plate conductive pattern 120. Each of the plate-holes PH may correspond to a region of each of the through-holes 130 that penetrate the plate conductive pattern 120. Thus, each of the plate-holes PH is aligned with each of the through-holes 130. The through-pillars 140 may pass through the plate-holes PH, respectively. And in one embodiment, the through-pillars 140 are spaced apart from inner sidewalls of the plate-holes PH. In one embodiment, plate-holes PH entirely surround a vertical portion of the through-pillars 140. The plate-holes PH may be, for example, circular holes that surround a cylindrical pillar having a circular cross-section.

The through-pillars 140 are formed of a conductive material. For example, the through-pillars 140 may include at least one of a semiconductor material doped with dopants (e.g. doped silicon, doped germanium, and/or doped silicon-germanium), metal (e.g. tungsten, aluminum, copper, titanium, and/or tantalum), conductive metal nitride (e.g. titanium nitride, tantalum nitride, and/or tungsten nitride), and metal-semiconductor compound (e.g. metal silicide such as tungsten silicide, titanium silicide, cobalt silicide, and/or nickel silicide). In some embodiments, when the through-pillar 140 is in contact with the second source/drain region S/D2, the through-pillar 140 may include an ohmic layer being in contact with the second source/drain region S/D2. The ohmic layer may include metal-semiconductor compound (e.g. metal silicide).

An insulating spacer 135 may be disposed between an inner sidewall of each of the through-holes PH and each of the through-pillars 140. The each of the through-pillars 140 is insulated from the plate conductive pattern 120 due to the insulating spacer 135. The insulating spacer 135 may include, for example, nitride, oxide, and/or oxynitride.

Data storage parts DS may be disposed on the second interlayer dielectric layer 125. In one embodiment, the data storage parts DS are directly connected to the through-pillars 140, respectively. For example, the data storage parts DS may be disposed on top surfaces of the through-pillars 140, respectively. And the data storage parts DS may be in contact with the top surfaces of the through-pillars 140, respectively. The through-pillar 140 may be overlapped with the data storage part DS connected to the through-pillar 140 when viewed form a plan view. As such, the through-pillar 140 and the data storage part DS connected thereto may be arranged along one axis vertical to the top surface of the substrate 100. For clearly showing an exemplary location relationship of the plate conductive pattern 120, the through-pillars 140, and the data storage parts DS, the interlayer dielectric layers 113 and 115 and bit lines 150 are omitted in FIG. 2.

Each of the data storage parts DS may be electrically connected to the second source/drain region S/D2 of each of the cell selection part through each of the through-pillars 140. In a plan view, each of the data storage parts DS may be overlapped with the second source/drain region S/D2 electrically connected thereto. Thus, each of the data storage parts DS may be overlapped with the through-pillar 140 and the second source/drain region S/D2 under each of the data storage parts DS when viewed from a plan view. One memory cell may include one cell selection part and one data storage part DS. As illustrated in FIGS. 1A and 2, the data storage parts DS may be arranged along rows and columns when viewed from a plan view.

The data storage part DS may store a logic data. The data storage part DS may include, for example, one of a magnetic tunnel junction using magnetization directions, a transition metal oxide using an electrical path, and a phase change material. The data storage parts DS will be described in more detail later.

A third interlayer dielectric layer 145 may fill a space between the data storage parts DS. In some embodiments, as illustrated in FIG. 1B, a top surface of the third interlayer dielectric layer 145 may be substantially coplanar with top surfaces of the data storage parts DS. However, the disclosure is not limited thereto. In other embodiments, the third interlayer dielectric layer 145 may fill the space between the data storage parts DS and cover the top surfaces of the data storage parts DS. The third interlayer dielectric layer 145 may include, for example, an oxide layer, a nitride layer, and/or an oxynitride layer.

Bit lines 150 may be disposed on the third interlayer dielectric layer 145. The bit lines 15 are electrically connected to the top surfaces of the data storage parts DS. The bit lines 150 may cross over the cell gate electrodes CGE. The bit lines 150 may be extended in the row-direction. Each of the bit lines 150 may be electrically connected to the data storage parts DS constituting each of the rows. As illustrated in FIG. 1B, when the top surface of the third interlayer dielectric layer 145 is substantially coplanar with the top surfaces of the data storage parts DS, each of the bit lines 150 may be in contact with the top surfaces of the data storage parts DS constituting each of the rows. Alternatively, when the third interlayer dielectric layer 145 covers the top surfaces of the data storage parts DS, each of the bit lines 150 may be electrically connected to the data storage parts DS through contact plugs penetrating the third interlayer dielectric layer 145.

The bit lines 150 include a conductive material. For example, the bit lines 150 may include at least one of metal (e.g. tungsten, aluminum, copper, titanium, and/or tantalum) and conductive metal nitride (e.g. titanium nitride, tantalum nitride, and/or tungsten nitride).

According to the data storage device described above, the plate conductive pattern 120 has the plate-shape covering the plurality of the cell selection parts. Thus, the plate conductive pattern 120 may have a wider area in a plan view. As a result, when the read operation and/or the program operation are performed, the reference voltage may be stably provided to the memory cells through the plate conductive pattern 120. Thus, it is possible to realize the data storage device having excellent reliability.

Additionally, each of the data storage parts DS is directly connected to each of the through-pillars 140 which penetrates the plate conductive pattern 120 and is insulated from the plate conductive pattern 120. Thus, the data storage parts DS may be overlapped with the plate conductive pattern 120 in a plan view. As such, the plate conductive pattern 120 and the data storage parts DS may be vertically stacked. As a result, it is possible to prevent or minimize an area increase of the data storage device, which may be caused by the plate conductive pattern 120. Thus, the data storage device with high integration may be realized.

Furthermore, the through-pillars 140 pass through the plate-holes PH of the plate conductive pattern 120, respectively. Here, the plate-holes PH are spaced apart from each other. Thus, it is possible to minimize an area decrease of the plate conductive pattern that may be caused by the penetration of the through-pillars 140. As a result, it is possible to minimize the area increase of the data storage device by the plate conductive pattern 120 and the area decrease of the plate conductive pattern 120 by the penetration of the through-pillar 140.

Hereinafter, the data storage part DS will be described in more detail with reference to the drawings.

Figure 3A:
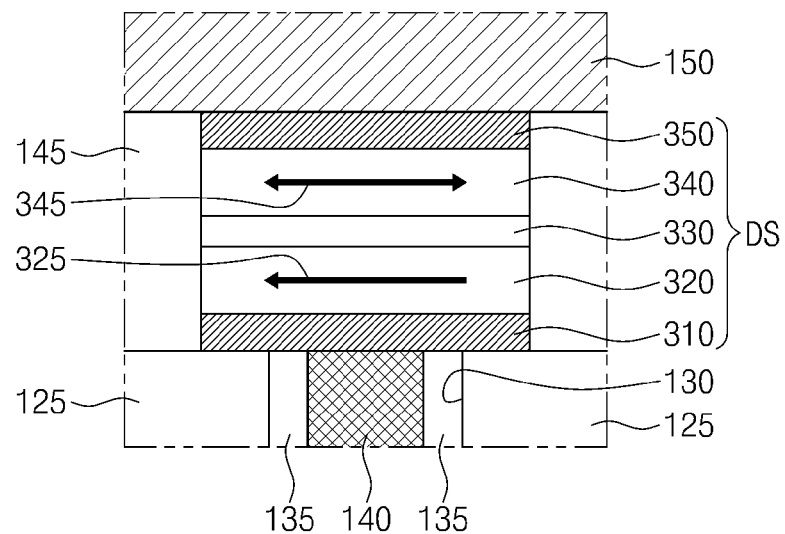
FIG. 3A is a cross-sectional view illustrating an example of a data storage part of a data storage device according to some exemplary embodiments.

FIG. 3A is a cross-sectional view illustrating an example of an exemplary data storage part of a data storage device according to some embodiments.

Referring to FIG. 3A, the data storage part DS according to the present example may include a reference pattern 320, a free pattern 340, and a tunnel barrier pattern 330 disposed between the reference pattern 320 and the free pattern 340. The reference pattern 320 has a magnetization direction 325 fixed in one direction. The free pattern 340 has a magnetization direction 345 configured to be changeable in parallel or anti-parallel with the magnetization direction 325 of the reference pattern 320. The magnetization directions 325 and 345 of the reference and free patterns 320 and 340 may be in parallel with a surface of the tunnel barrier pattern 330, which is in contact with the free pattern 340. The reference pattern 320, the tunnel barrier pattern 330, and the free pattern 340 may constitute a magnetic tunnel junction.

When the magnetization direction 345 of the free pattern 340 is parallel to the magnetization direction 325 of the reference pattern 320, the data storage part DS may have a first resistance value. When the magnetization direction 345 of the free pattern 340 is anti-parallel to the magnetization direction 325 of the reference pattern 320, the data storage part DS may have a second resistance value. Here, the first resistance value may be smaller than the second resistance value. The data storage part DS may store a logic data by using difference between the resistance values. The magnetization direction 345 of the free pattern 340 may be changeable by spin torque of electrons in a program current.

The reference pattern 320 and the free pattern 340 may include a ferromagnetic material. The reference pattern 320 may further include an anti-ferromagnetic material pinning the magnetization direction of the ferromagnetic material in the reference pattern 320. The tunnel barrier pattern 330 may include, for example, at least one of magnesium oxide, titanium oxide, aluminum oxide, magnesium-zinc oxide, and magnesium-boron oxide.

The data storage pattern DS may further include a lower electrode 310 and an upper electrode 350. The reference pattern 320, the tunnel barrier pattern 330, and the free pattern 340 may be disposed between the lower electrode 310 and the upper electrode 350. As illustrated in FIG. 3A, the reference pattern 320, the tunnel barrier pattern 330, and the free pattern 340 may be sequentially stacked on the lower electrode 310. Alternatively, the free pattern 340, the tunnel barrier pattern 330, and the reference pattern 320 may be sequentially stacked on the lower electrode 310, and the upper electrode 350 may be disposed on the reference pattern 320. The lower electrode 310 and the upper electrode 350 may include, for example, a conductive metal nitride (e.g. titanium nitride, tantalum nitride, and/or tungsten nitride).

Figure 3B:
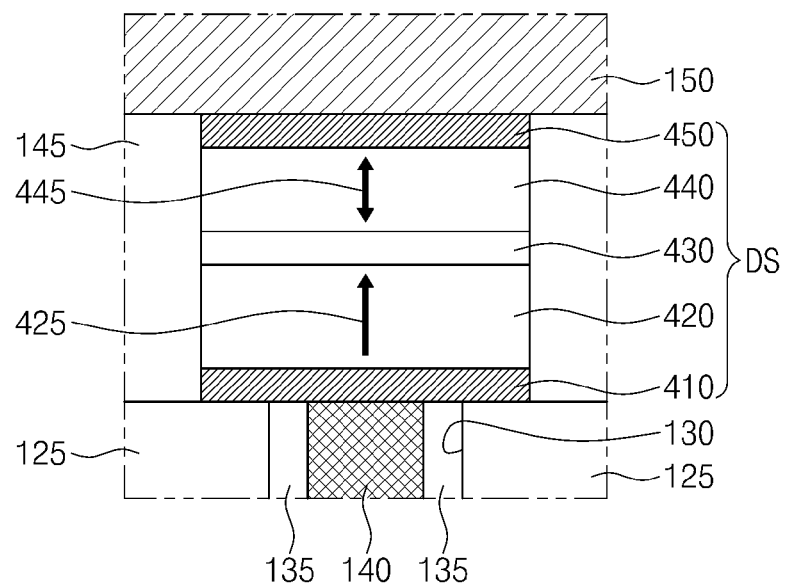
FIG. 3B is a cross-sectional view illustrating another example of a data storage part of a data storage device according to some exemplary embodiments.

FIG. 3B is a cross-sectional view illustrating another example of a data storage part of a data storage device according to some exemplary embodiments.

Referring to FIG. 3B, a data storage part DS according to the present example may include a reference perpendicular pattern 420, a free perpendicular pattern 440, and a tunnel barrier pattern 430 disposed between the reference perpendicular pattern 420 and the free perpendicular pattern 440. The reference perpendicular pattern 420 may have a magnetization direction 425 fixed in one direction. The free perpendicular pattern 440 may have a magnetization direction 445 configured to be changeable in parallel or in anti-parallel with the magnetization direction 425 of the reference perpendicular pattern 420. Here, the magnetization directions 425 and 445 of the reference and free perpendicular patterns 420 and 445 may be perpendicular to one surface of the tunnel barrier pattern 430, which is in contact with the free perpendicular pattern 440.

The reference and free perpendicular pattern 420 and 440 may include at least one of a perpendicular magnetic material (e.g. CoFeTb, CoFeGd, and/or CoFeDy), a perpendicular magnetic material having an $L1_0$ structure, CoPt of a hexagonal close packed (HCP) lattice structure, and a perpendicular magnetic structure. The perpendicular magnetic material having the $L1_0$ structure may include FePt of the $L1_0$ structure, FePd of the $L1_0$ structure, CoPd of the $L1_0$ structure, and/or CoPt of the $L1_0$ structure. The perpendicular magnetic structure may include magnetic layers and non-magnetic layers which are alternately and repeatedly stacked. For example, the perpendicular magnetic structure may include at least one of (Co/Pt)n, (CoFe/Pt)n, (CoFe/Pd)n, (Co/Pd)n, (Co/Ni)n, (CoNi/Pt)n, (CoCr/Pt)n, and (CoCr/Pd)n (where the n is the number of alternately stacked magnetic layers and the non-magnetic layers). Here, the reference perpendicular pattern 420 may be thicker than the free perpendicular pattern 440, and/or a coercive force of the reference perpendicular pattern 420 may be greater than a coercive force of the free perpendicular pattern 440.

The tunnel barrier pattern 430 may include, for example, at least one of magnesium oxide, titanium oxide, aluminum oxide, magnesium-zinc oxide, and magnesium-boron oxide. The data storage part Ds may further include a lower electrode 410 and an upper electrode 450. As illustrated in FIG. 3B, the reference perpendicular pattern 420, the tunnel barrier pattern 430, and the free perpendicular pattern 440 may be sequentially stacked on the lower electrode 410, and the upper electrode 450 may be disposed on the free perpendicular pattern 440. Alternatively, the free perpendicular pattern 440, the tunnel barrier pattern 430, and the reference perpendicular pattern 420 may be sequentially stacked on the lower electrode 410, and the upper electrode 450 may be disposed on the reference perpendicular pattern 420. The lower and upper electrode 410 and 450 may include a conductive metal nitride (e.g. titanium nitride, tantalum nitride, and/or tungsten nitride).

Figure 3C:
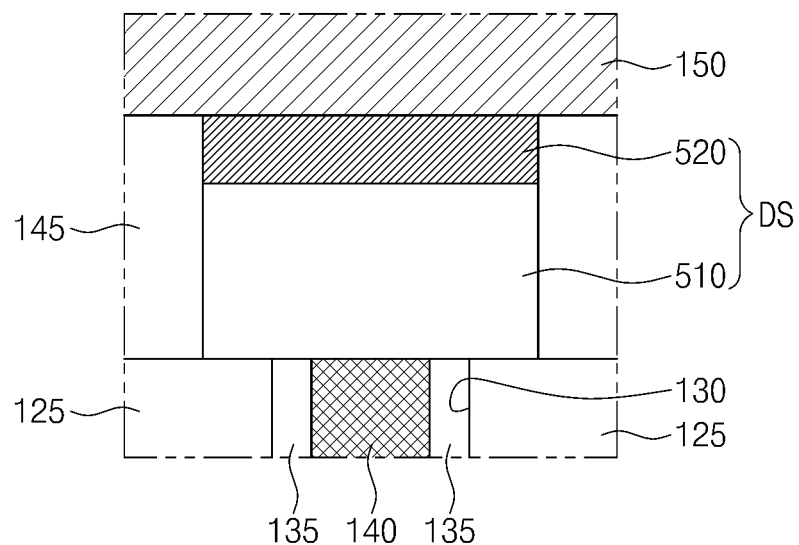
FIG. 3C is a cross-sectional view illustrating still another example of a data storage part of a data storage device according to some embodiments of the inventive concept.

FIG. 3C is a cross-sectional view illustrating still another example of a data storage part of a data storage device according to some exemplary embodiments.

Referring to FIG. 3C, a data storage part DS according to the present example may include a phase change material pattern 510 and a capping electrode 520 disposed on the phase change material pattern 510. A phase of the phase change material pattern 510 may be changed into a crystal state or an amorphous state by a temperature of a supplied heat and/or a supplying time of the heat. The phase change material pattern 510 in the crystal state may have a lower resistivity than that of the phase change pattern 510 in the amorphous state. The data storage part DS may store the logic data using difference between the resistivity of the crystal state and the resistivity of the amorphous state. In some embodiments, the through-pillar 140 in contact with the phase change material pattern 510 may be used as a heater electrode. In this case, a portion of the phase change material pattern 510, which is adjacent to the through-pillar 140, may correspond to a programming region. The programming region may be changed into the crystal state or the amorphous state.

The phase change material pattern 510 may include at least one of chalcogenide elements such as tellurium (Te) and selenium (Se). For example, the phase change material pattern 510 may include at least one of a Ge—Sb—Te compound material, an As—Sb—Te compound material, an As—Ge—Sb—Te compound material, a Sn—Sb—Te compound material, a Ag—In—Sb—Te compound material, an In—Sb—Te compound material, a group 5A element-Sb—Te compound material, a group 6A element-Sb—Te compound material, a group 5A element-Sb—Se compound material, a group 6A element-Sb—Se compound material, a Ge—Sb compound material, an In—Sb compound material, a Ga—Sb compound material, and a doped Ge—Sb—Te compound material. The doped Ge—Sb—Te compound material may be doped with at least one of carbon (C), nitrogen (N), boron (B), bismuth (Bi), silicon (Si), phosphorus (P), aluminum (Al), dysprosium (Dy), and titanium (Ti). The capping electrode 520 may be formed of a conductive metal nitride.

Figure 3D:
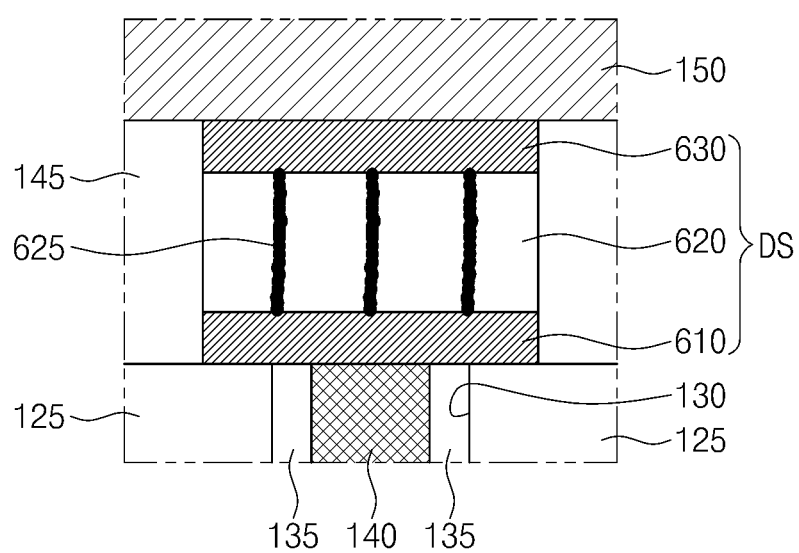
FIG. 3D is a cross-sectional view illustrating yet another example of a data storage part of a data storage device according to some exemplary embodiments.

FIG. 3D is a cross-sectional view illustrating yet another example of a data storage part of a data storage device according to some exemplary embodiments.

Referring to FIG. 3D, a data storage part DS according to one example may include a lower electrode 610, an upper electrode 630, and a transition metal oxide pattern 620 disposed between the lower and upper electrodes 610 and 630. At least one electrical path 625 may be generated in or disappear from the transition metal oxide pattern 620 by a programming operation. Both ends of the electrical path 625 may be connected to the lower electrode 610 and the upper electrode 630, respectively. When the electrical path 625 is generated, the data storage part DS may have a low resistance value. When the electrical path 625 disappears, the data storage part DS may have a high resistance value. The data storage part DS may store the logic data using difference between the resistance values caused by the electrical path 625.

For example, the transition metal oxide pattern 620 may include at least one of niobium oxide, titanium oxide, nickel oxide, zirconium oxide, vanadium oxide, (Pr,Ca)MnO3 (PCMO), strontium-titanium oxide, barium-strontium-titanium oxide, strontium-zirconium oxide, barium-zirconium oxide, and barium-strontium-zirconium oxide.

The lower and upper electrodes 610 and 630 may include at least one of conductive metal nitrides (e.g. titanium nitride, tantalum nitride, and/or tungsten nitride), transition metals (e.g. titanium and/or tantalum), and rare earth metals (e.g. ruthenium and/or platinum).

Meanwhile, the through-pillar 140 may be insulated from the plate conductive pattern 120 by another insulator except the insulating spacer 135. This will be described with reference to FIG. 4.

According to the above embodiments, the exemplary aspects of the data storage device described herein can be implemented for different types of memory devices, such as a magnetic random access memory (MRAM) device, a phase-change random access memory (PRAM) device, or a resistive random access memory (RRAM) device. In such devices, different voltages may be supplied to the bit lines and word lines, and to the first source/drain terminals (S/D1) via the plate conductive pattern 120, in order to carry out the normal functionality of an MRAM, PRAM, or RRAM device.

Figure 4:
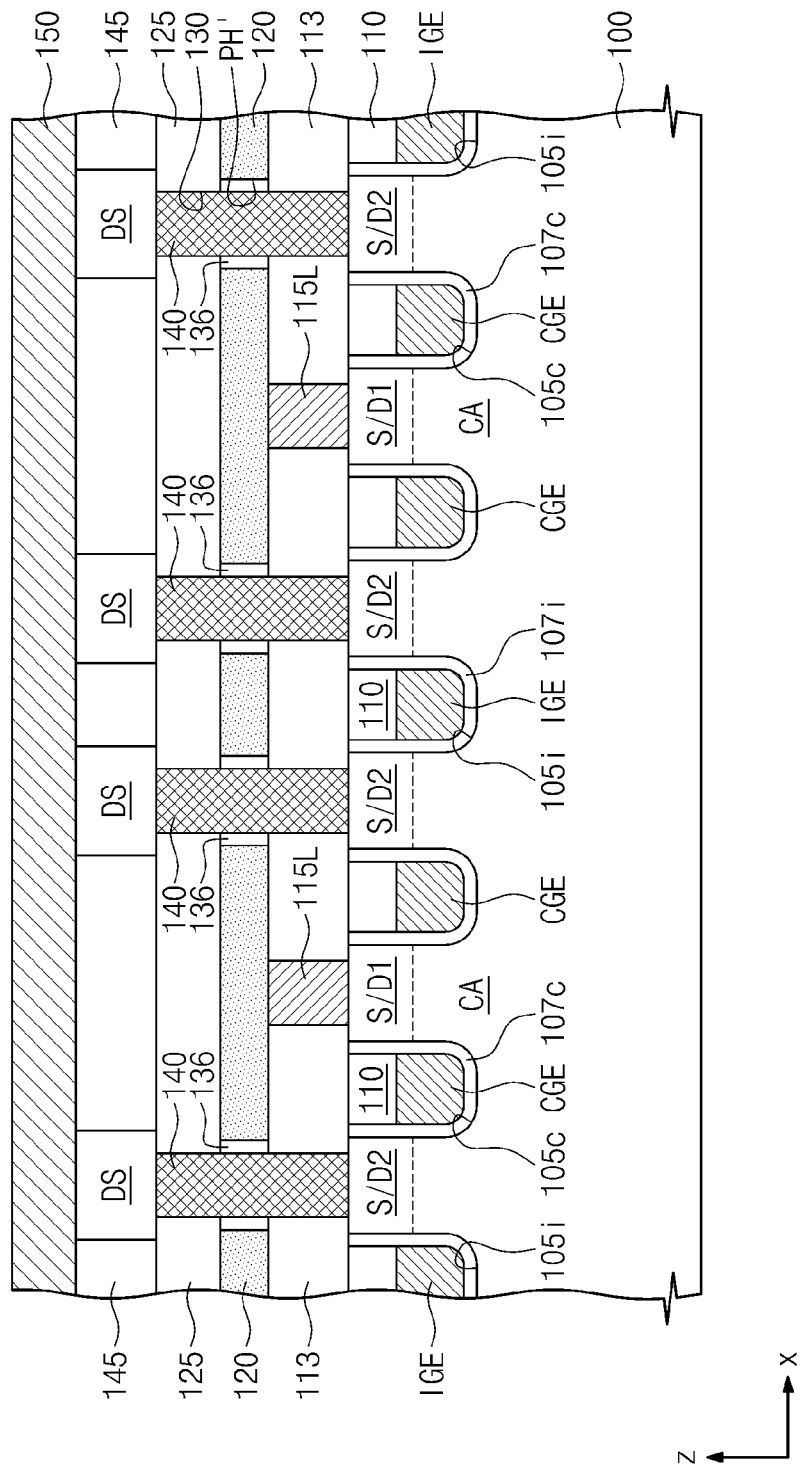
FIG. 4 is a cross-sectional view illustrating a modified embodiment of a data storage device according to some exemplary embodiments.

FIG. 4 is a cross-sectional view illustrating a modified embodiment of a data storage device according to some exemplary embodiments.

Referring to FIG. 4, an insulator 136 may be confinedly disposed between each of the through-pillars 140 and the plate conductive pattern 120. For example, the insulator 136 may be confinedly disposed between an inner sidewall of each of plate-holes PH' in the plate conductive pattern 120 and each of the through-pillars 140. A treatment process may be performed on the plate conductive pattern 120 exposed by the through-hole 130, thereby forming the insulator 136. The treatment process may be an oxidation process and/or a nitridation process. Thus, the insulator 136 may include, for example, oxide, nitride, or oxynitride. For example, when the plate conductive pattern 120 is formed of doped silicon, the insulator 136 may be formed of silicon oxide, silicon nitride, or silicon oxynitride.

Since the insulator 136 is formed by the treatment process, a width of the plate-hole PH' may be greater than a width of a region of the through-hole 130 which is formed in the second interlayer dielectric layer 125. However, the plate-hole PH' may also be aligned with the through-hole 130.

According to the present modified embodiment, the insulating spacer 135 illustrated in FIGS. 1A and 1B may be omitted due to the insulator 136. Alternatively, the insulating spacer 135 illustrated in FIGS. 1A and 1B may be added in the data storage device including the insulator 136 of FIG. 4. In this case, the through-pillar 140 may be insulated from the plate conductive pattern 120 by the insulating spacer 135 and the insulator 136.

The contact line pattern 115L illustrated in FIGS. 1A to 1C and 2 may be replaced with a contact structure having another shape. This will be described with reference to FIGS. 5A and 5B.

Figure 5A:
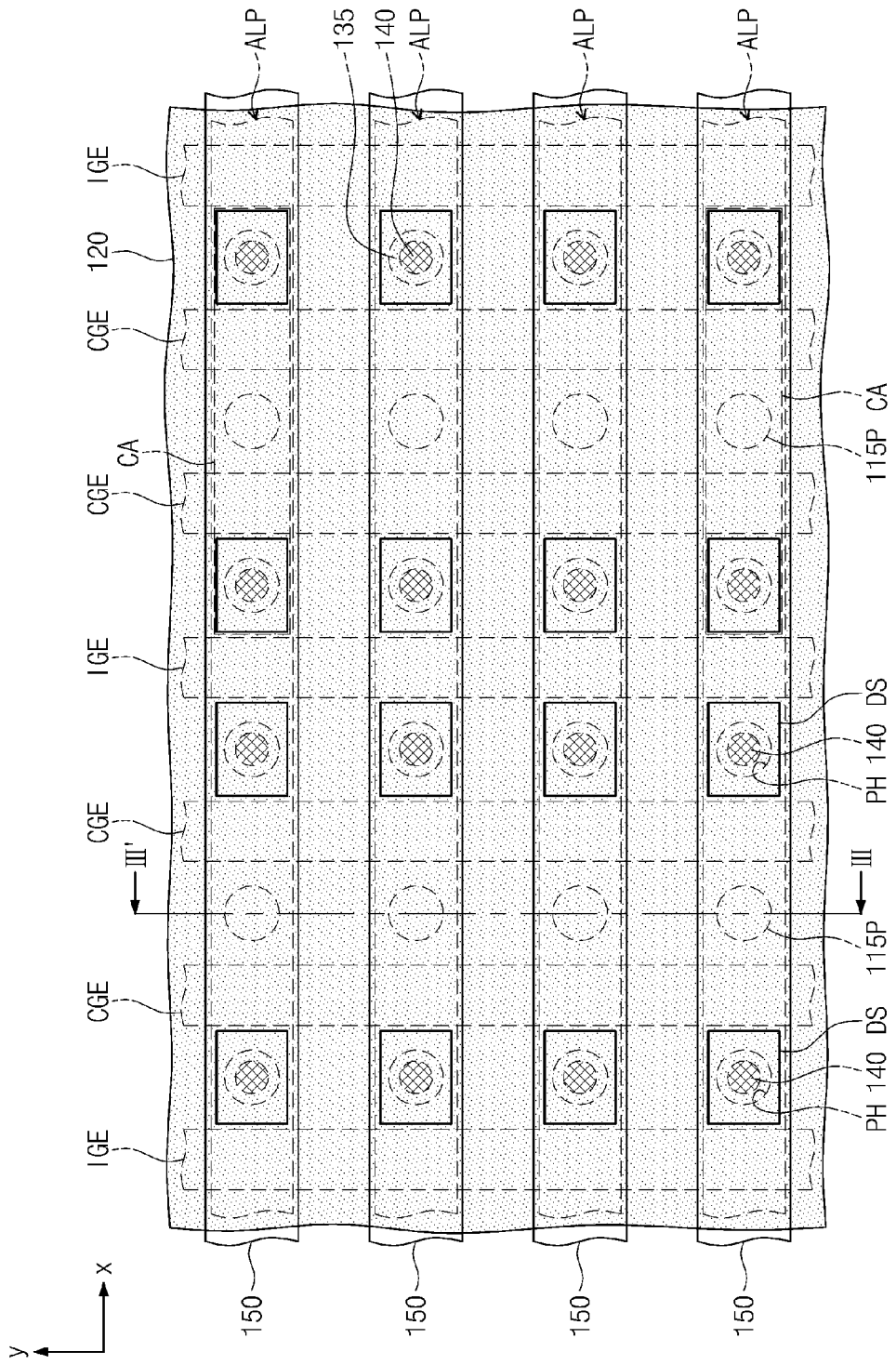
FIG. 5A is a plan view illustrating another modified embodiment of a data storage device according to some exemplary embodiments.
Figure 5B:
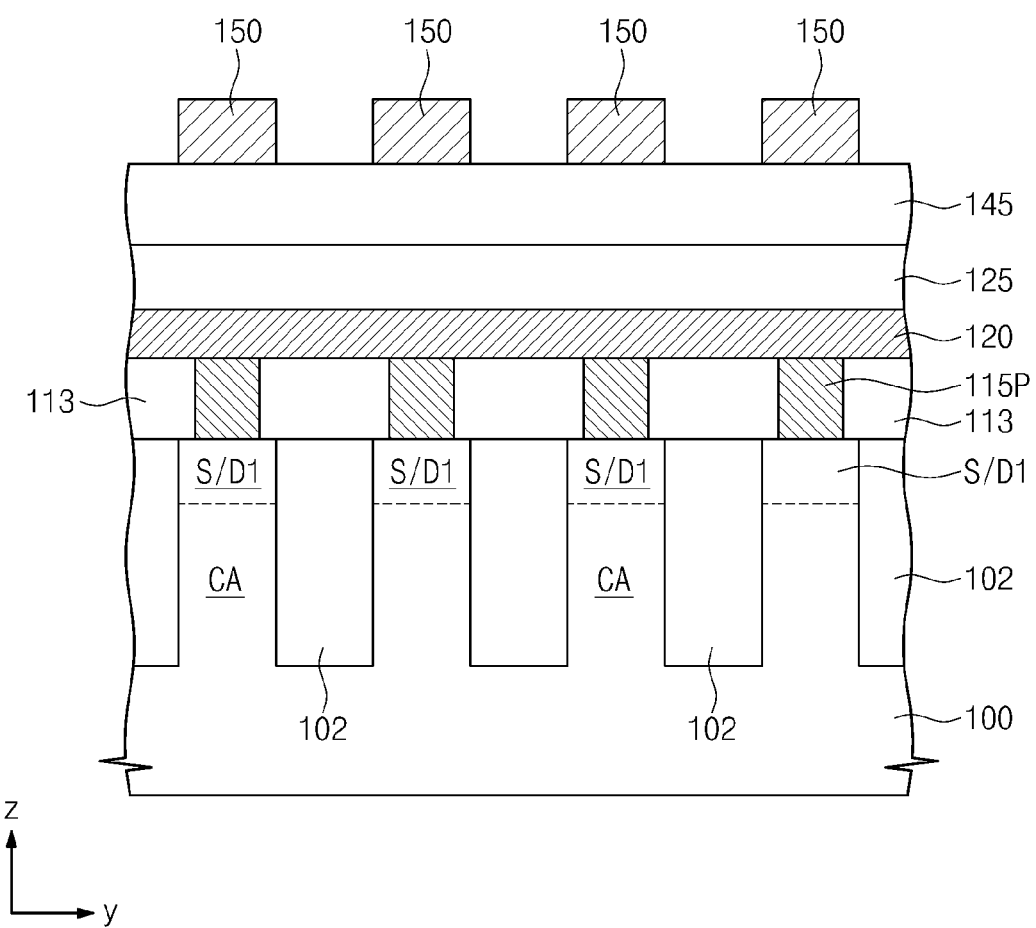
FIG. 5B is an exemplary cross-sectional view taken along a line III-III' of FIG. 5A, according to one embodiment.

FIG. 5A is a plan view illustrating another modified embodiment of a data storage device according to some example embodiments, and FIG. 5B is an exemplary cross-sectional view taken along a line III-III' of FIG. 5A.

Referring to FIGS. 5A and 5B, a plurality of conductive contact patterns, such as contact pillars 115P, may penetrate the first interlayer dielectric layer 113 and be connected to the first source/drain regions S/D1, respectively. The contact pillars 115P may be arranged along rows and columns in a plan view. Top surfaces of the contact pillars 115P may be in contact with the bottom surface of the plate conductive pattern 120, and bottom surfaces of the contact pillars 115P may be connected to the first source/drain regions S/D1, respectively. The contact pillars 115P may be formed of the same material as the contact line pattern 115L of FIGS. 1A to 1C.

FIGS. 6A to 12A are perspective views illustrating a method of manufacturing a data storage device according to some exemplary embodiments, and FIGS. 6B to 12B are exemplary cross-sectional views taken along lines IV-IV' of FIGS. 6A to 12A, respectively.

Figure 6A:
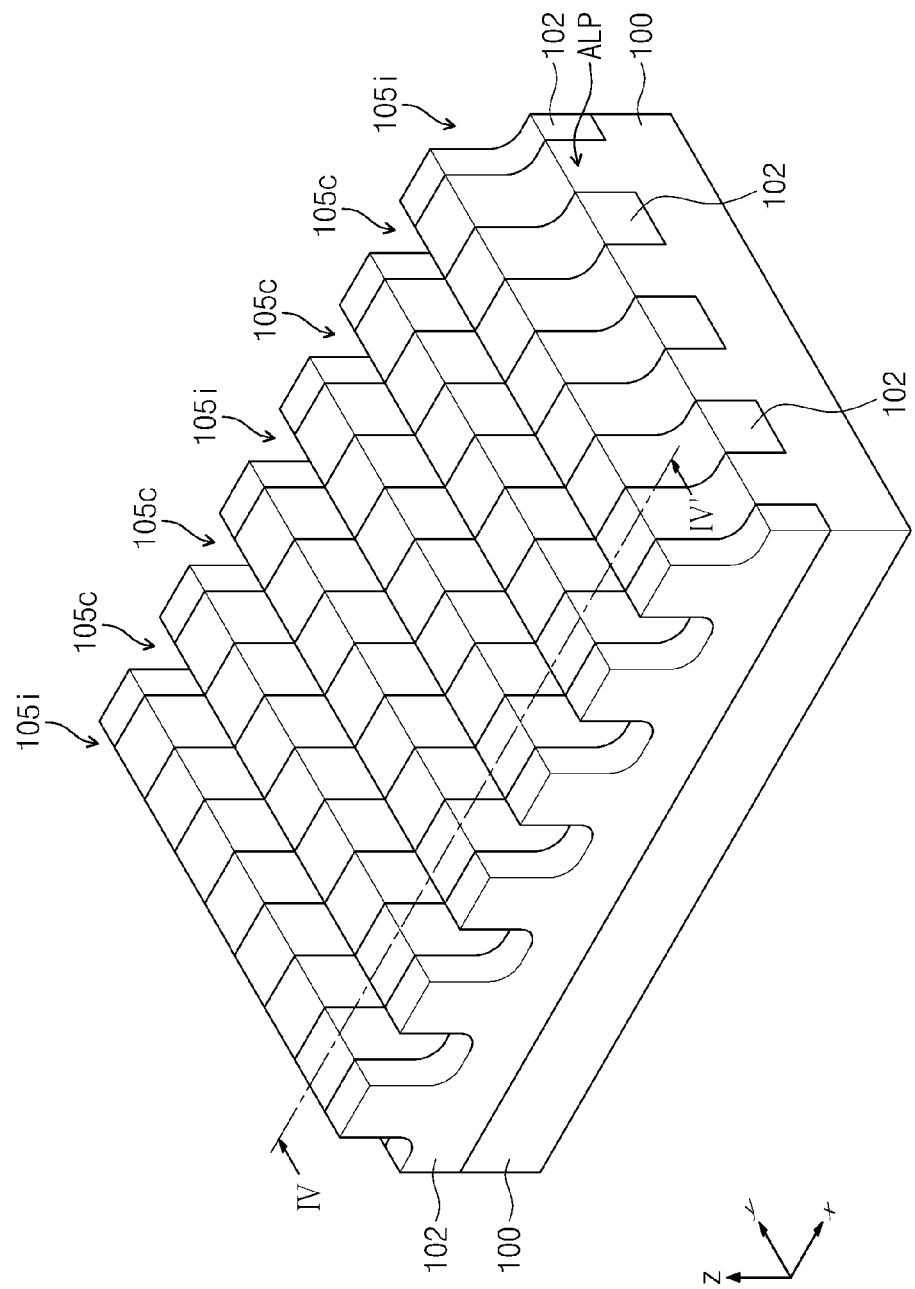
Figure 6B:
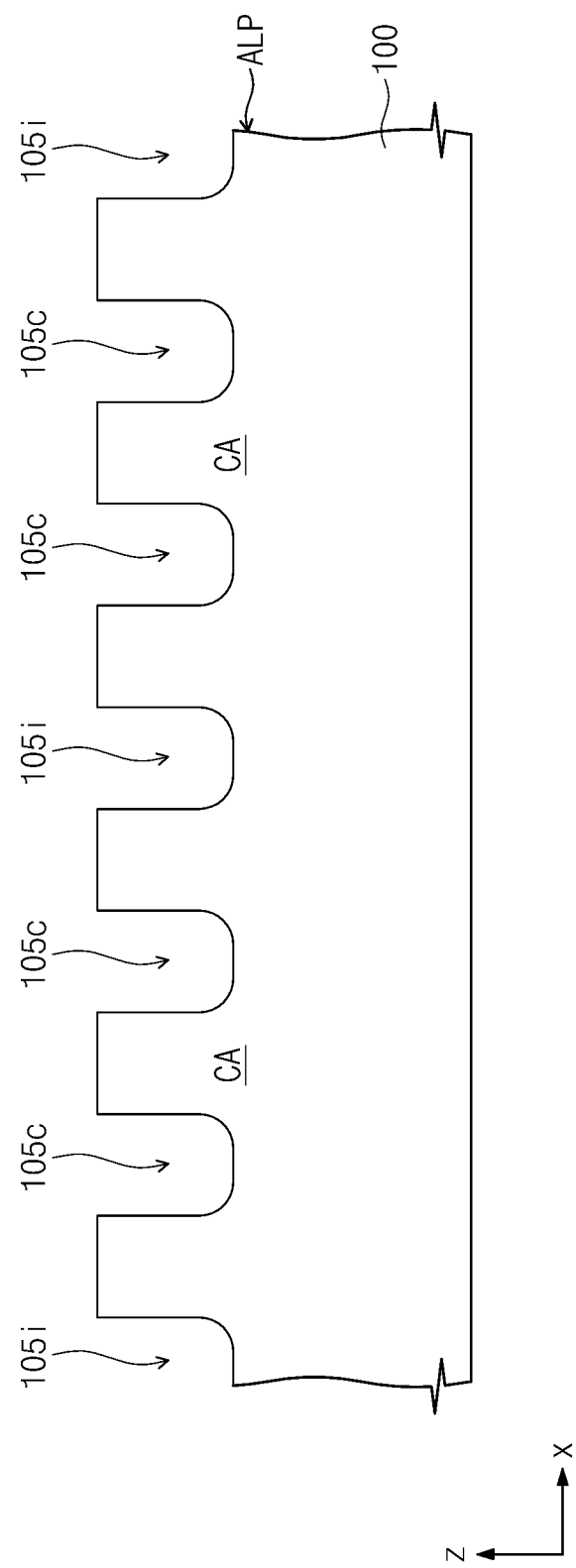

Referring to FIGS. 6A and 6B, device isolation patterns 102 may be formed in a semiconductor substrate 100 doped with dopants of a first conductivity type to define active line patterns ALP extended in one direction. The one direction may be parallel to an x-axis of FIG. 6A. The active line patterns ALP may be extended in parallel with each other by equal intervals. Trenches extended in the one direction may be formed in the substrate 100 and then the device isolation patterns 102 may be formed to fill the trenches, respectively.

Recess regions 105c and 105i may be formed to cross the active line patterns ALP and the device isolation patterns 102. The recess regions 105c and 105i may be parallel to each other. The recess regions 105c and 105i may be extended in a direction perpendicular to the one direction in a plan view. The perpendicular direction may be parallel to a y-axis of FIG. 6A. The recess regions 105c and 105i may have groove-shapes. Mask patterns (not shown) may be formed on the substrate 100 and then the active line patterns ALP and the device isolation patterns 102 may be etched using the mask patterns as etch masks, thereby forming the recess regions 105c and 105i.

The recess regions 105c and 105i may include isolation recess regions 105i and cell recess regions 105c. The isolation recess regions 105i may divide the active line patterns ALP into cell active portions CA. The cell recess regions 105c may cross the cell active portions CA. In some embodiments, a pair of the cell recess regions 105c may be formed between a pair of the isolation recess regions 105i adjacent to each other as illustrated in FIGS. 6A and 6B.

The cell recess regions 105c and the isolation recess regions 105i may be formed simultaneously. Alternatively, in other embodiments, the cell recess regions 105c may be formed after the isolation recess regions 105i are formed. In still other embodiments, the isolation recess regions 105i may be formed after the cell recess regions 105c are formed.

Figure 7A:
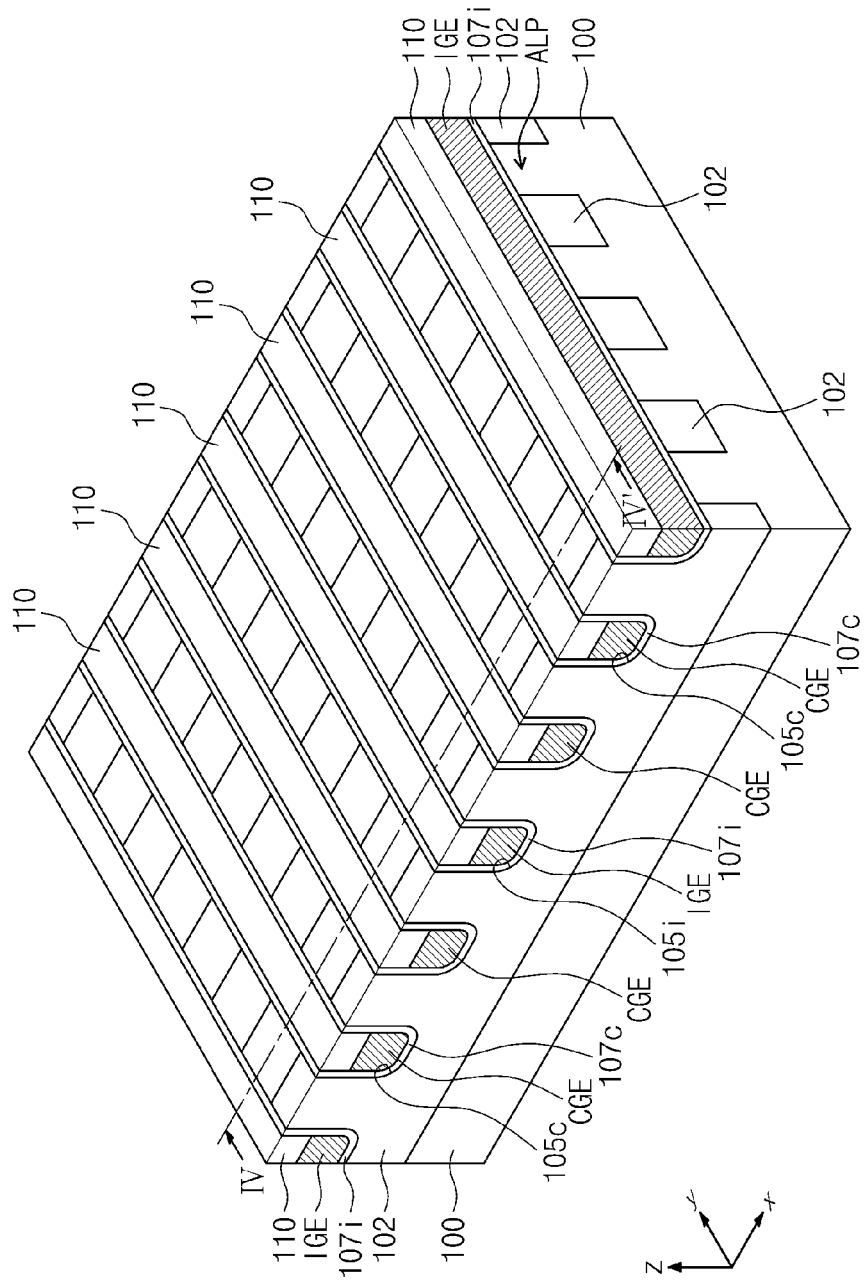
Figure 7B:
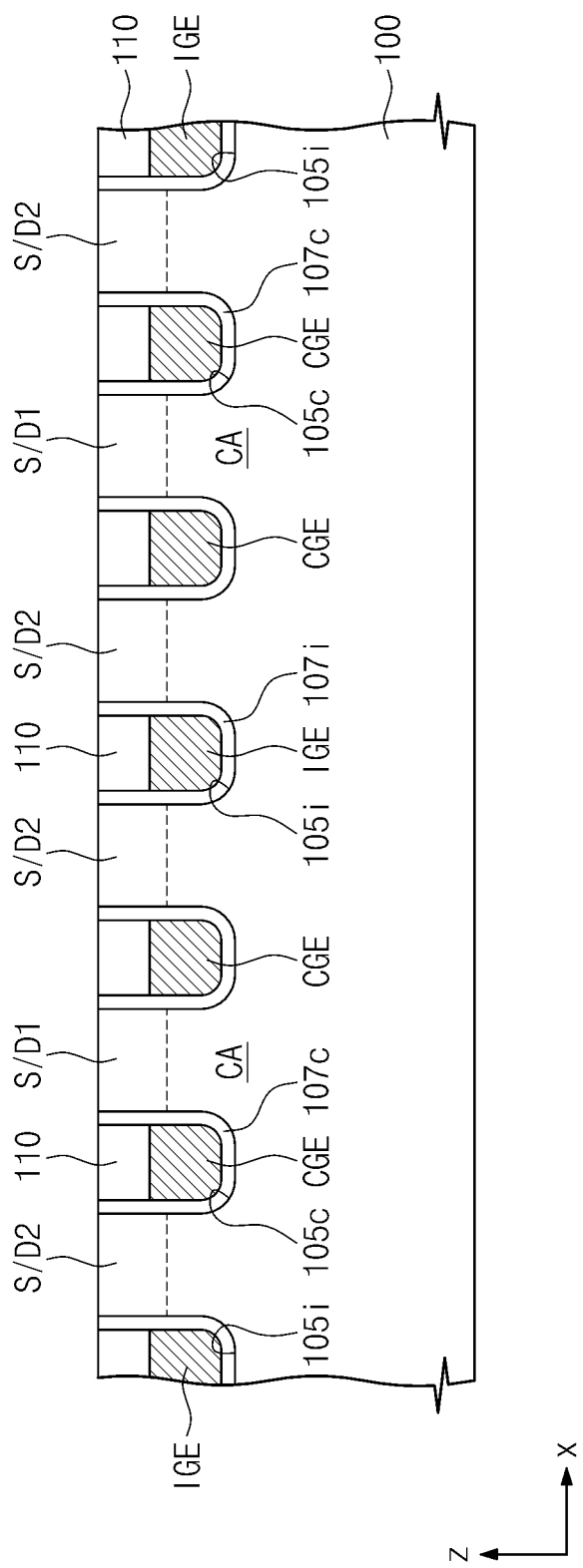

Referring to FIGS. 7A and 7B, an isolation gate dielectric layer 107i may be formed on an inner surface of the isolation recess region 105i. A cell gate dielectric layer 107c may be formed on an inner surface of the cell recess region 105c. The cell and isolation gate dielectric layer 107c and 107i may be formed simultaneously. Alternatively, in other embodiments, after the isolation gate dielectric layer 107i is formed, the cell gate dielectric layer 107c may be formed. In still embodiments, after the cell gate dielectric layer 107c is formed, the isolation gate dielectric layer 107i may be formed.

The cell gate dielectric layer 107c and/or the isolation gate dielectric layer 107i may also be formed on top surfaces of the cell active portions CA. The cell and isolation gate dielectric layers 107c and 107i may be formed by a thermal oxidation process, a chemical vapor deposition (CVD) process, and/or an atomic layer deposition (ALD) process.

A gate conductive layer filling the recess regions 105c and 105i may be formed on the substrate 100 having the cell and isolation gate dielectric layers 107c and 107i. The gate conductive layer outside the recess regions 105c and 105i may be removed to form cell gate electrodes CGE and isolation gate electrodes IGE. Top surfaces of the cell and isolation gate electrodes CGE and IGE may be recessed to be lower than the top surfaces of the substrate 100 at the cell active portions CA. An etch back process may be performed on the gate conductive layer so that the gate conductive layer outside of the recess regions 105c and 105i may be removed and then the top surfaces of the gate electrodes CGE and IGE may be recessed to be lower than the top surfaces of the cell active portions CA. Alternatively, a chemical mechanical polishing (CMP) process and a recess process may be sequentially performed to form the gate electrodes CGE and IGE having the top surfaces lower than the top surfaces of the cell active portions CA.

In one embodiment, a capping dielectric layer is formed on the substrate 100. The capping dielectric layer fills the recess regions 105c and 105i on the gate electrodes CGE and IGE. The capping dielectric layer may be planarized to form capping dielectric patterns 110 on the gate electrodes CGE and IGE, respectively. For example, the capping dielectric layer may be planarized by an etch back process and/or a CMP process.

Dopant ions of a second conductivity type may be implanted into the cell active portions CA using the capping dielectric patterns 110 as ion implantation masks. As a result, first and second source/drain regions S/D1 and S/D2 may be formed. The first source/drain region S/D1 may be formed in each of the cell active portions CA between a pair of the cell gate electrodes CGE. A pair of second source/drain regions S/D2 may be formed in both edge regions of each of the cell active portions CA, respectively. Thus, a plurality of cell selection parts may be formed at the substrate 100.

Figure 8A:
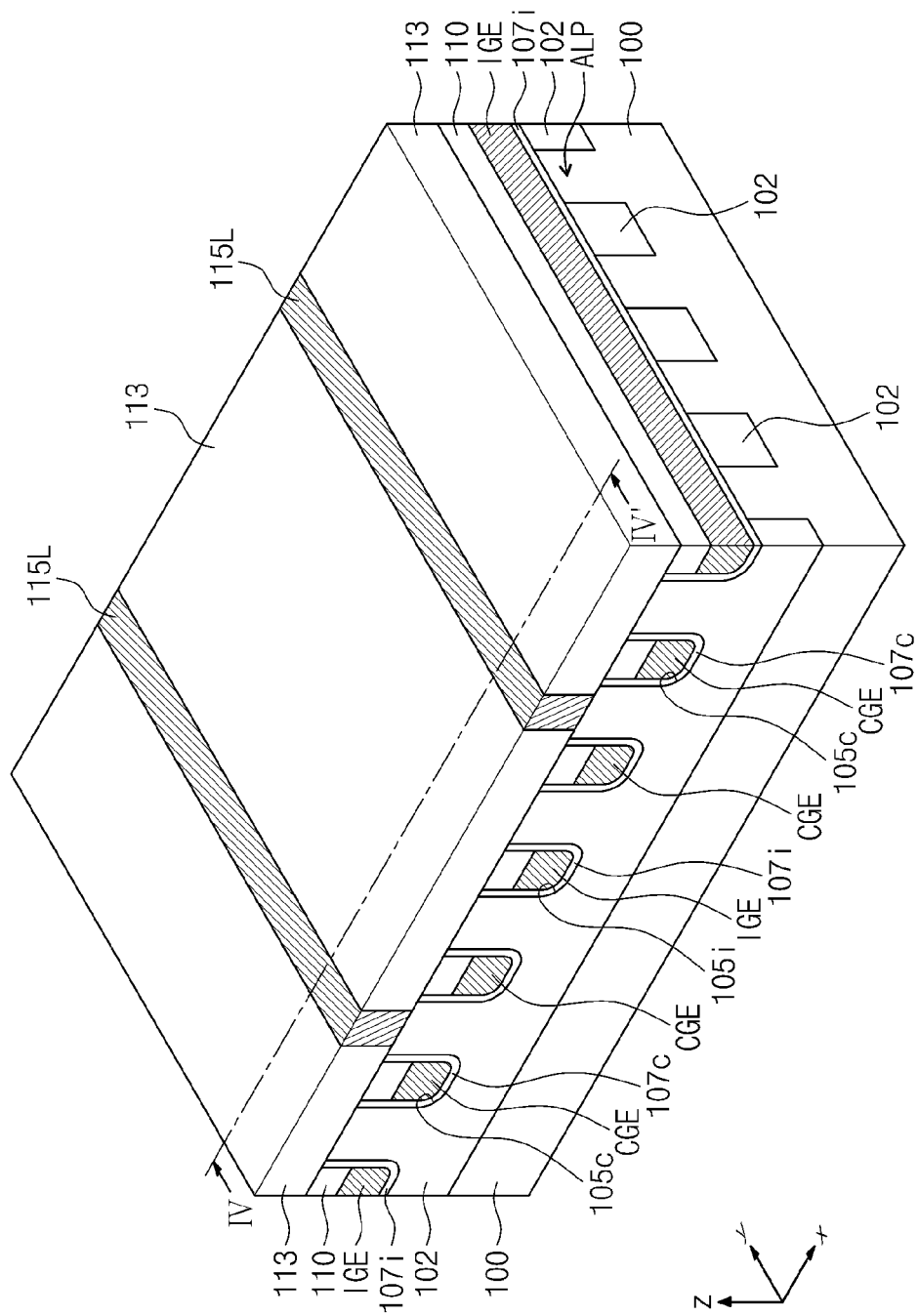
Figure 8B:
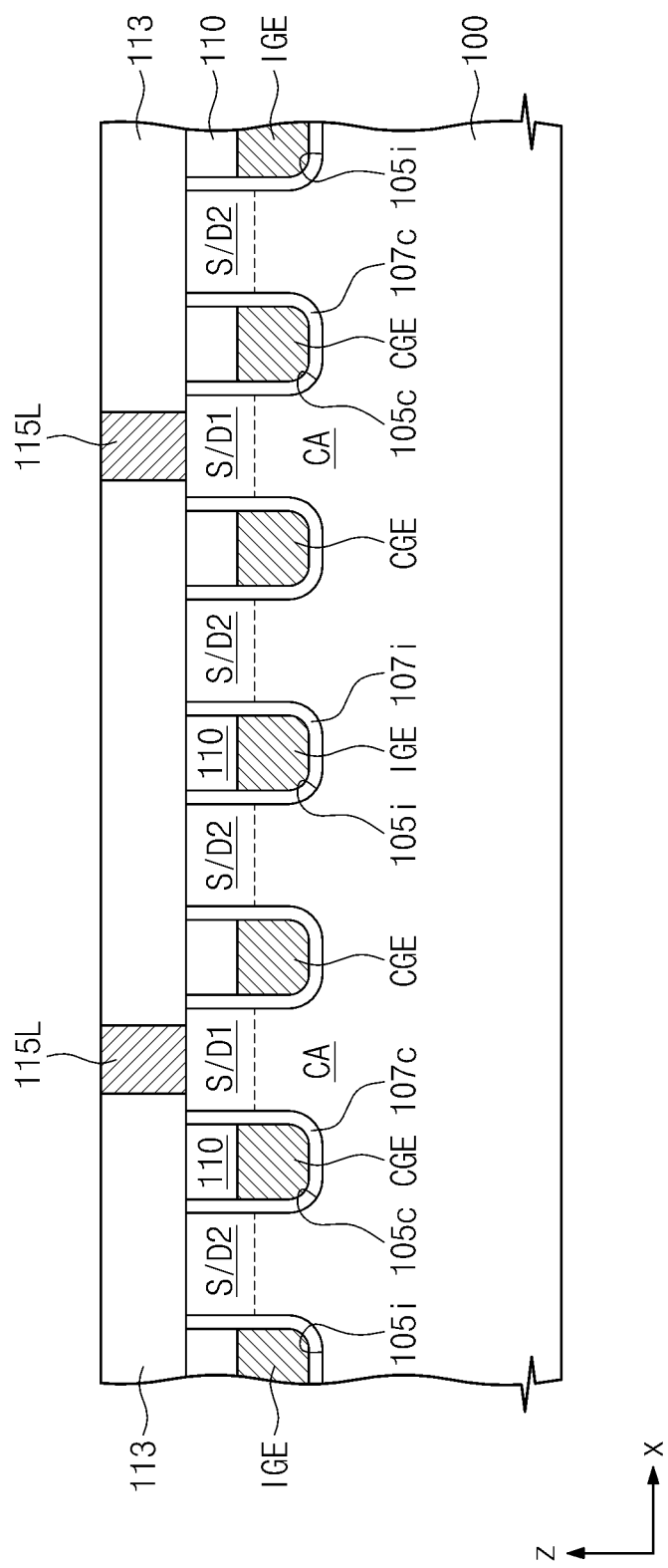

Referring to FIGS. 8A and 8B, a first interlayer dielectric layer 113 may be formed on an entire surface of the substrate 100. The first interlayer dielectric layer 113 may be patterned to form contact grooves exposing the first source/drain regions S/D1. The contact grooves may be extended to be parallel to the cell gate electrodes CGE. Each of the contact grooves may expose the source/drain regions S/D1 arranged in a direction parallel to the cell gate electrode CGE. A contact conductive layer may be formed on the substrate 100 so as to fill the contact grooves. The contact conductive layer may be planarized to form contact line patterns 115L respectively filling the contact grooves.

Figure 9A:
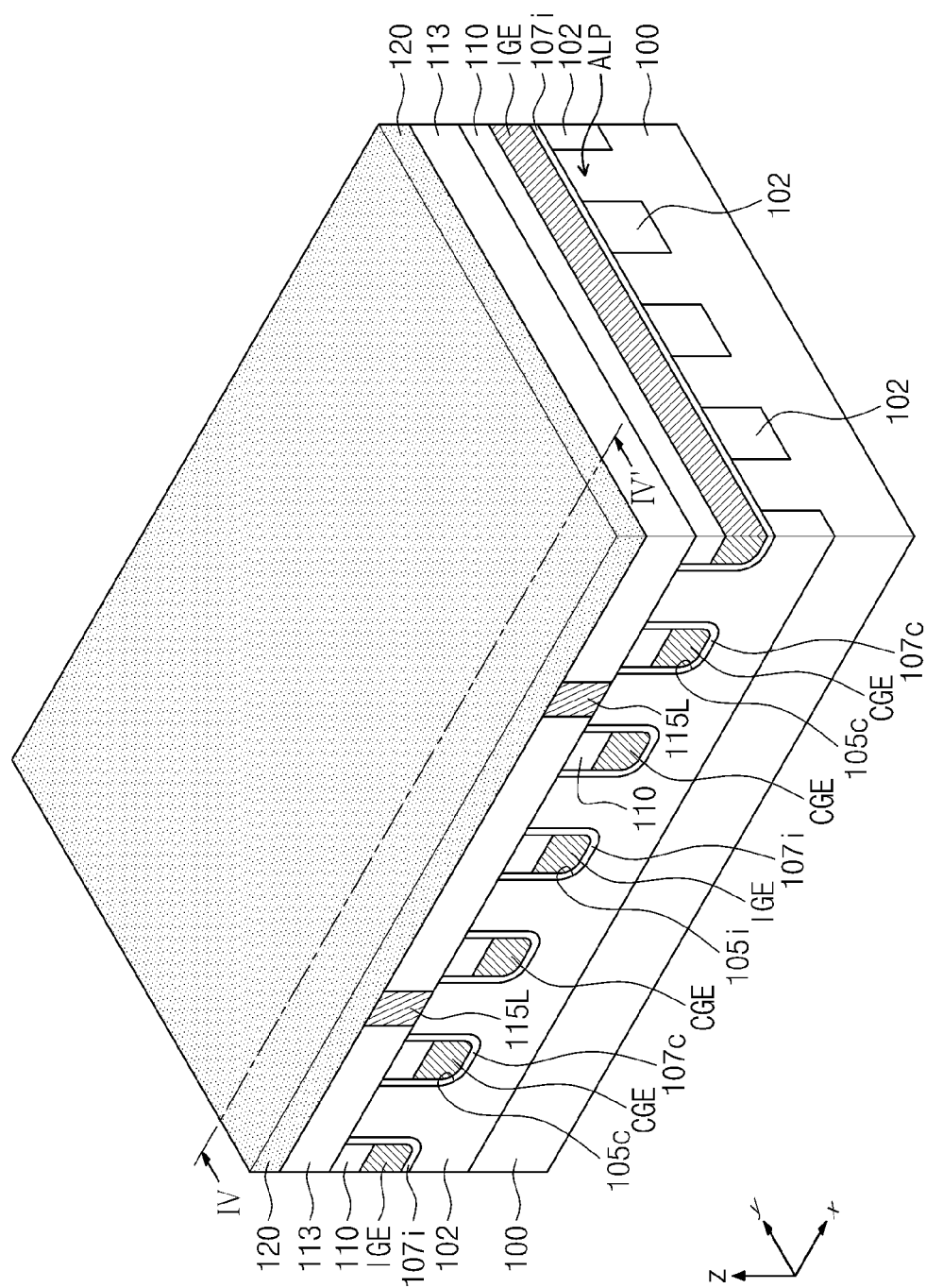
Figure 9B:
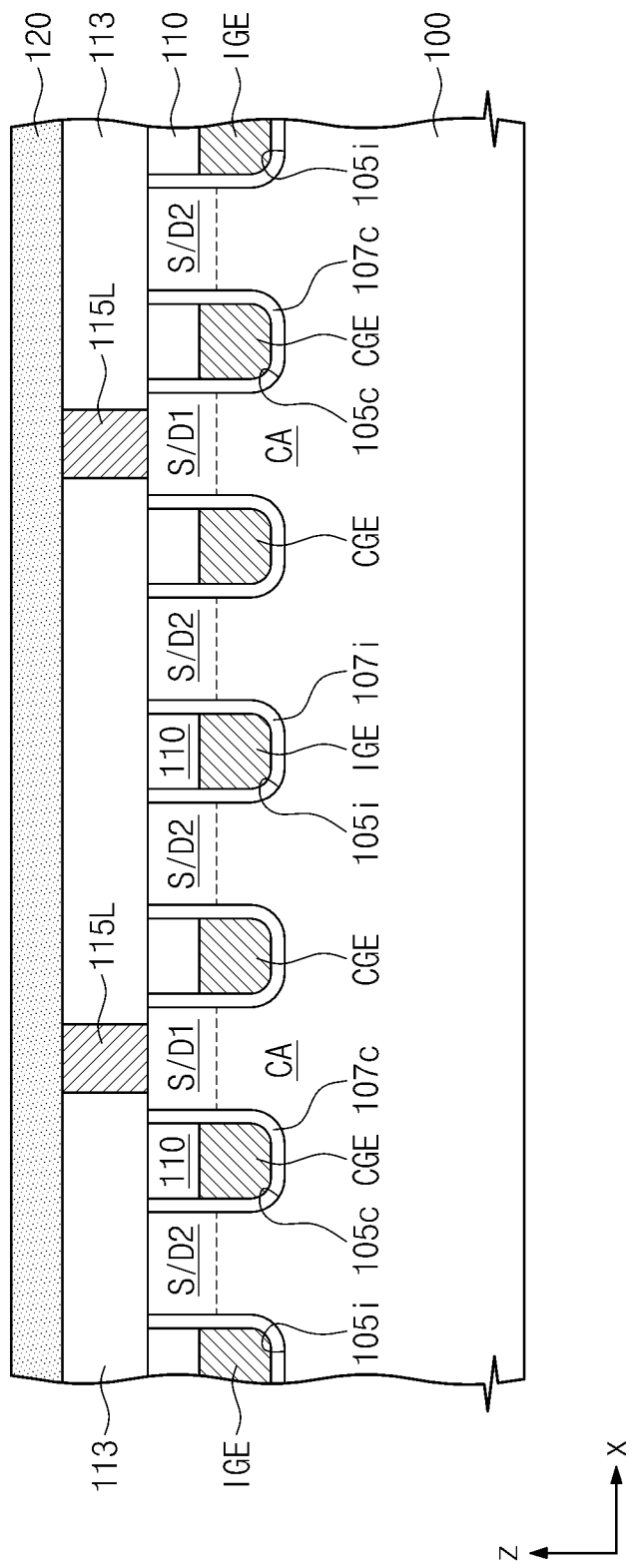

Referring to FIGS. 9A and 9B, a plate conductive pattern 120 covering the cell selection parts may be formed on the first interlayer dielectric layer 113. The plate conductive pattern 120 may include, for example, a layer of conductive material. The plate conductive pattern 120 may be formed in a cell array region of a data storage device. For example, in one embodiment, the plate conductive pattern 120 is not formed in a peripheral circuit region of the data storage device. The plate conductive pattern may cover an entire cell array region of a data storage device. A plate conductive layer may be formed on the first interlayer dielectric layer 113 and then the plate conductive layer may be patterned to form the plate conductive pattern 120. The plate conductive pattern 120 may be in contact with the contact line patterns 115L and be electrically connected to the first source/drain regions S/D1. In one embodiment, the plate conductive pattern 120 covers an entire continuous portion of the first interlayer dielectric layer 113 and the first and second source/drain regions.

Figure 10A:
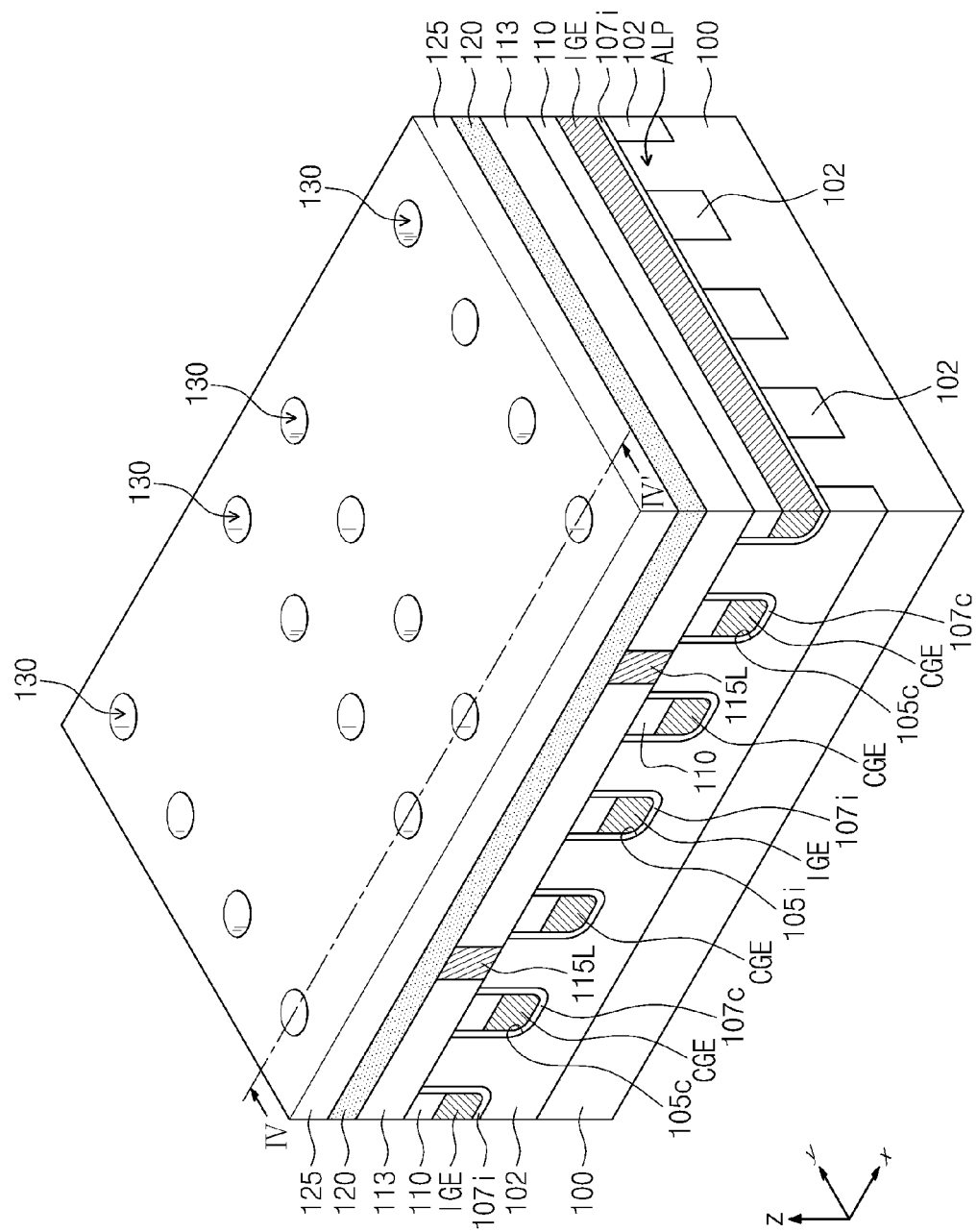
Figure 10B:
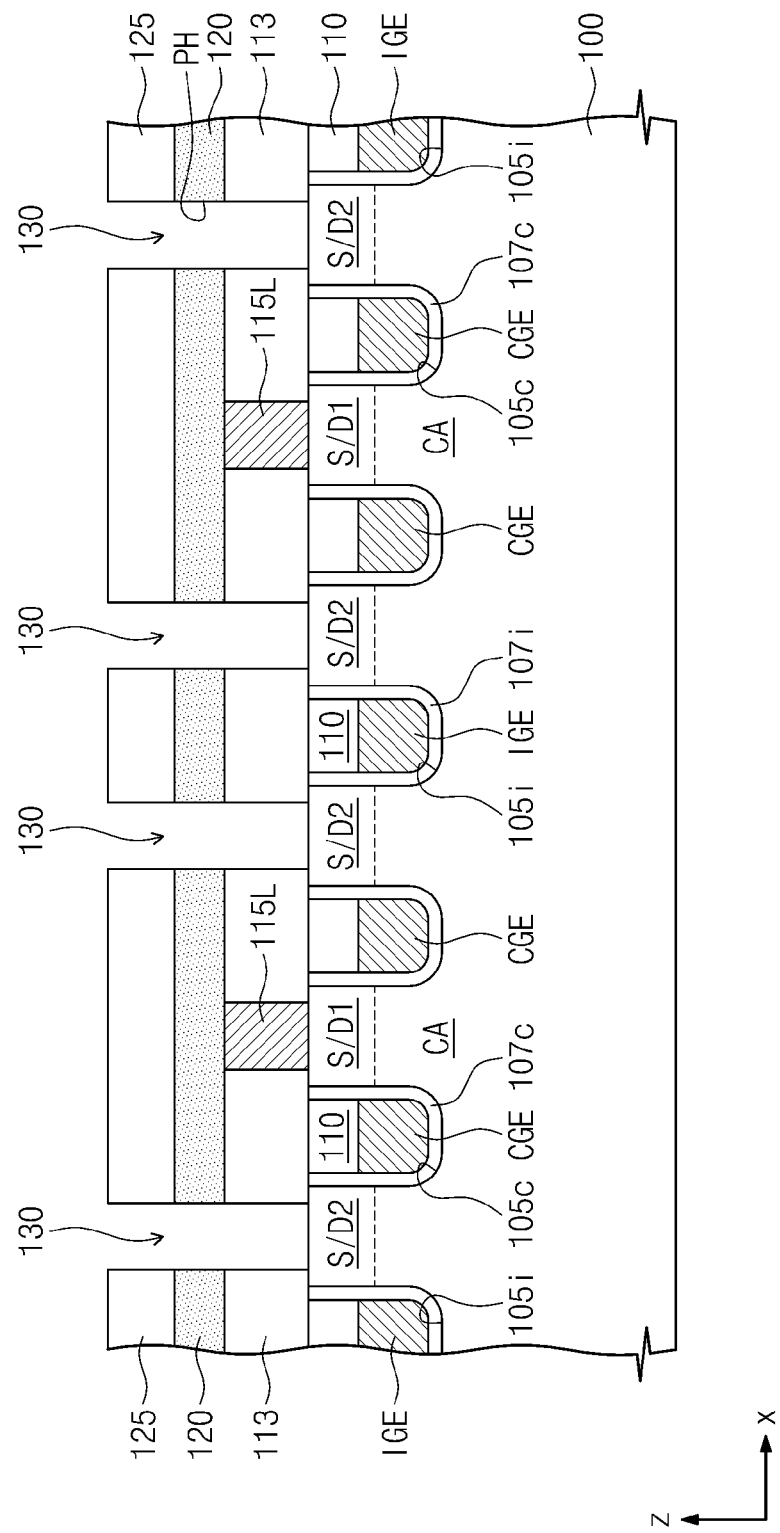

Referring to FIGS. 10A and 10B, in one embodiment, a second interlayer dielectric layer 125 is formed on the substrate 100 having the plate conductive pattern 120. Subsequently, the second interlayer dielectric layer 125, the plate conductive pattern 120, and the first interlayer dielectric layer 113 may be successively patterned to form a plurality of through-holes 130. In some embodiments, the through-holes 130 may expose the second source/drain regions S/D2, respectively. Plate-holes PH may be formed in the plate conductive pattern 120 by forming the through-holes 130. The plate-hole PH corresponds to a region of the through-hole 130 that is formed in the plate conductive pattern 120.

Figure 11A:
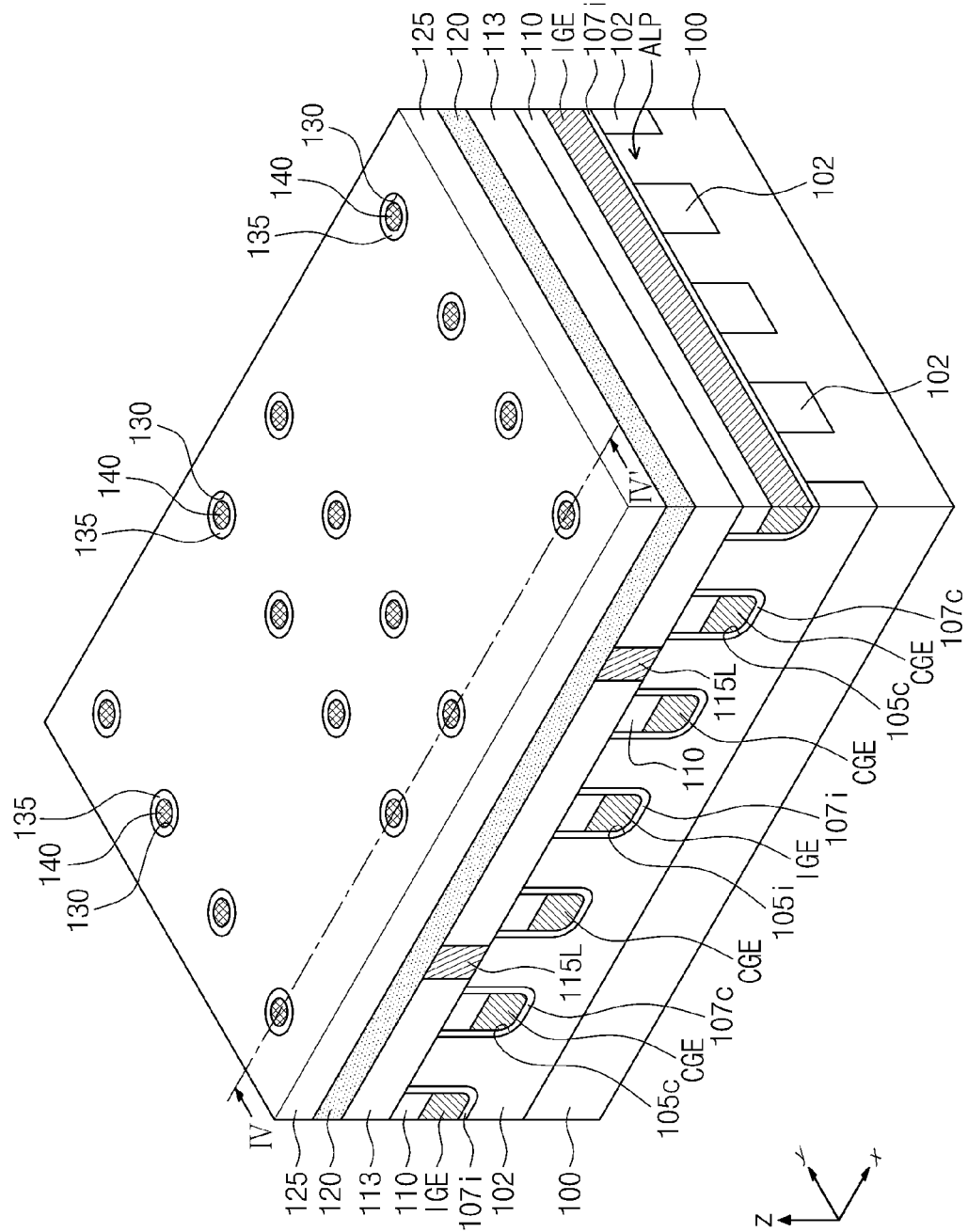
Figure 11B:
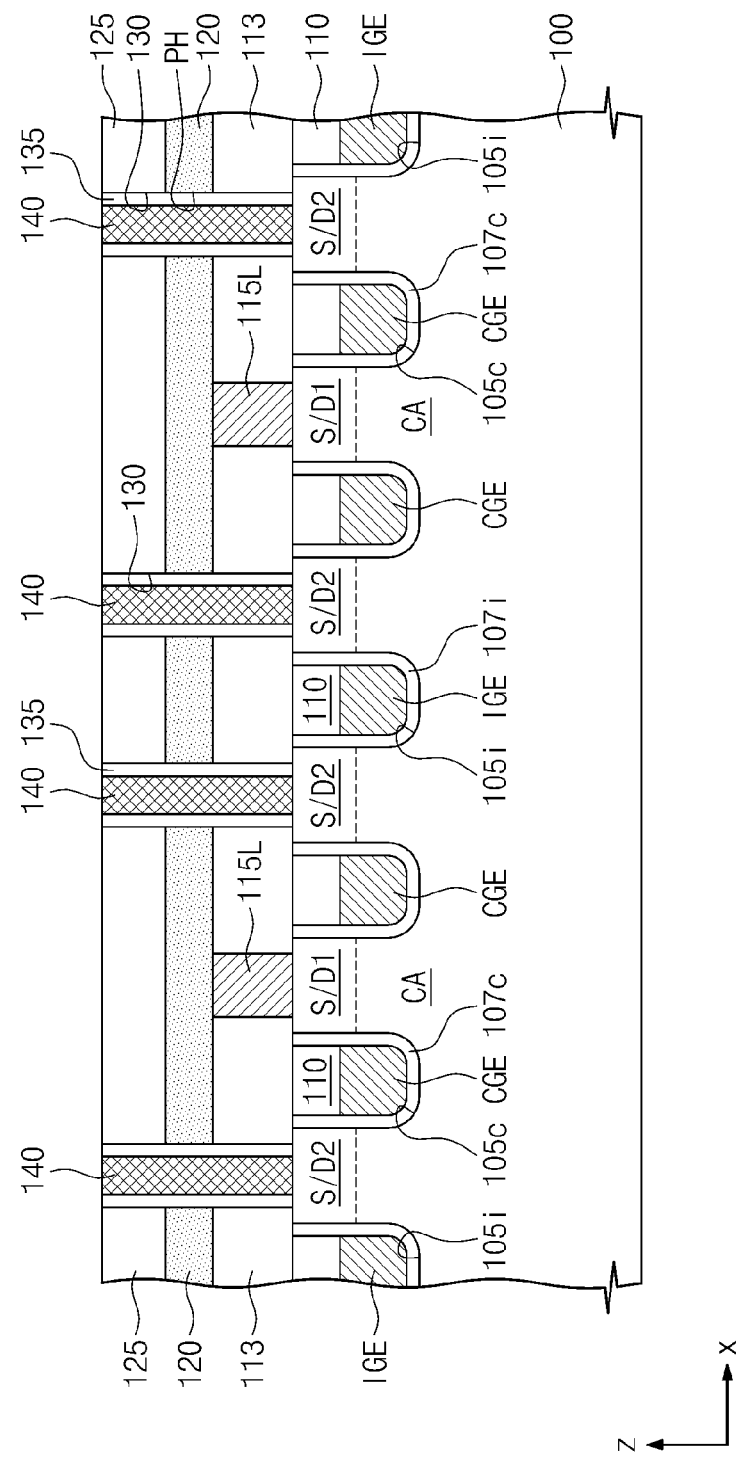

Referring to FIGS. 11A and 11B, in one embodiment, an insulating layer is conformally formed on the substrate 100 having the through-holes 130. The insulating layer may be planarized until bottom surfaces of the through-holes 130 are exposed, thereby forming insulating spacers 135. Each of the insulating spacers 135 may be formed on an inner sidewall of each of the through-holes 130. Each of the insulating spacers 135 may be substantially formed on an entire inner sidewall of each of the through-holes 130.

In one embodiment, a conductive layer is formed on the substrate 100 having the insulating spacers 135. The conductive layer may fill the through-holes 130. The conductive layer may be planarized to form through-pillars 140 in the through-holes 130, respectively. Each of the through-pillars 140 may be connected to the second source/drain region S/D2 exposed by each of the through-holes 130. The through-pillars 140 are insulated from the plate conductive pattern 120 due to the insulating spacers 135.

Figure 12A:
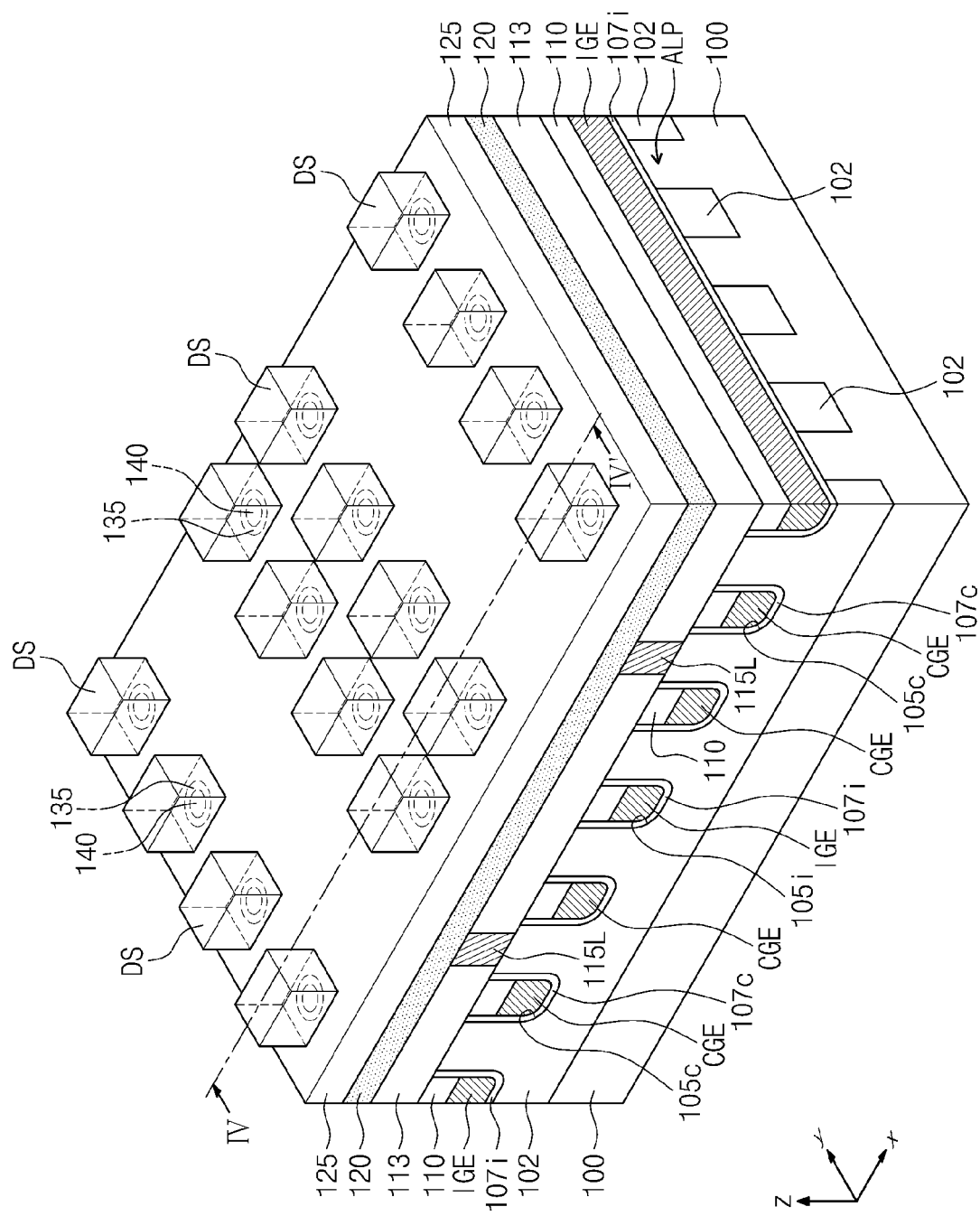
Figure 12B:
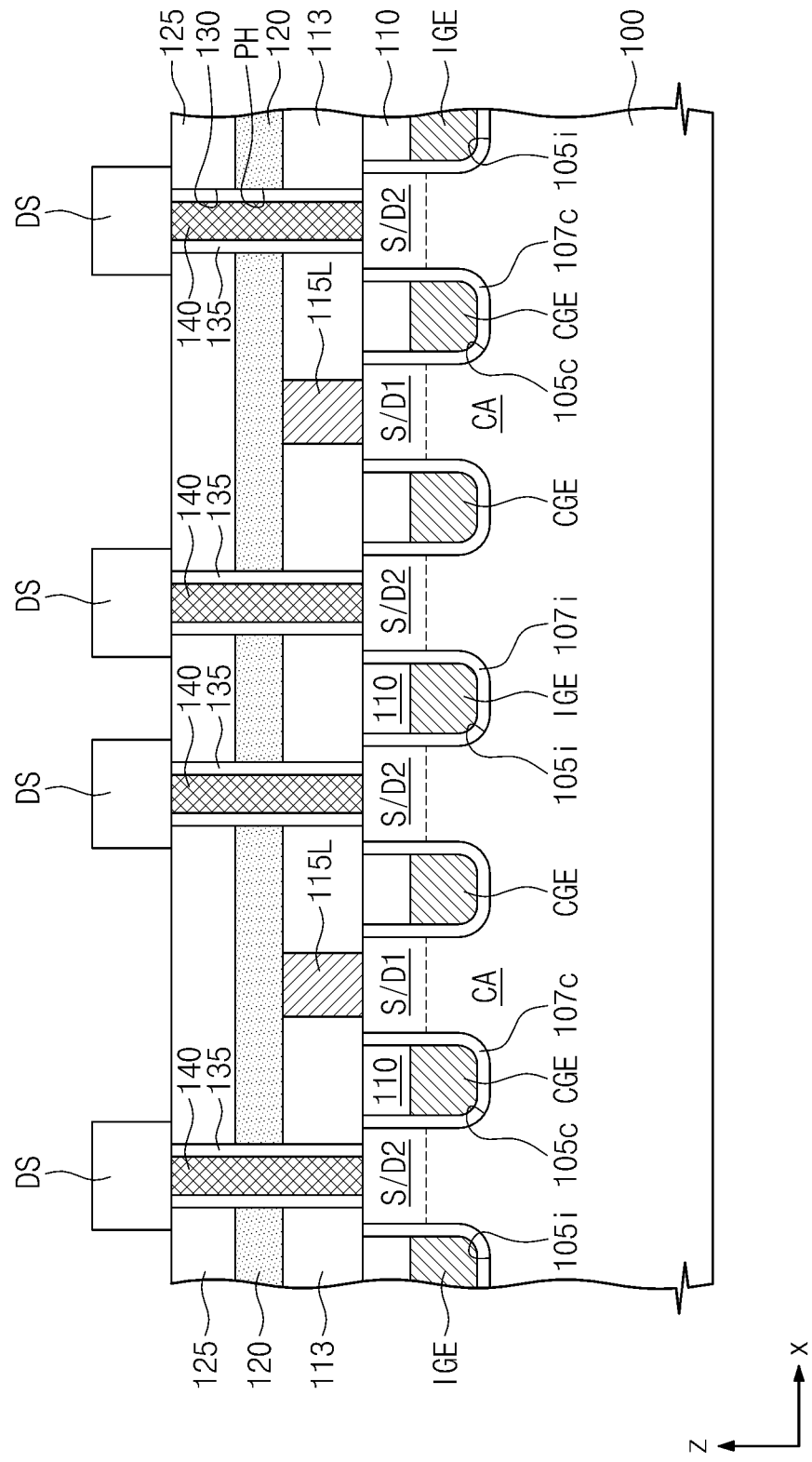

Referring to FIGS. 12A and 12B, a plurality of data storage parts DS are formed on the second interlayer dielectric layer 125. In the embodiment shown, the data storage parts DS are directly connected to the through-pillars 140, respectively. Bottom surfaces of the data storage parts DS may be in contact with top surfaces of the through-pillars 140, respectively. After a data storage layer may be formed on the second interlayer dielectric layer 125, the data storage layer may be patterned to form the data storage parts DS. The data storage parts DS may be arranged along rows and columns. The rows may be parallel to an x-axis and the columns may be parallel to a y-axis.

Referring to FIGS. 1A to 1C again, subsequently, a third interlayer dielectric layer 145 may be formed on the entire surface of the substrate 100. In some embodiments, the third interlayer dielectric layer 145 may be planarized until the data storage parts DS are exposed. Subsequently, bit lines 150 may be formed on the third interlayer dielectric layer 145. Thus, the data storage device illustrated in FIGS. 1A to 1C and 2 may be realized.

Alternatively, after the third interlayer dielectric layer 145 is formed, the data storage parts DS may not be exposed. In this case, contact plugs may be formed to penetrate the third interlayer dielectric layer 145. The contact plugs may be connected to the data storage parts DS, respectively. Subsequently, the bit lines 150 may be formed to be connected to the contact plugs.

According to the method of manufacturing the data storage device described above, it is possible to obtain the effects and/or advantages of the data storage device described with reference to FIGS. 1A to 1C and 2. Additionally, the second interlayer dielectric layer 125, the plate conductive pattern 120, and the first interlayer dielectric layer 113 may be successively patterned to form the through-holes 130 and then the through-pillars 140 may be formed in the through-holes 130, respectively. Thus, the plate-holes PH may be formed to be aligned with the through-holes 130. As a result, it is possible to minimize sizes of the plate-holes PH that the through-pillars 140 pass through, such that a planar area of the plate conductive pattern 120 may be maximized.

Figure 13:
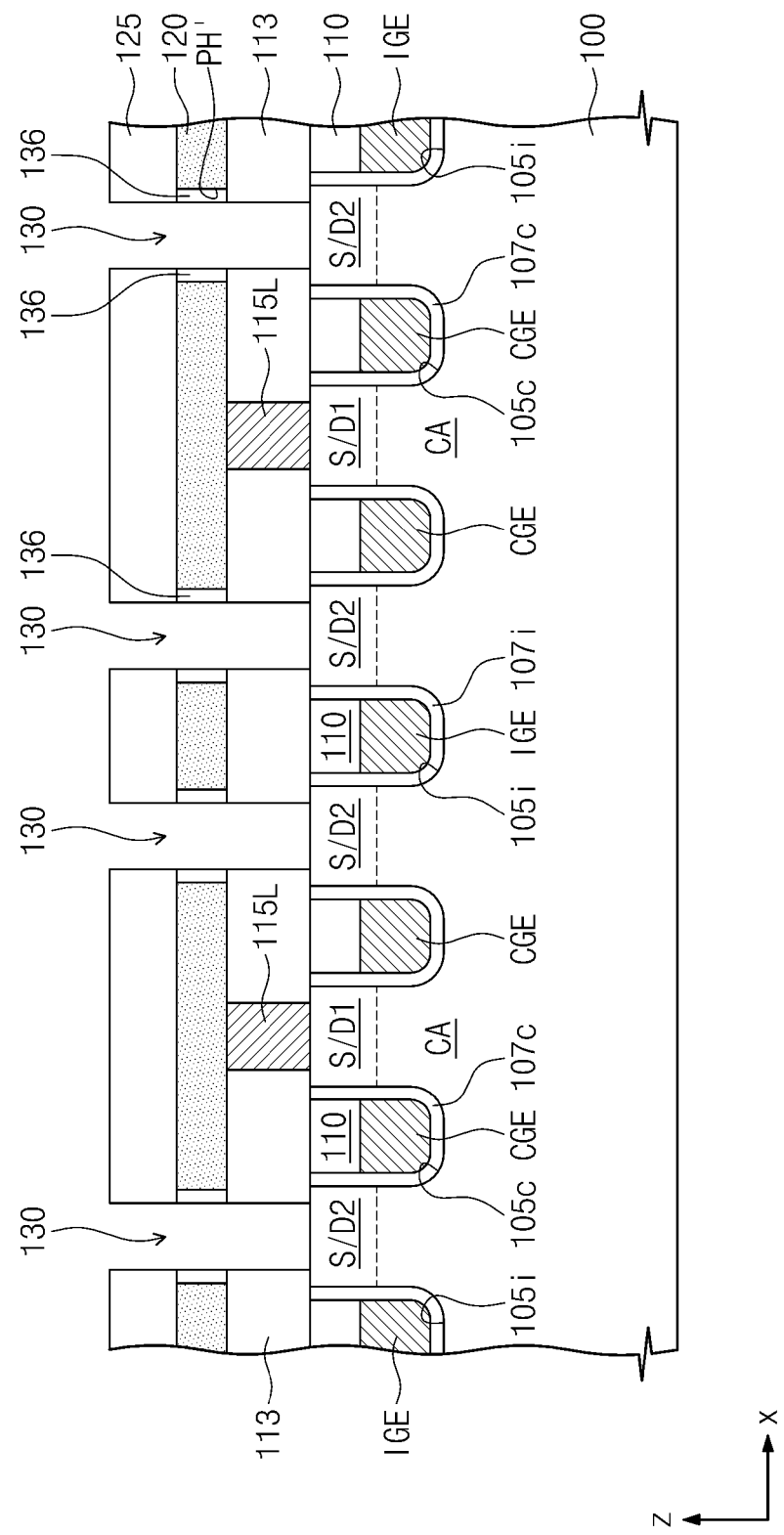
FIG. 13 is a cross-sectional view illustrating a modified embodiment of a method of manufacturing a data storage device according to some exemplary embodiments.

Next, an exemplary method of manufacturing the data storage device of FIG. 4 will be described. FIG. 13 is a cross-sectional view illustrating a modified embodiment of a method of manufacturing a data storage device according to some exemplary embodiments.

Referring to FIGS. 10B and 13, after the through-holes 130 are formed, a treatment process may be performed on the plate conductive pattern 120 exposed by the inner sidewalls of the through-holes 130. The treatment process may include at least one of an oxidation process and a nitridation process. Thus, the insulators 136 illustrated in FIG. 13 may be formed. The plate conductive pattern 120, which is exposed by the inner sidewalls of the through-holes 130, may be oxidized and/or nitrided by the treatment process, thereby forming the insulators 136. Due to the treatment process, the insulator 136 may be confinedly formed on a portion of the inner sidewall of the through-hole 130 which is formed of the plate conductive pattern 120. Since the insulator 136 is formed by the treatment process, a plate-hole PH' of the plate conductive pattern 120 may have a width greater than a width of a portion of the through-hole 130 which is formed in the second interlayer dielectric layer 125.

In some embodiments, due to the treatment process, bottom surfaces of the through-holes 130 may be oxidized and/or nitrided to generate by-products (e.g. oxide and/or nitride). In this case, after the treatment process is performed, an anisotropic etching process may be performed to remove the by-products (e.g. oxide and/or nitride) on the bottom surfaces of the through-holes 130. Since the by-products on the bottom surfaces of the through-holes 130 are removed by the anisotropic etching process, the insulators 136 may remain and the second source/drain regions S/D2 may be exposed.

Subsequently, the through-pillars 140 of FIG. 4 may be formed to fill the through-holes 130, respectively. Next, the subsequent processes described with reference to FIGS. 12A, 12B, 1A, 1B, 1C, and 2 may be performed. As a result, the data storage device illustrated in FIG. 4 may be realized.

In other embodiments, the insulating spacers 135 described with reference to FIGS. 11A and 11B may be formed after forming the insulators 136 and before forming the through-pillars 140 of FIG. 4.

Figure 14:
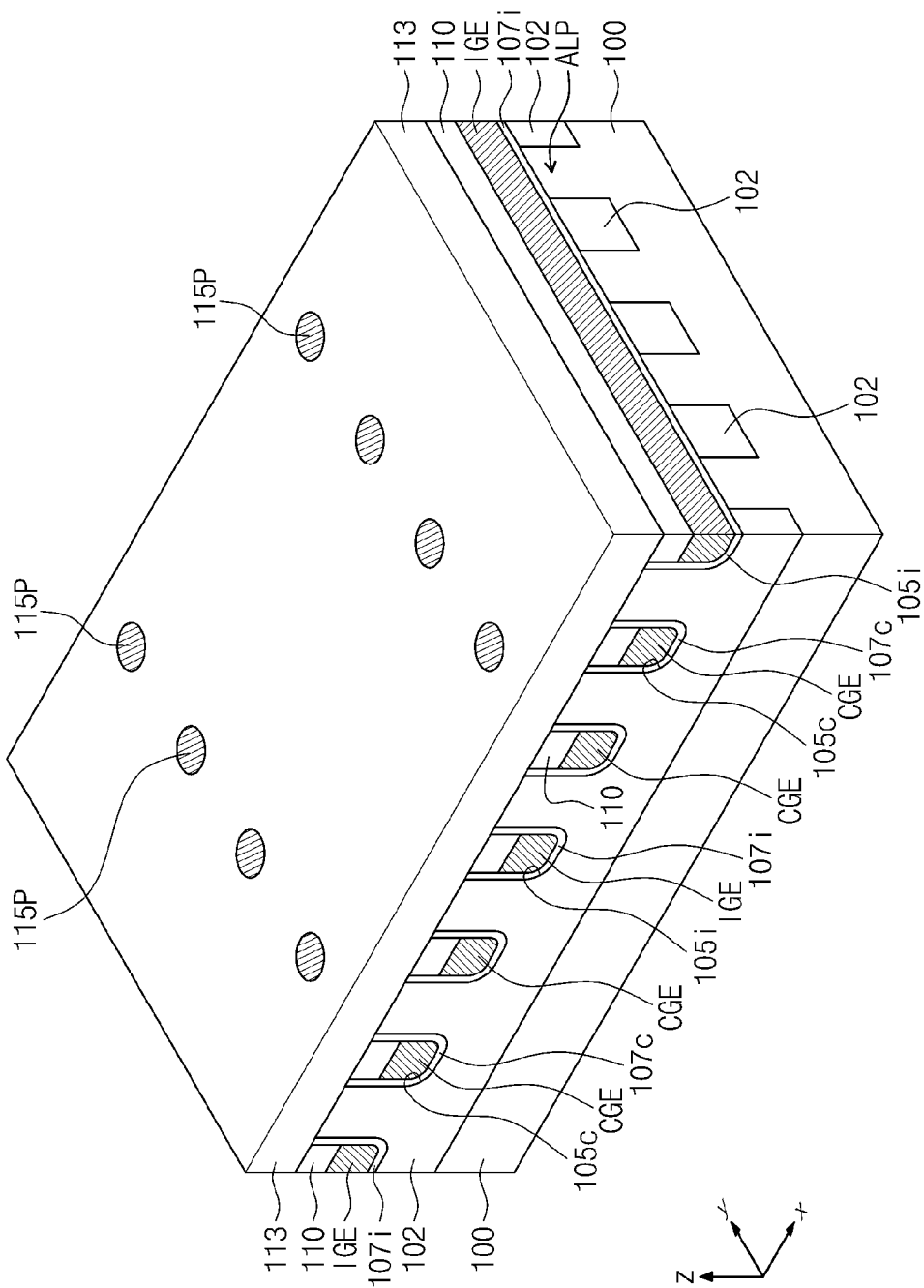
FIG. 14 is a perspective view illustrating another modified embodiment of a method of manufacturing a data storage device according to some exemplary embodiments.

Next, a method of manufacturing the data storage device of FIGS. 5A and 5B will be described. FIG. 14 is a perspective view illustrating another modified embodiment of a method of manufacturing a data storage device according to some exemplary embodiments.

Referring to FIGS. 7A and 14, the first interlayer dielectric layer 113 may be formed on the substrate 100 having the cell selection parts and then contact pillars 115P may be formed to penetrate the first interlayer dielectric layer 113. The contact pillars 115P may be connected to the first source/drain regions S/D1, respectively. Next, the subsequent processes described with reference to FIGS. 9A to 12A, 9B to 12B, 1A to 1C, and 2 may be performed to realize the data storage device of FIGS. 5A and 5B. The manufacturing method described with reference to FIG. 14 may also be applied to the manufacturing method described with reference to FIG. 13.

Second Embodiment

In another embodiment, the same elements as described in the first embodiment will be indicated by the same reference numerals or the same reference designators. For the purpose of ease and convenience in explanation, the descriptions to the same elements as in the first embodiment will be omitted or mentioned briefly. Differences between the second embodiment and the first embodiment will be mainly described hereinafter.

Figure 15A:
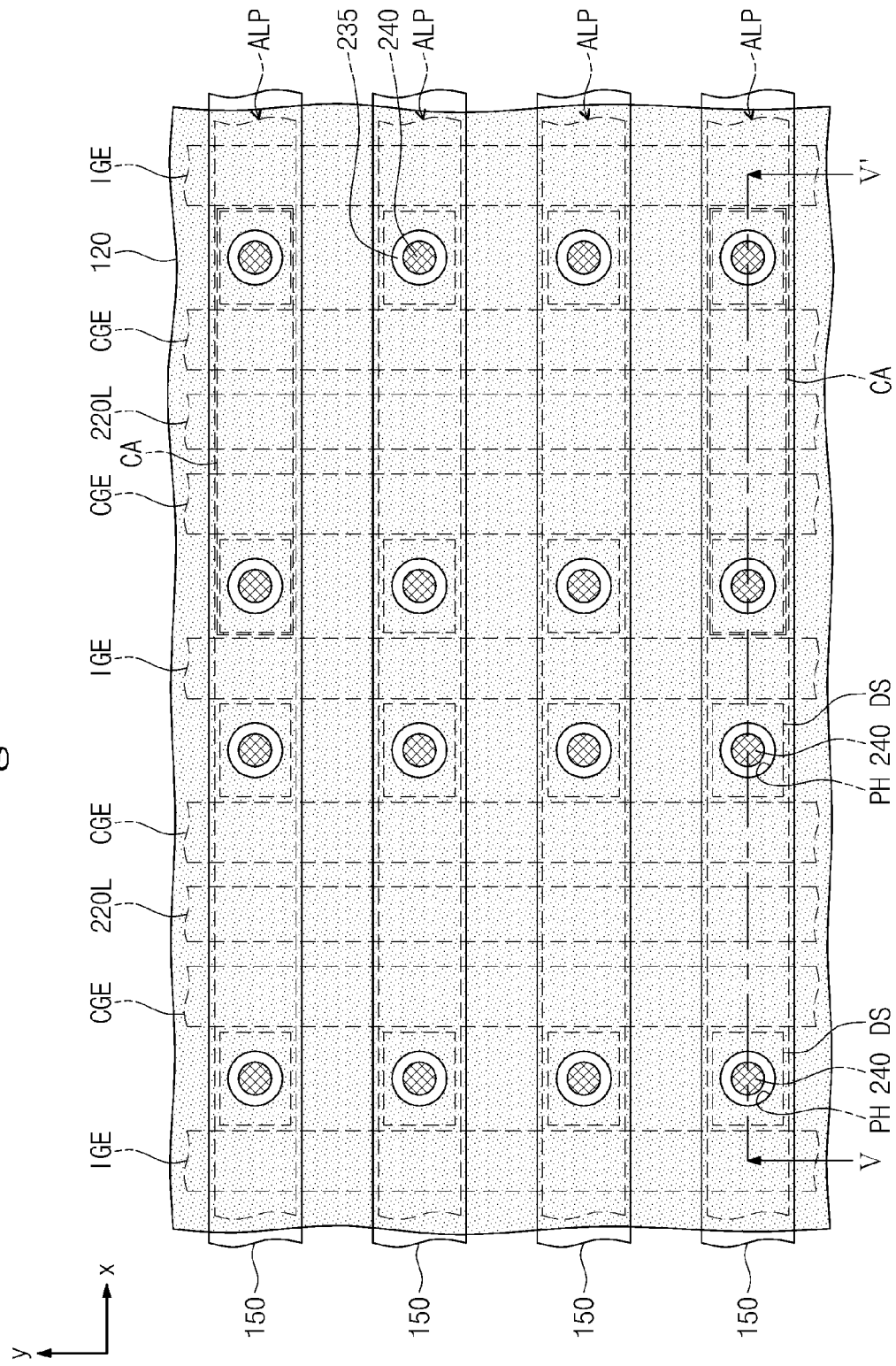
FIG. 15A is a plan view illustrating a data storage device according to other exemplary embodiments.
Figure 15B:
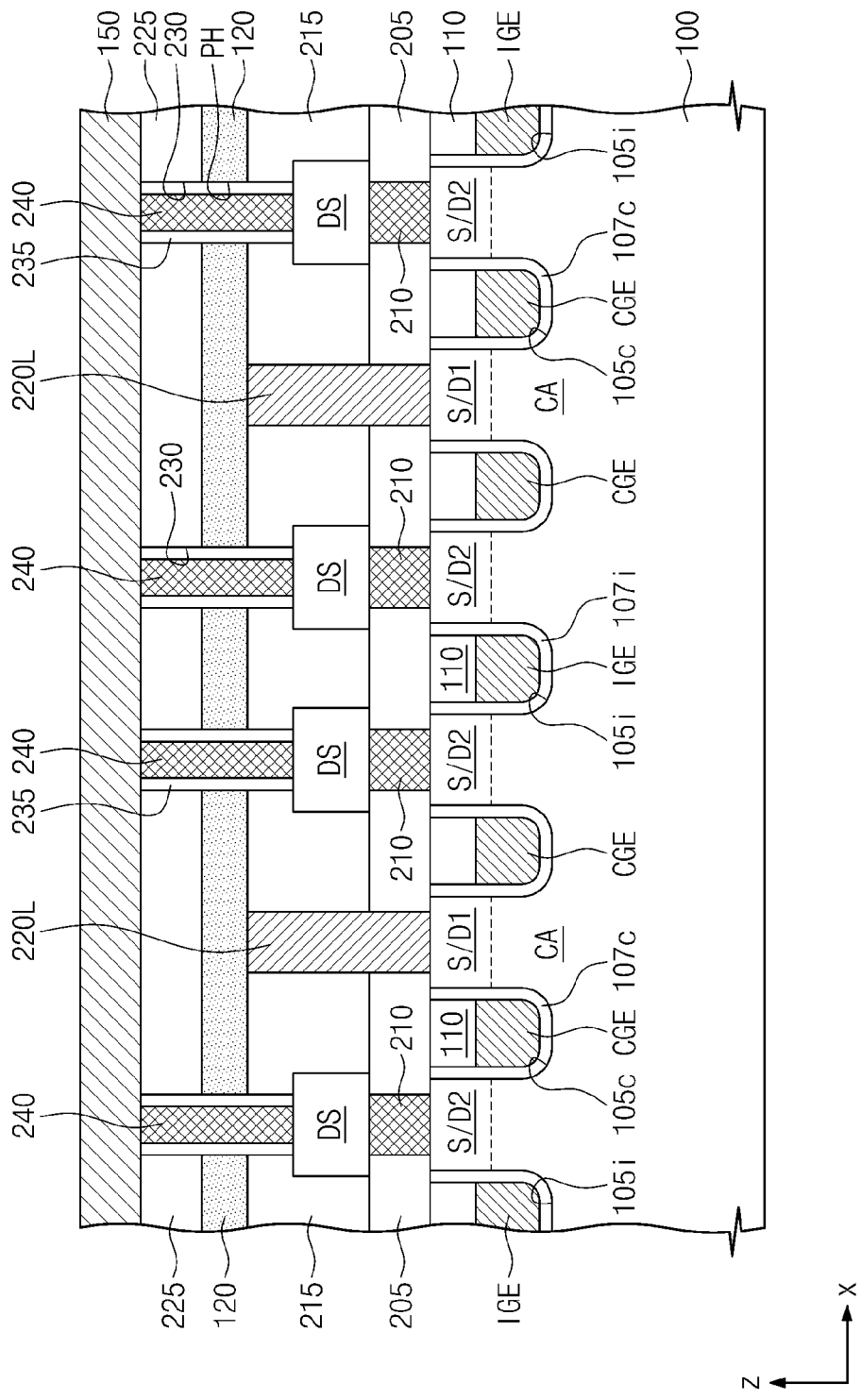
FIG. 15B is an exemplary cross-sectional view taken along a line V-V' of FIG. 15A, according to one embodiment.
Figure 16:
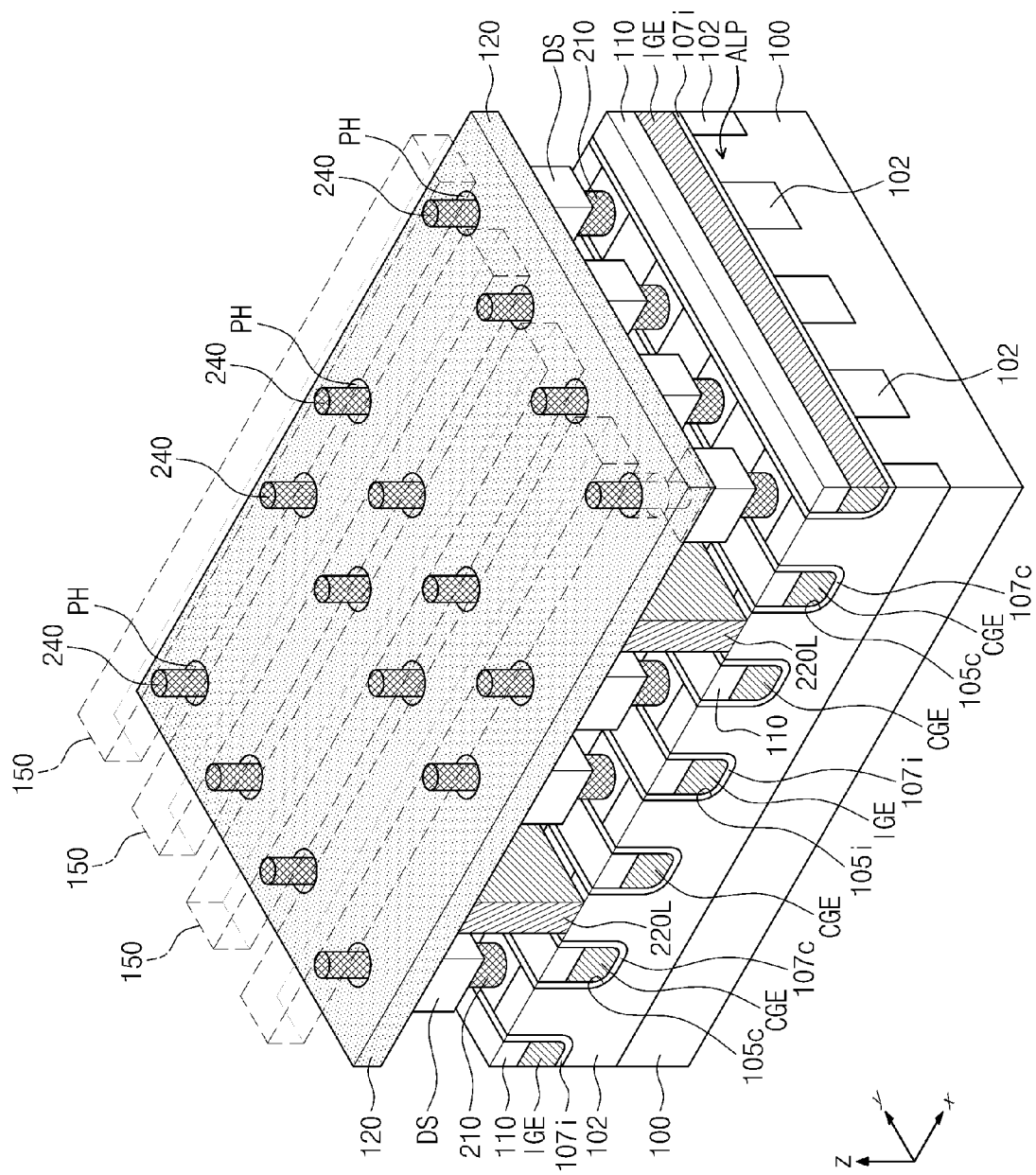
FIG. 16 is a perspective view illustrating a data storage device according to other exemplary embodiments.
Figure 17:
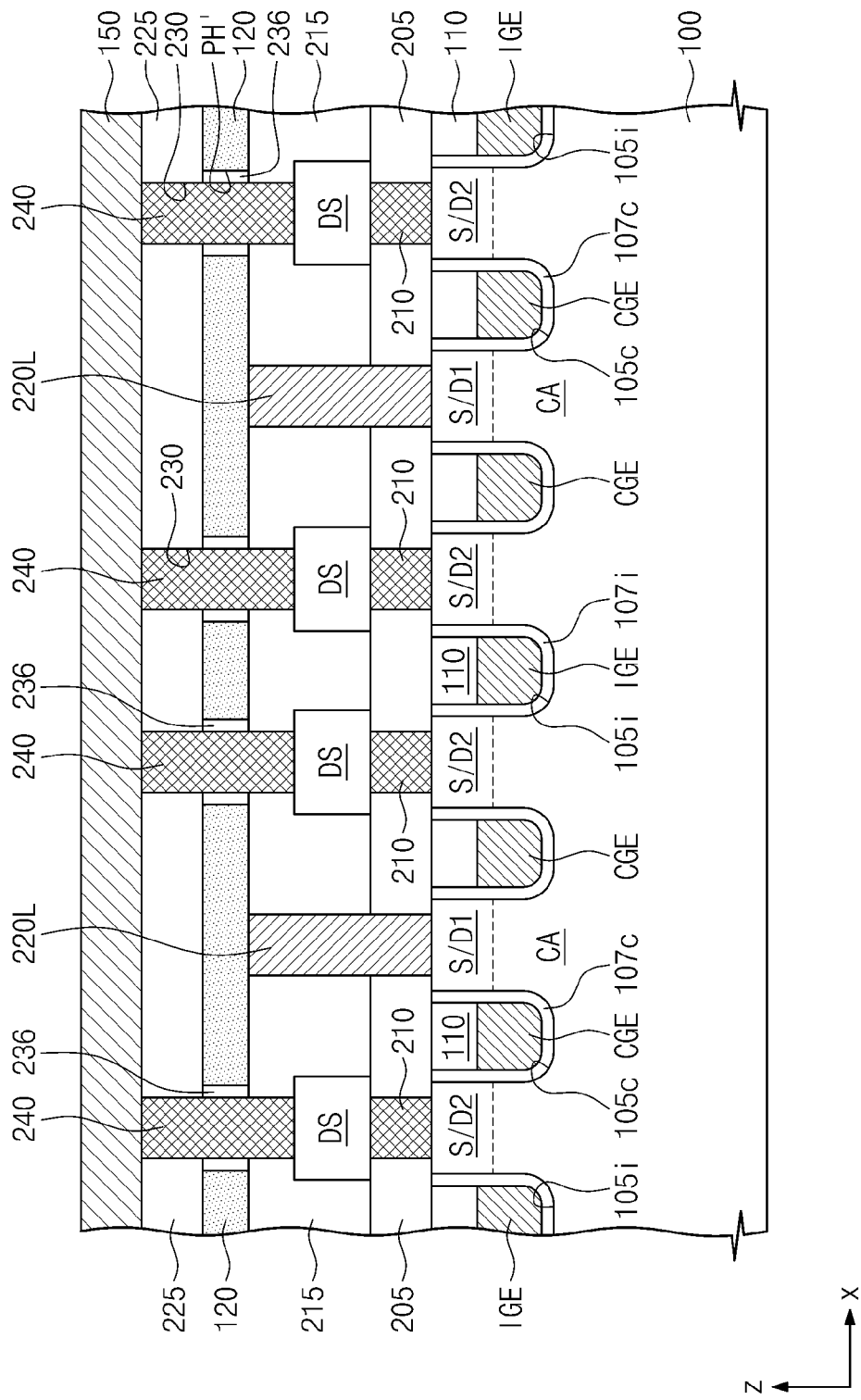
FIG. 17 is a cross-sectional view illustrating a modified embodiment of a data storage device according to other exemplary embodiments.

FIG. 15A is a plan view illustrating a data storage device according to one exemplary embodiment, FIG. 15B is an exemplary cross-sectional view taken along a line V-V' of FIG. 15A, and FIG. 16 is an exemplary perspective view illustrating a data storage device according to one embodiment. FIG. 17 is a cross-sectional view illustrating a modified embodiment of a data storage device according to other exemplary embodiments. For clearly showing components of a data storage device according to the embodiment shown in FIGS. 15A, 15B, and 16, some components (e.g. interlayer dielectric layers and bit lines) are omitted in FIG. 16.

Referring to FIGS. 15A, 15B, and 16, a plurality of cell selection parts may be disposed at the substrate 100. The cell selection parts may be the same as the cell selection parts described in the first embodiment. A lower dielectric layer 205 may be disposed on the substrate 100 and cover the cell selection parts. The lower dielectric layer 205 may include, for example, an oxide layer, a nitride layer, and/or an oxynitride layer.

A plurality of lower pillars 210 may penetrate the lower dielectric layer 205. The plurality of lower pillars 210 may be connected to the second terminals (e.g. the second source/drain regions S/D2) of the cell selection parts, respectively. A plurality of data storage parts DS may be disposed on the lower dielectric layer 205. The data storage parts DS may be connected to the lower pillars 210, respectively. The data storage parts DS may be electrically connected to the second source/drain regions S/D2 through the lower pillars 210, respectively. The data storage parts DS may be arranged along rows and columns in a plan view.

The lower pillars 210 may be formed of a conductive material. For example, the lower pillars 210 may include at least one of a semiconductor material doped with dopants (e.g. doped silicon), metal (e.g. tungsten, aluminum, titanium, and/or tantalum), a conductive metal nitride (e.g. titanium nitride, tantalum nitride, and/or tungsten nitride), and a metal-semiconductor compound (e.g. metal silicide). Each of the data storage parts DS may be, for example, one of the data storage parts DS described with reference to FIGS. 3A to 3D. In some embodiments, if the data storage part DS of FIGS. 15A, 15B, and 16 include the phase change material pattern 510 of FIG. 3C, the lower pillar 210 may correspond to a heater electrode.

A first interlayer dielectric layer 215 may be disposed on the data storage parts DS. The first interlayer dielectric layer 215 may cover sidewalls and top surfaces of the data storage parts DS. The first interlayer dielectric layer 215 may include, for example, an oxide layer, a nitride layer, and/or an oxynitride layer.

The plate conductive pattern 120 may be disposed on the first interlayer dielectric layer 215. The plate conductive pattern 120 covers the cell selection parts. Additionally, as illustrated in FIGS. 15A and 15B, the plate conductive pattern 120 may cover the data storage parts DS. In other words, the plate conductive pattern 120 may be disposed over the data storage parts. The data storage parts DS are insulated from the plate conductive pattern 120 by the first interlayer dielectric layer 215.

Contact line patterns 220L may successively penetrate the first interlayer dielectric layer 215 and the lower dielectric layer 205 in order to be connected to the first source/drain regions S/D1. Each of the contact line patterns 220 may be connected to the first source/drain regions S/D1 constituting each of rows. Top surfaces of the contact line patterns 220L may be connected to the bottom surface of the plate conductive pattern 120. Thus, the plate conductive pattern 120 may be electrically connected to the first source/drain regions S/D1 through the contact line patterns 220L. The contact line patterns 220L may be formed of the same material as the contact line patterns 115L of FIGS. 1A to 1C and 2. In other embodiments, similarly to the contact pillars 115P of FIGS. 5A and 5B, the contact line patterns 220L may be replaced with contact pillars, which successively penetrate the first interlayer dielectric layer 215 and the lower dielectric layer 205 and are connected to the first source/drain regions S/D1, respectively.

A second interlayer dielectric layer 225 may be disposed on the plate conductive pattern 120. The second interlayer dielectric layer 225 may include, for example, an oxide layer, a nitride layer, and/or an oxynitride layer.

Through-pillars 240 may successively penetrate the second interlayer dielectric layer 225, the plate conductive pattern 120, and the first interlayer dielectric layer 215, so that the through-pillars 240 may be directly connected to the data storage parts DS, respectively. Through-pillars 240 are insulated from the plate conductive pattern 120. The through-pillars 240 may be in contact with top surfaces of the data storage parts DS, respectively. In other words, the data storage parts DS may be in contact with bottom surfaces of the through-pillars 240, respectively. Each of the through-pillars 240 may be overlapped with the data storage part DS disposed under each of the through-pillars 240 in a plan view. The through-pillars 240 may be formed of the same material as the through-pillars 140 of FIGS. 1A to 1C and 2.

The through-pillars 240 may be respectively disposed in through-holes 230 successively penetrating the second interlayer dielectric layer 225, the plate conductive pattern 120, and the first interlayer dielectric layer 215. The through-holes 230 may expose the top surfaces of the data storage parts DS, respectively. Due to the through-holes 230, plate-holes PH may be defined in the plate conductive pattern 120. Each of the plate-holes PH may correspond to a region of each of the through-holes 230 that is formed in the plate conductive pattern 120. An insulating spacer 235 may be disposed between each of the through-pillars 240 and an inner sidewall of each of the through-holes 230. The through-pillars 240 may be insulated from the plate conductive pattern 120 by the insulating spacers 235. The insulating spacers 235 may include, for example, oxide, nitride, and/or oxynitride.

As illustrated in FIG. 17, the insulating spacers 235 may be replaced with insulators 236, which are formed by performing a treatment process on the plate conductive pattern 120 exposed by inner sidewalls of the through-holes 230. The through-pillars 240 may be insulated from the plate conductive pattern 120 by the insulators 236. The treatment process may be the same as the treatment process of the first embodiment. Each of the insulators 236 may be confinedly formed between the through-pillar 240 and the plate conductive pattern 120. In other words, each of the insulators 236 may be confinedly disposed between each of plate-holes PH in the plate conductive pattern 120 and each of the through-pillars 240. Due to the treatment process, the plate-hole PH' may have a width greater than a width of a region of the through-hole 230 which is formed in the second interlayer dielectric layer 225. In other embodiments, all of the insulating spacer 235 and the insulator 236 may be disposed between the plate conductive pattern 120 and the through-pillar 240.

Referring to FIGS. 15A, 15B, and 16 again, bit lines 150 may be disposed on the second interlayer dielectric layer 225. The through-pillars 240 may be arranged along rows and columns in a plan view. The bit lines 150 may be extended to be parallel to the rows. Each of the bit lines 150 may be connected to top surfaces of the through-pillars 240 constituting each of the rows.

In the data storage device according to the present embodiment, the plate conductive pattern 120 covers the plurality of the cell selection parts, and the data storage parts DS may be disposed between the plate conductive pattern 120 and the plurality of the cell selection parts. In other words, the plate conductive pattern 120 may cover the cell selection parts and the data storage parts DS. The through-pillars 240 penetrate the plate conductive pattern 120 so as to be in contact with the data storage parts DS, respectively. Here, the through-pillars 240 are insulated from the plate conductive pattern 120. Thus, due to the plate conductive pattern 120 having a wider planar area, it is possible to provide a stable reference voltage to memory cells of the data storage device. As a result, the data storage device with excellent reliability may be realized. Additionally, since the data storage parts DS, the plate conductive pattern 120, and the bit lines 150 may be vertically stacked, the data storage device with high integration may be realized.

FIGS. 18A to 21A are perspective views illustrating a method of manufacturing a data storage device according to certain embodiments. FIGS. 18B to 21B are exemplary cross-sectional views taken along lines VI-VI' of FIGS. 18A to 21A, respectively. A method of manufacturing a data storage device according to one embodiment may include the formation method of the cell selection parts described with reference to FIGS. 6A, 6B, 7A, and 7B.

Figure 18A:
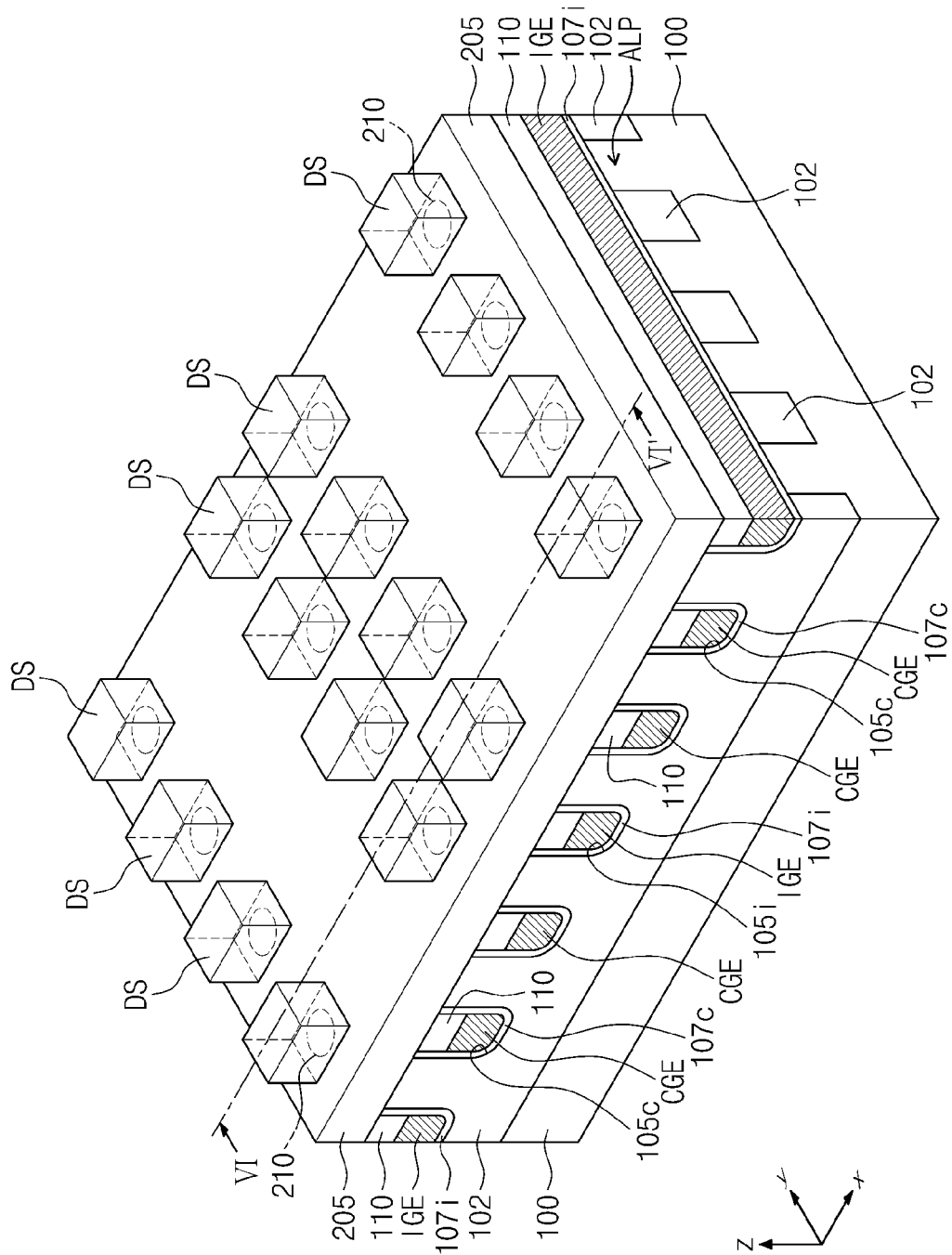

Referring to FIGS. 18A and 18B, a lower dielectric layer 205 may be formed on the substrate 100 having the cell selection parts. Lower pillars 210 may be formed to penetrate the lower dielectric layer 205. The lower pillars 210 may be connected to the second source/drain regions S/D2, respectively.

Data storage parts DS may be formed on the lower dielectric layer 205. The data storage parts DS may be formed on top surfaces of the lower pillars 210, respectively. The data storage parts DS may be arranged along rows and columns in a plan view. The data storage parts DS may be disposed over the cell selection parts.

Figure 19A:
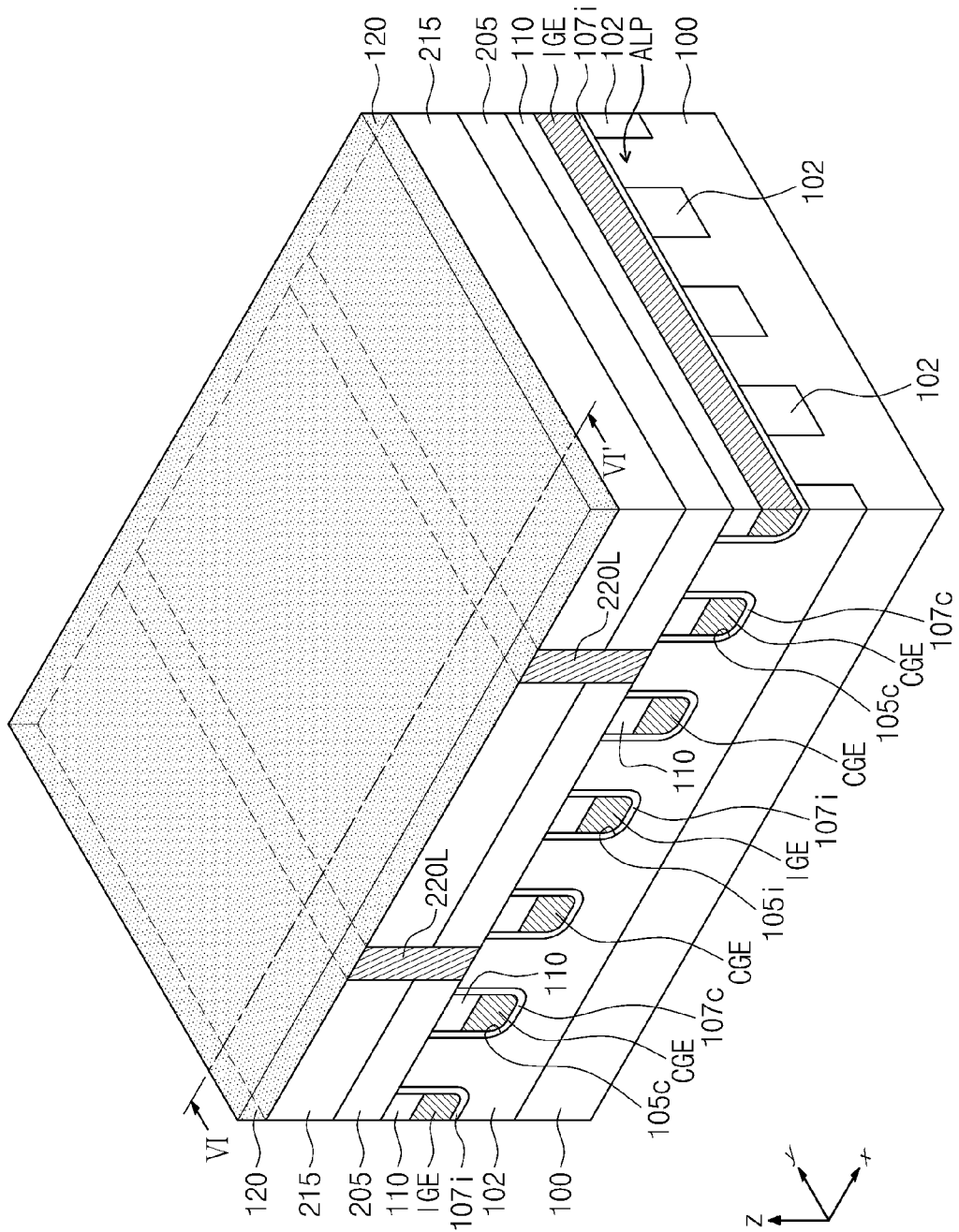
Figure 19B:
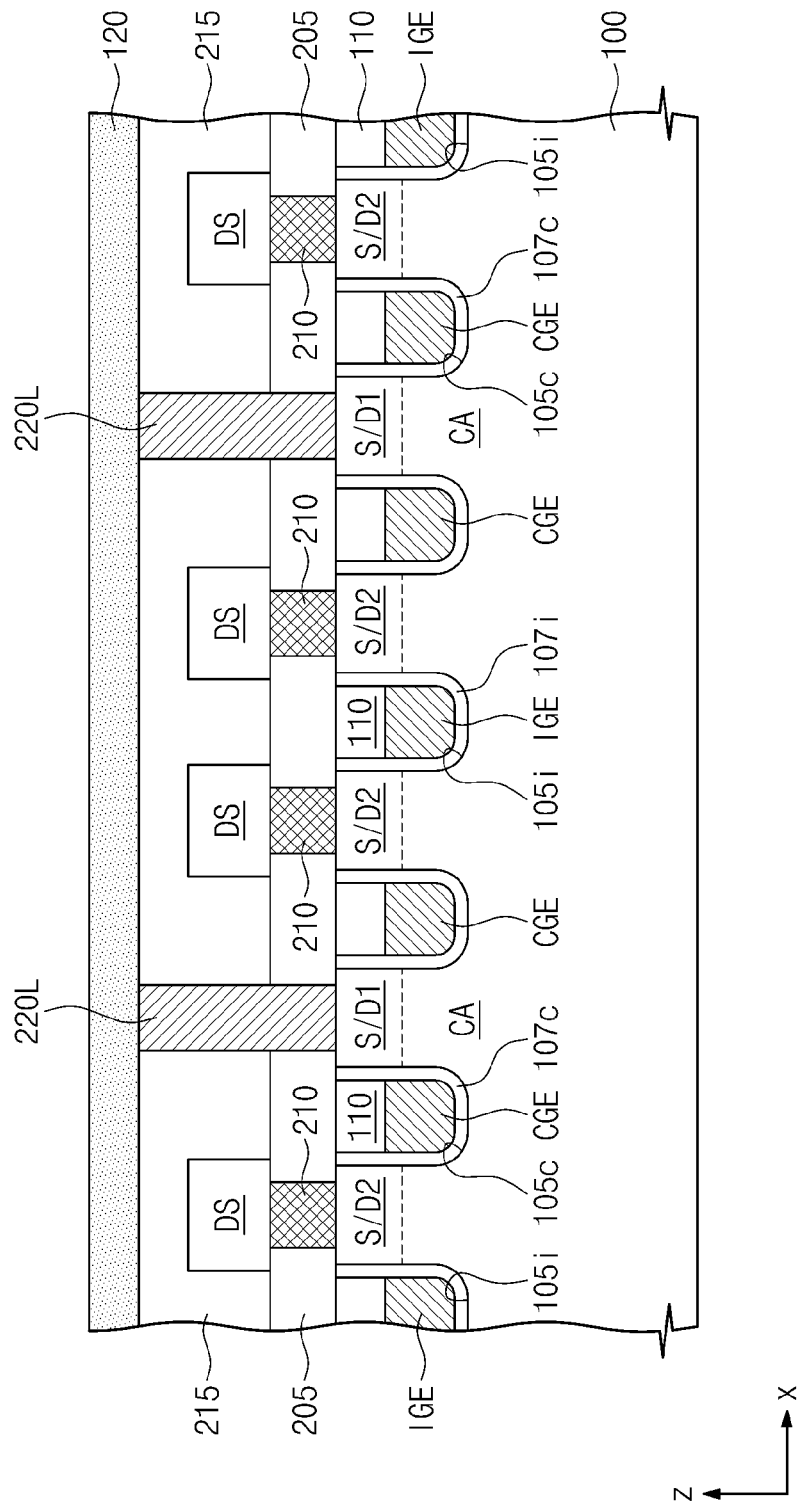

Referring to FIGS. 19A and 19B, a first interlayer dielectric layer 215 may be formed on the substrate 100 having the data storage parts DS. A top surface of the first interlayer dielectric layer 215 may be planarized. The first interlayer dielectric layer 215 having the planarized top surface covers the data storage parts DS.

Contact line patterns 220L may be formed to successively penetrate the first interlayer dielectric layer 215 and the lower dielectric layer 205. The contact line patterns 220L may be extended to be parallel to the gate electrodes CGE and IGE. Each of the contact line patterns 220L may be connected to the first source/drain regions S/D1 constituting each of rows. In other embodiments, the contact line patterns 220L may be replaced with contact pillars. The contact pillars may successively penetrate the first interlayer dielectric layer 215 and the lower dielectric layer 205 and be connected to the first source/drain regions S/D1, respectively.

A plate conductive pattern 120 is formed on the first interlayer dielectric layer 215. The plate conductive pattern 120 covers the cell selection parts. Additionally, the plate conductive pattern 120 covers the data storage parts DS. The plate conductive pattern 120 may be connected to the contact line patterns 220L.

Figure 20A:
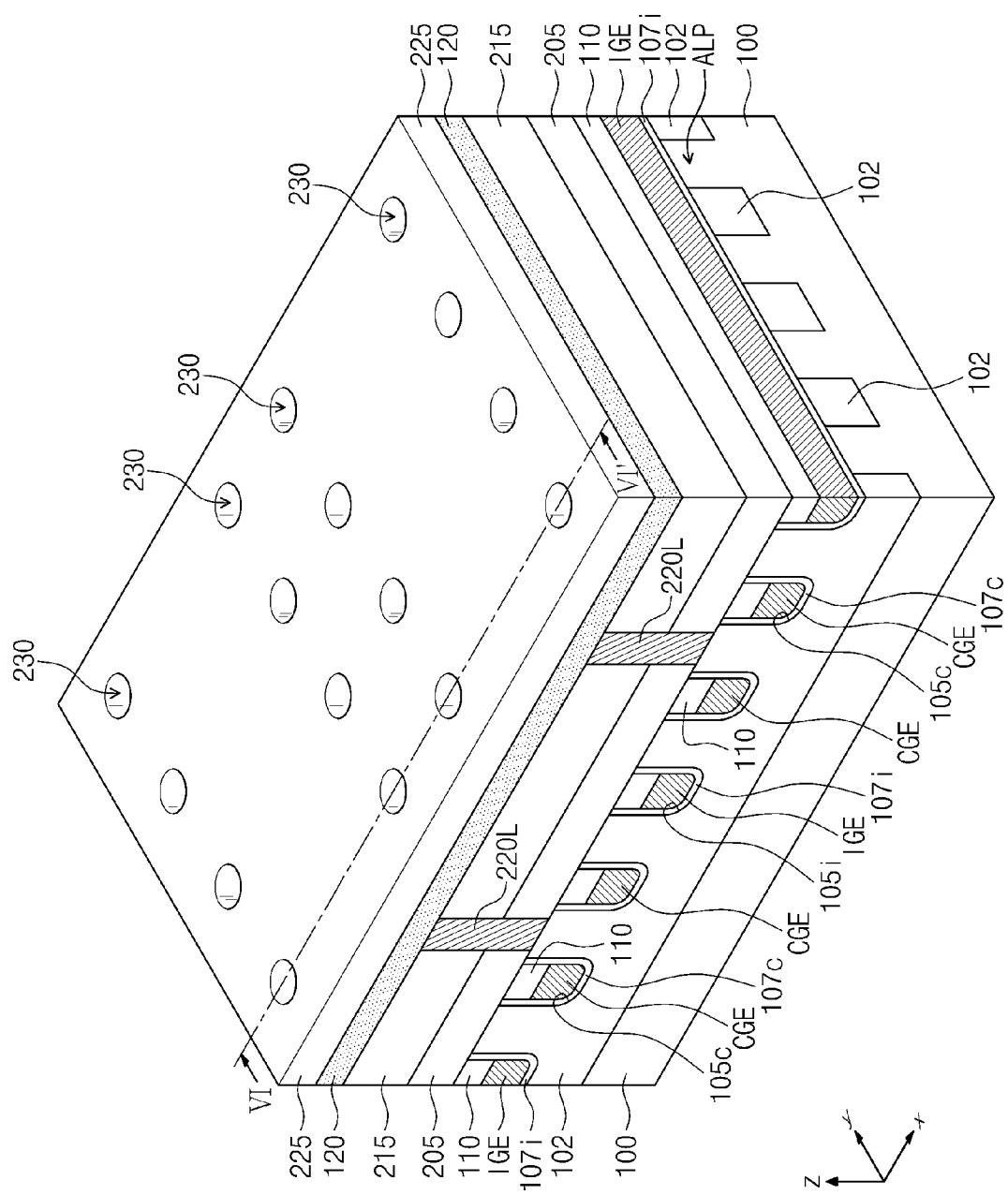
Figure 20B:
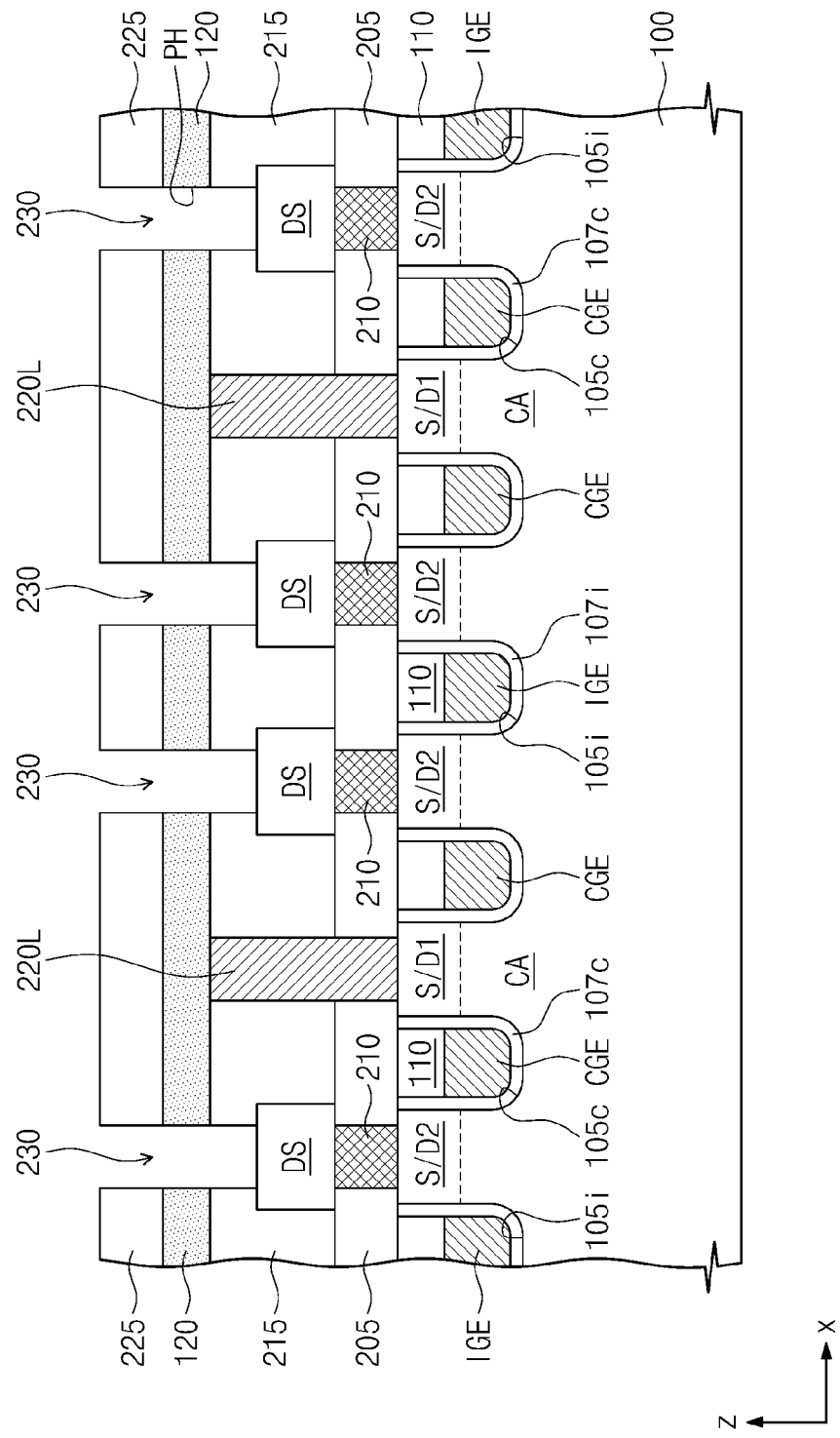

Referring to FIGS. 20A and 20B, a second interlayer dielectric layer 225 may be formed on the plate conductive pattern 120. The second interlayer dielectric layer 225, the plate conductive pattern 120, and the first interlayer dielectric layer 215 may be successively patterned to form through-holes 230 respectively exposing the data storage parts DS. Due to the formation of the through-hoes 230, the plate-holes PH described above may be formed in the plate conductive pattern 120.

Figure 21A:
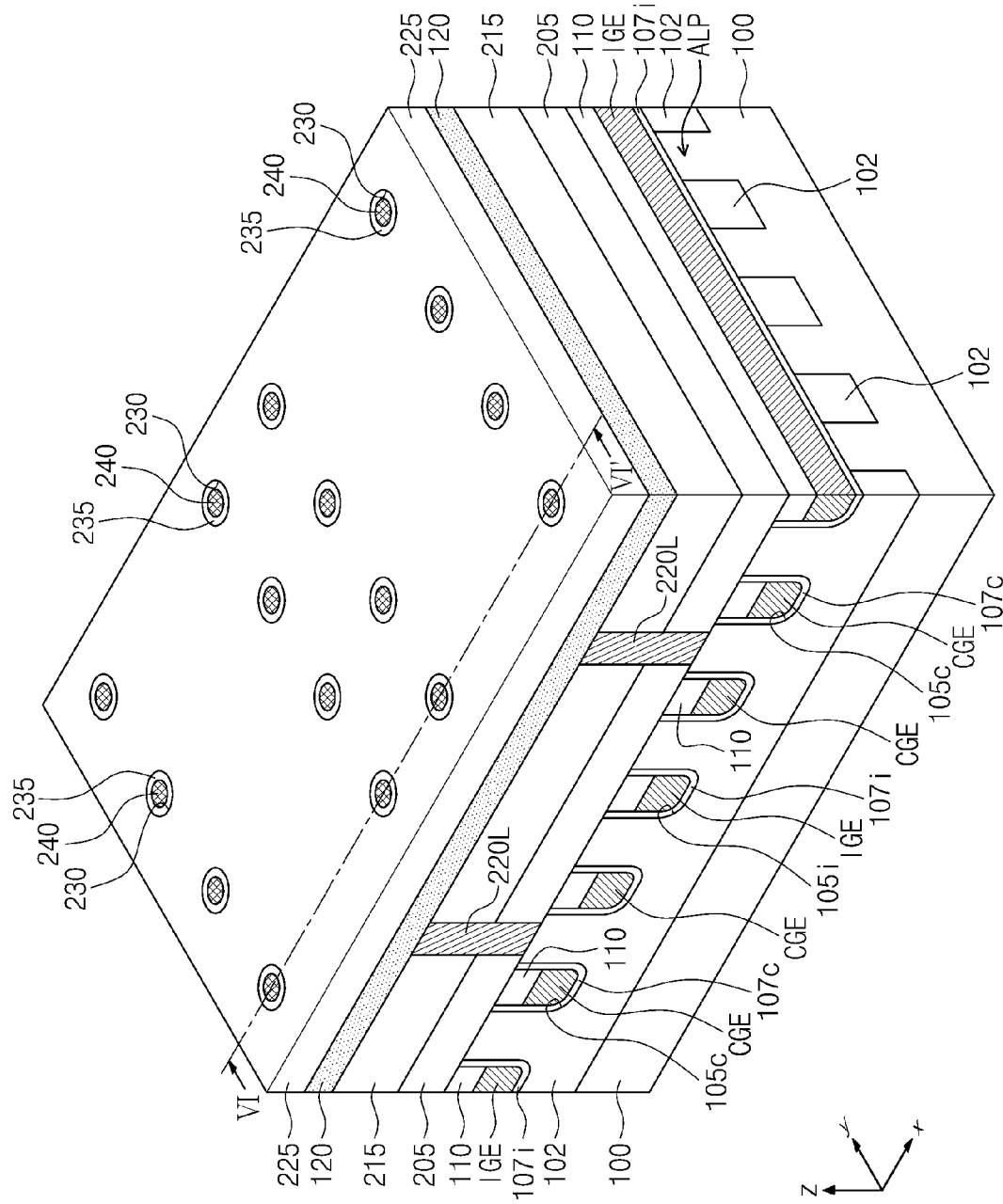
Figure 21B:
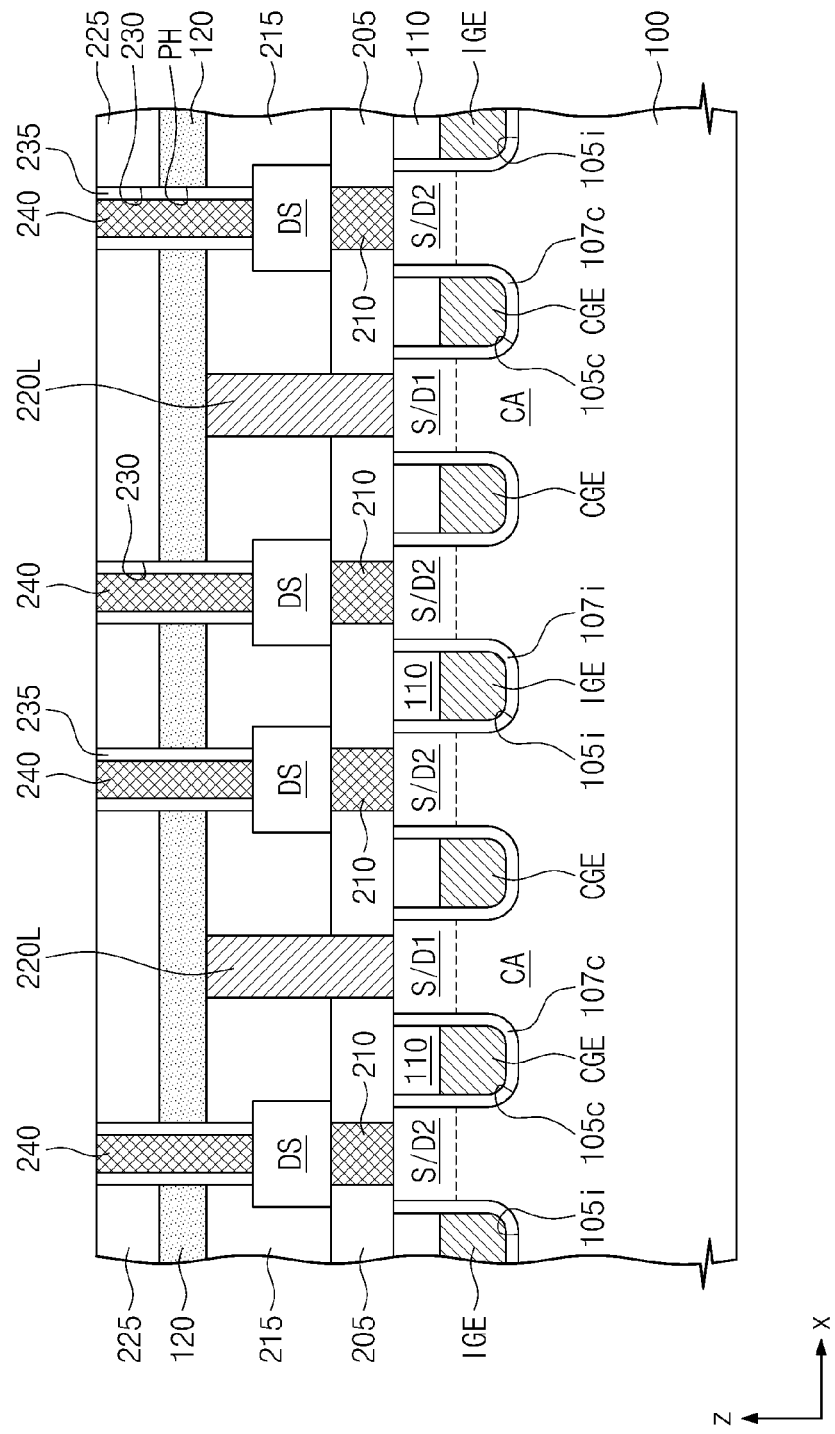

Referring to FIGS. 21A and 21B, an insulating layer may be conformally formed on the substrate 100 having the through-holes 230 and then the insulating layer may be etched by an etch back process until the data storage parts DS under the through-holes 230 are exposed. As a result, insulating spacers 235 may be formed on inner sidewalls of the through-holes 230, respectively. Through-pillars 240 may be formed in the through-holes 230 having the insulating spacers 235, respectively. Subsequently, the bit lines 150 illustrated in FIGS. 15A, 15B, and 16 may be formed. Thus, the data storage device of FIGS. 15A, 15B, and 16 may be realized.

Distinguishing features of a method of manufacturing the data storage device such as shown in FIG. 17 will now be described. The formation of the insulating spacers 235 may be omitted. The treatment process may be performed on the plate conductive pattern 120 exposed by inner sidewalls of the through-holes 230 of FIGS. 20A and 20B, thereby forming insulators 236 of FIG. 17. In some embodiments, due to the treatment process, bottom surfaces of the through-holes 230 may be oxidized and/or nitrided to generate by-products (e.g. oxide and/or nitride). In this case, an anisotropic etching process may be performed to remove the by-products after forming the insulators 236 and before forming the through-pillars 240 of FIG. 17. Thus, the through-holes 230 having the insulators 236 may respectively expose the data storage parts DS, so that the through-pillars 240 may be connected to the data storage parts DS, respectively.

The data storage devices described above may be encapsulated using various packaging techniques. For example, the different gates, the bit lines, and the plate conductive layer discussed in the figures above may be electrically connected, by through via electrodes and/or internal wiring, or directly, to chip pads, conductive bumps or balls, or other external connectors, which are configured to connect to a controller or other circuitry external to the data storage device shown in the figures. For example, the data storage devices according to the aforementioned embodiments may be encapsulated using any one of a package on package (POP) technique, a ball grid arrays (BGAs) technique, a chip scale packages (CSPs) technique, a plastic leaded chip carrier (PLCC) technique, a plastic dual in-line package (PDIP) technique, a die in waffle pack technique, a die in wafer form technique, a chip on board (COB) technique, a ceramic dual in-line package (CERDIP) technique, a plastic metric quad flat package (PMQFP) technique, a plastic quad flat package (PQFP) technique, a small outline package (SOIC) technique, a shrink small outline package (SSOP) technique, a thin small outline package (TSOP) technique, a thin quad flat package (TQFP) technique, a system in package (SIP) technique, a multi chip package (MCP) technique, a wafer-level fabricated package (WFP) technique and a wafer-level processed stack package (WSP) technique.

The package in which the data storage device according to one of the above embodiments is mounted may further include at least one semiconductor device (e.g., a controller and/or a logic device) that controls the data storage device.

Figure 22:
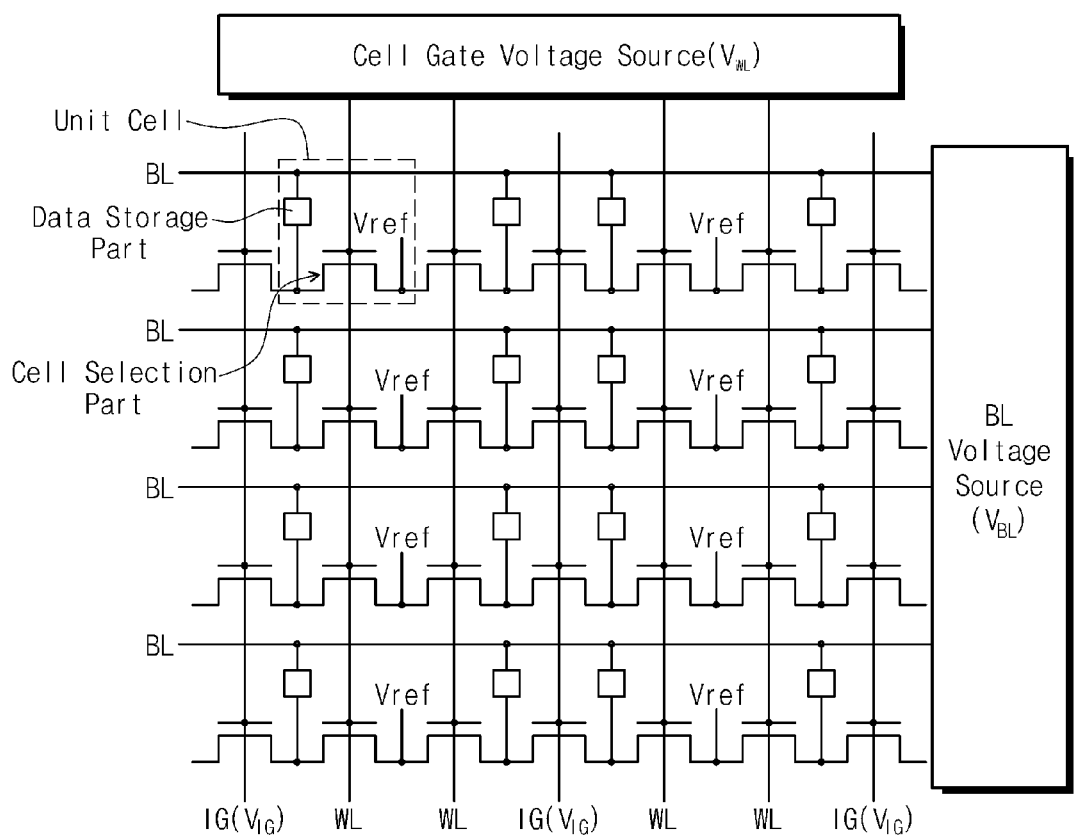
FIG. 22 is an exemplary circuit diagram for implementing a data storage device, according to certain embodiments.

FIG. 22 is an exemplary circuit diagram for implementing a data storage device, according to certain embodiments. The circuit shown in FIG. 22 can be formed, for example, using one of the embodiments discussed above. As shown in FIG. 22, a plurality of cell selection parts, such as transistors, include first source/drain regions configured to receive and be electrically connected to a reference voltage Vref, second source/drain regions electrically connected to data storage parts (e.g., such as discussed in connection with FIGS. 3A-3D), and gate electrodes. First gate electrodes, such as cell gate electrodes, are configured to receive and be electrically connected to a cell gate voltage source. The first gate electrodes may be connected to, for example, word lines for receiving a word line voltage $V_{WL}$. Second gate electrodes, such as isolation gate electrodes, are configured to receive and be electrically connected to an isolation gate voltage $V_{IG}$. The reference voltage Vref may be supplied, for example, to a plate conductive pattern, such as discussed in the embodiments above.

As further shown in FIG. 22, bit lines are connected to data storage parts, so that each column of data storage parts is connected to a single bit line. Each bit line may be configured to receive and be electrically connected to a bit line voltage $V_{BL}$. The different voltages may be supplied, for example, from an external source, such as a controller, power source, and/or ground. As discussed above in connection with FIGS. 3A-3D, the data storage parts may have magnetic, phase-change, and/or resistive properties in order to implement an MRAM, PRAM, or RRAM device.

Figure 23:
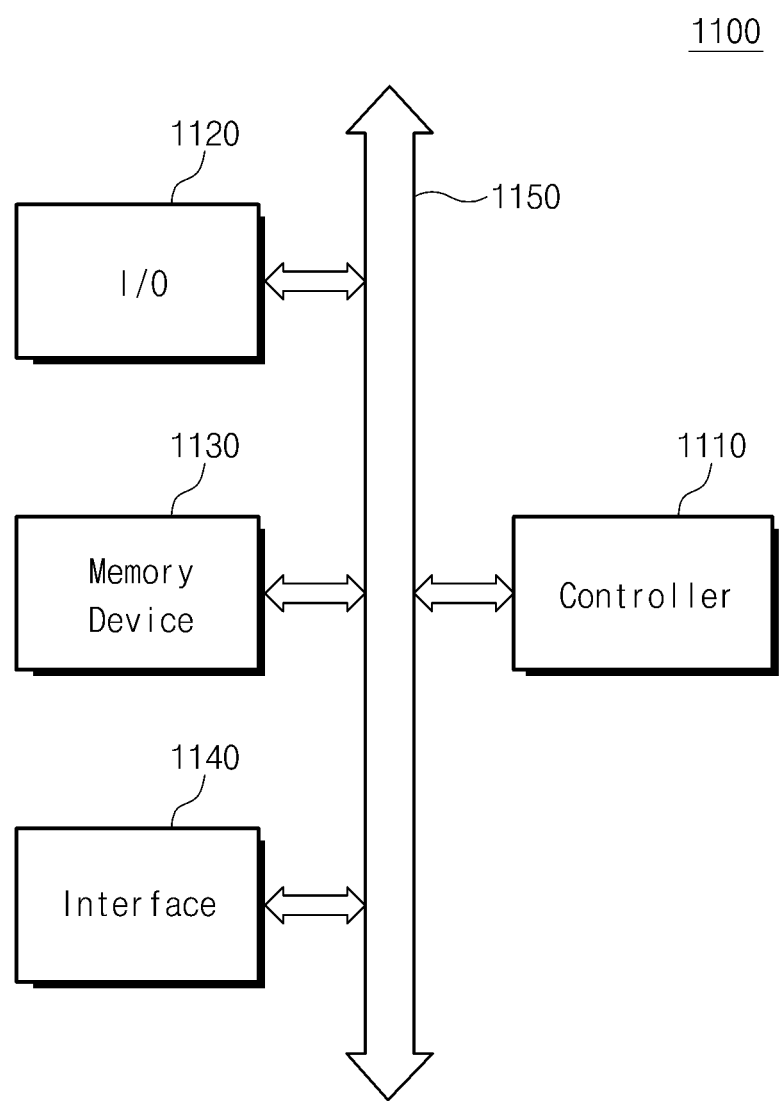
FIG. 23 is a schematic block diagram illustrating an example of electronic systems including data storage devices according to exemplary embodiments.

FIG. 23 is a schematic block diagram illustrating an example of electronic systems including data storage devices according to exemplary embodiments.

Referring to FIG. 23, an electronic system 1100 according to one embodiment may include a controller 1110, an input/output (I/O) unit 1120, a memory device 1130, an interface unit 1140 and a data bus 1150. At least two of the controller 1110, the I/O unit 1120, the memory device 1130 and the interface unit 1140 may communicate with each other through the data bus 1150. The data bus 1150 may correspond to a path through which electrical signals are transmitted.

The controller 1110 may include at least one of a microprocessor, a digital signal processor, a microcontroller or another logic device. The other logic device may have a similar function to any one of the microprocessor, the digital signal processor and the microcontroller. The I/O unit 1120 may include a keypad, a keyboard and/or a display unit. The memory device 1130 may store data and/or commands. The memory device 1130 may include at least one of the data storage devices according to the embodiments described above. These devices may include external terminals for connecting, for example, the different word lines and bit lines, and the plate conductive layer, to the controller 1110 or other parts of the electronic system 1100. The memory device 1130 may further include another type of semiconductor memory devices, which are different from the data storage devices described above. The interface unit 1140 may transmit electrical data to a communication network or may receive electrical data from a communication network. The interface unit 1140 may operate by wireless or cable. For example, the interface unit 1140 may include an antenna for wireless communication or a transceiver for cable communication. Although not shown in the drawings, the electronic system 1100 may further include a fast DRAM device and/or a fast SRAM device, which acts as a cache memory for improving an operation of the controller 1110.

The electronic system 1100 may be applied, for example, to a personal digital assistant (PDA), a portable computer, a web tablet, a wireless phone, a mobile phone, a digital music player, a memory card, or other electronic products. The other electronic products may receive or transmit information data by wireless signals.

Figure 24:
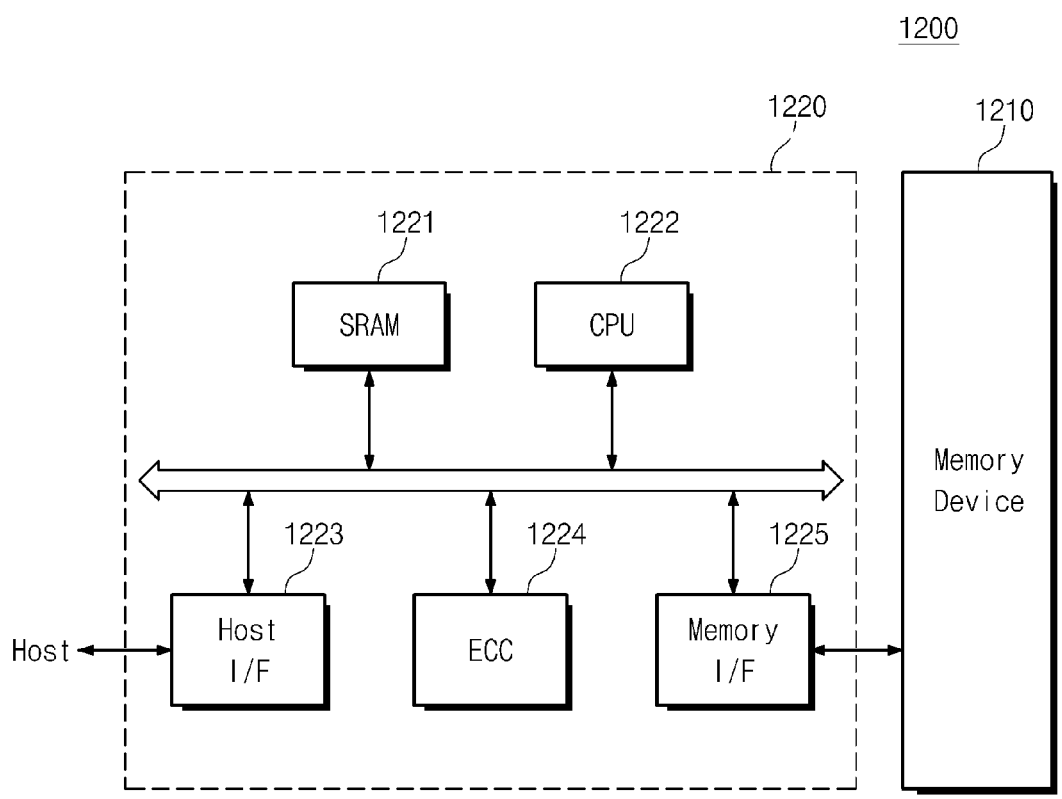
FIG. 24 is a schematic block diagram illustrating an example of memory cards including data storage devices according to exemplary embodiments.

FIG. 24 is a schematic block diagram illustrating an example of memory cards including data storage devices according to exemplary embodiments.

Referring to FIG. 24, a memory card 1200 according to one embodiment may include a memory device 1210. The memory device 1210 may include at least one of the data storage devices according to the embodiments mentioned above. In other embodiments, the memory device 1210 may further include another type of semiconductor memory devices, which are different from the data storage devices according to the embodiments described above. For example, the memory device 1210 may further include a dynamic random access memory (DRAM) device and/or a static random access memory (SRAM) device. The memory card 1200 may include a memory controller 1220 that controls data communication between a host and the memory device 1210.

The memory controller 1220 may include a central processing unit (CPU) 1222 that controls overall operations of the memory card 1200. In addition, the memory controller 1220 may include an SRAM device 1221 used as an operation memory of the CPU 1222. Moreover, the memory controller 1220 may further include a host interface unit 1223 and a memory interface unit 1225. The host interface unit 1223 may be configured to include a data communication protocol between the memory card 1200 and the host. The memory interface unit 1225 may connect the memory controller 1220 to the memory device 1210. The memory controller 1220 may further include an error check and correction (ECC) block 1224. The ECC block 1224 may detect and correct errors of data which are read out from the memory device 1210. Even though not shown in the drawings, the memory card 1200 may further include a read only memory (ROM) device that stores code data to interface with the host. The memory card 1200 may be used as a portable data storage card. Alternatively, the memory card 1200 may realized as solid state disks (SSD) which are used as hard disks of computer systems.

According to the example data storage devices described above, the plate conductive pattern has a plate-shape covering the plurality of cell selection parts, and may include holes through which conductive pillars that connect to transistors in a substrate are formed. Thus, the plate conductive pattern may have a wide planar area. As a result, when the read operation and/or the program operation is performed, the reference voltage for the read and/or program operation may be stably provided to the cell selection parts through the plate conductive pattern. Thus, the data storage device with excellent reliability may be realized.

Additionally, the data storage parts may be directly connected to the through-pillars penetrating and being insulated from the plate conductive pattern, respectively. Thus, the plate conductive pattern and the data storage parts may be vertically stacked. As a result, it is possible to prevent or minimize the area increase of the data storage device, which may be caused by the plate conductive pattern. Thus, the data storage device with high integration may be realized.

While the disclosure has been described with reference to example embodiments, it will be apparent to those skilled in the art that various changes and modifications may be made without departing from the spirit and scope of the inventive concept. Therefore, it should be understood that the above embodiments are not limiting, but illustrative. Thus, the scope of the inventive concept is to be determined by the broadest permissible interpretation of the following claims and their equivalents, and shall not be restricted or limited by the foregoing description.

What is claimed is:

1. A data storage device comprising:
   a plurality of cell selection parts formed in a substrate;
   a plate conductive pattern covering the cell selection parts, the plate conductive pattern electrically connected to first terminals of the cell selection parts;
   a plurality of through-pillars penetrating the plate conductive pattern, the plurality of through-pillars insulated from the plate conductive pattern; and
   a plurality of data storage parts connected to the plurality of through-pillars, respectively,
   wherein the data storage parts are electrically connected to second terminals of the cell selection parts, respectively,
   wherein the plate conductive pattern has a plurality of plate holes;
   wherein the plurality of through-pillars pass through the plurality of plate holes, respectively; and
   wherein the plate holes are spaced apart from each other and form an array of plate holes.

2. The data storage device of claim 1, wherein each of the through-pillars is overlapped with the data storage part connected to the through-pillar in a plan view.

3. The data storage device of claim 1, wherein each of the data storage parts is directly connected to a top surface of a respective through-pillar;
   wherein each of the data storage parts is electrically connected to a second terminal of a cell selection part through a respective through-pillar; and
   wherein the data storage parts are disposed over the plate conductive pattern.

4. The data storage device of claim 3, further comprising:
   bit lines disposed on the data storage parts,
   wherein the data storage parts are arranged along rows and columns in a plan view; and
   wherein each of the bit lines is electrically connected to the data storage parts constituting each of the rows.

5. The data storage device of claim 1, wherein each of the data storage parts is disposed under a respective through-pillar, so that each of the data storage parts is directly connected to a bottom surface of a respective through-pillar; and
   wherein the plate conductive pattern covers the data storage parts.

6. The data storage device of claim 5, further comprising:
   bit lines disposed on the through-pillars,
   wherein the through-pillars are arranged along rows and columns in a plan view; and
   wherein each of the bit lines is connected to top surfaces of the through-pillars constituting each of the rows.

7. The data storage device of claim 1, wherein each of the cell selection parts is a field effect transistor;
   wherein a first source/drain region and a second source/drain region of each of the cell selection parts correspond to the first terminal and the second terminal, respectively; and
   wherein a gate electrode of each of the cell selection parts is disposed in a recess region formed in the substrate.

* * * * *